United States Patent
Fang et al.

(10) Patent No.: US 10,714,205 B1
(45) Date of Patent: Jul. 14, 2020

(54) MULTI-PURPOSED LEAK DETECTOR

(71) Applicant: SanDisk Technologies LLC, Addison, TX (US)

(72) Inventors: Steve Fang, San Jose, CA (US); Xiaofeng Zhang, San Jose, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 16/451,335

(22) Filed: Jun. 25, 2019

(51) Int. Cl.
| G11C 7/00 | (2006.01) |
| G11C 29/02 | (2006.01) |
| G11C 8/08 | (2006.01) |
| G11C 29/50 | (2006.01) |

(52) U.S. Cl.
CPC .......... G11C 29/028 (2013.01); G11C 8/08 (2013.01); G11C 29/025 (2013.01); *G11C 29/50016* (2013.01); *G11C 2029/5004* (2013.01); *G11C 2029/5006* (2013.01)

(58) Field of Classification Search
CPC .......... G11C 29/028; G11C 29/025; G11C 29/50016
USPC ....................................... 365/203
See application file for complete search history.

(56) References Cited

U.S. PATENT DOCUMENTS

| 7,349,237 B2* | 3/2008 | Lin ............... H03K 19/00346 365/145 |
| 8,514,630 B2* | 8/2013 | Huynh ............... G11C 29/02 365/185.21 |
| 8,730,722 B2* | 5/2014 | Koh ............... G11C 11/5628 365/185.03 |

* cited by examiner

*Primary Examiner* — Vu A Le
(74) *Attorney, Agent, or Firm* — Dickinson Wright PLLC; Steven Hurles

(57) ABSTRACT

Detecting a word line leakage in a non-volatile memory array. Various methods include: in a first step, enabling a M-bit "coarse" digital-to-analog converter (DAC) logic of an N-bit analog-to-digital converter (ADC) to, according to a clock signal of the coarse DAC, compare a reference voltage and a biased input voltage of a load current of the memory array, wherein the reference voltage is dependent upon the voltage level at which the input voltage becomes non-linear, and, in a second step, if the input voltage is greater than or equal to the reference voltage, enabling a P-bit "fine" ramp digital-to-analog converter (DAC) logic of the ADC to enable drawing a second current from the load current to ramp down the input voltage and to begin a counter and conduct leakage detection with the ADC when the input voltage is in the range between a first voltage and a second voltage.

20 Claims, 42 Drawing Sheets

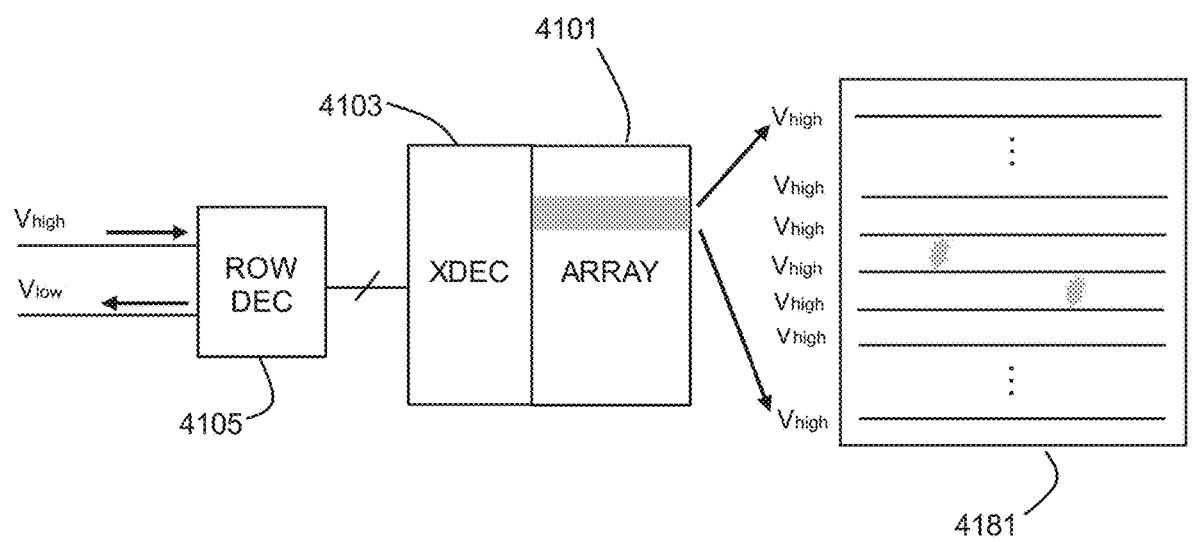
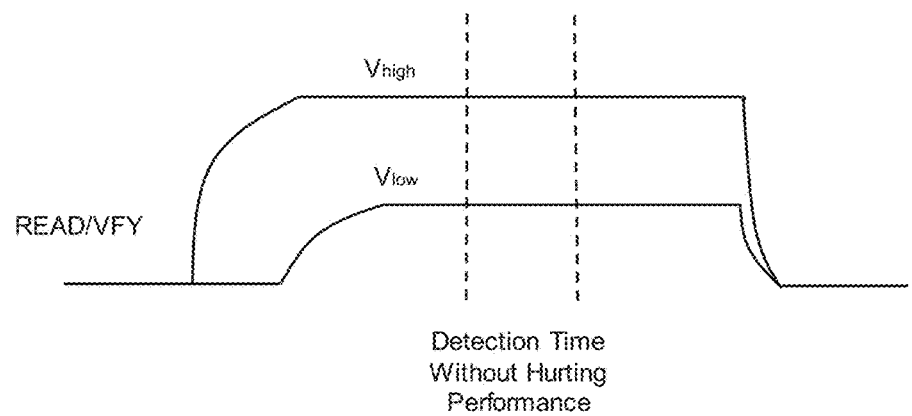
FIG. 40

MULTI-PURPOSED LEAK DETECTOR

TECHNICAL FIELD

This disclosure relates to non-volatile memory storage systems in solid-state drives or other devices, including but not limited to flash drives or embedded/removable flash packages. More specifically, this disclosure relates to systems and methods for detecting word line leakage of a memory array.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as a binary data), the possible threshold voltages of the memory cell are divided into two ranges, wherein the ranges are assigned as logical data "1" and "0" respectively. A memory cell of this type of storage density may be referred to as a "single-level cell" or SLC.

By further partitioning the threshold voltage window of a memory cell into additional distinct voltage ranges, multiple levels of information may be stored. Such a memory cell may be referred to as a "multi-state cell." For example, to store two bits of data, the threshold voltage window of a cell may be partitioned into four distinct voltage ranges (or states), wherein each range is assigned a bit value equal to, for example, "11," "10," "01," and "00." Accordingly, after an erase operation, the threshold voltage is negative and may be defined as logic "11." As such, the positive threshold voltages are used for the states of "10," "01," "00." A memory cell of this storage density may be referred to as a "multi-level cell" or MLC. In a further example, in order to store three bits of data, the voltage threshold window of a cell may be partitioned into eight distinct voltage ranges (or states), with each range being assigned a bit value equal to, for example, "111," "110," "100," "010," "011," "000," "001," and "101." A memory cell of this storage density may be referred to as a "tri-level" or "triple-level cell" (TLC). The specific relationship between the data programmed into a memory cell and the threshold voltage levels of the memory cell depends upon the data encoding scheme adopted for the memory cells.

Thus, a memory device that comprises multi-state data (by incorporating MLC and/or TLC-type cells) has an increased storage capacity using the same MOSFET structure and wafer size as an SLC-type cell and, as a result, provides a comparative cost per bit savings. However, as a consequence of the increased density and the tightened tolerances between the partitioned voltage ranges of multi-state memory cells, programming occurs at a slower speed relative to a single-state memory cell because the data is programmed to multiple target threshold voltage ranges and requires a higher level of precision during programming. The increased density of a multi-state memory cell decreases the margin of error between state changes and reduces the available voltage range capacity needed to endure the stress on the silicon oxide layer over the successive programming/erase cycles. As a result, in comparison to a single-state memory cell, the durability of a multi-state storage element is significantly lower.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in a greater number of manufacturing, operation, and performance errors, such as shorting (or leakage) between word lines or between word lines and semiconductor substrate. Such errors usually corrupt any data that is stored on pages on the word lines being programmed and neighboring word lines.

Some word line related problems do not manifest themselves at the beginning of the device's life and, as a result, fail after the stress of a number of program and erase cycles. Accordingly, at that point in time, the faulty word line may cause a catastrophic failure of the device as a whole. Therefore, various mechanisms for detecting a word line leakage prior to a failure mode exist in the art and are primarily based on detecting a voltage or current anomaly indicative of a leakage. However, due to the relatively small size of the leakage current and the distortion of such a current attributable to background noise inherent in the device, there is a prevailing need for more precise and efficient leakage detection mechanisms that can operate according to current and voltage levels normally used in the memory operations of the device.

SUMMARY

Various embodiments include a method for detecting a word line leakage in a memory array of a non-volatile memory system that comprises two stages. In a first stage, the method comprises enabling a M-bit "coarse" digital-to-analog converter (DAC) logic of a N-bit analog-to-digital converter (ADC), the analog-to-digital converter (ADC)

having a comparator with a reference voltage as a first input; voltage biasing a load current of the memory array to produce an input voltage as a second input to the comparator (the reference voltage level being dependent upon the voltage level at which the input voltage becomes non-linear in its behavior); and according to a clock signal from the coarse digital-to-analog converter (DAC) logic, comparing the input voltage level to the reference voltage level. Continuing to a second stage, if the input voltage level is greater than or equal to the reference voltage level, the method comprises enabling a P-bit "fine" ramp digital-to-analog converter (DAC) logic of the analog-to-digital converter (ADC) to: enable drawing a second current from the load current to thereby decrease the input voltage level; compare the input voltage level to a first voltage level, wherein the first voltage level is less than the reference voltage level; and if the input voltage level is less than or equal to the first voltage level, begin a counter and conduct leakage detection with the analog-to-digital converter (ADC) according to a clock signal (CLK) from the fine ramp digital-to-analog converter (DAC) logic; compare the input voltage level to a second voltage level (the second voltage level being less than the first voltage level); and if the input voltage level is equal to the second voltage level, disable the clock signal (CLK) thereby completing the leakage detection.

Other embodiments include a memory controller, comprising: a first communication pathway coupled to a memory array of a non-volatile memory system and a leakage detection circuit operable to receive a load current of the memory array. The leakage detection circuit comprises a N-bit analog-to-digital converter (ADC) that has: at least one comparator having a reference voltage as a first input; a control unit comprising a M-bit "coarse" digital-to-analog converter (DAC) logic, a P-bit "fine" ramp digital-to-analog converter (DAC) logic, and at least one counter. Further, the memory controller is configured to, in a first stage: enable the coarse digital-to-analog converter (DAC) logic; voltage bias the load current to produce an input voltage as a second input to the comparator (the reference voltage level being dependent upon the voltage level at which the input voltage becomes non-linear); and according to a clock signal from the coarse digital-to-analog converter (DAC) logic, compare the input voltage level to the reference voltage level. Further, in a second stage, if the input voltage level is greater than or equal to the reference voltage level, the memory controller is configured to enable the fine ramp digital-to-analog converter (DAC) logic to: draw a second current from the load current to thereby decrease the input voltage level; compare the input voltage level to a first voltage level, wherein the first voltage level is less than the reference voltage level; and if the input voltage level is less than or equal to the first voltage level, begin the counter and conduct leakage detection with the analog-to-digital converter (ADC) according to a clock signal (CLK) from the fine ramp digital-to-analog converter (DAC) logic; compare the input voltage level to a second voltage level (the second voltage level being less than the first voltage level); and if the input voltage level is equal to the second voltage level, disable the clock signal (CLK) thereby completing the leakage detection.

Additional embodiments include a non-volatile storage system configured to detect a word line leakage thereof, wherein the system comprises: a programmable memory array storing data in a plurality of memory cells addressable by a plurality of word lines and a controller communicating with the memory array over a first communication pathway and controlling a leakage detection circuit of the controller to, in a first stage: enable a M-bit "coarse" digital-to-analog converter (DAC) logic of an N-bit analog-to-digital converter (ADC) of the leakage detection circuit, the analog-to-digital converter (ADC) having a comparator with a reference voltage as a first input; voltage bias a load current of the memory array to produce an input voltage as a second input to the comparator (again, the reference voltage level being dependent upon the voltage level at which the input voltage becomes non-linear); and according to a clock signal from the coarse digital-to-analog converter (DAC) logic, compare the input voltage level to the reference voltage level; and in a second stage, if the input voltage level is greater than or equal to the reference voltage level, to enable a P-bit "fine" ramp digital-to-analog converter (DAC) logic of the analog-to-digital converter (ADC) to: enable drawing a second current from the load current to thereby decrease the input voltage level; compare the input voltage level to a first voltage level, wherein the first voltage level is less than the reference voltage level; and if the input voltage level is less than or equal to the first voltage level, begin a counter and conduct leakage detection with the analog-to-digital converter (ADC) according to a clock signal (CLK) from the fine ramp digital-to-analog converter (DAC) logic; compare the input voltage level to a second voltage level (the second voltage level being less than the first voltage level); and if the input voltage level is equal to the second voltage level, disable the clock signal (CLK) thereby completing the leakage detection.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 40 illustrates an example of determining a word line-to-word line leakage using a low voltage path in the context of a normal memory operation, in accordance with exemplary embodiments;

DETAILED DESCRIPTION

Figure 1:
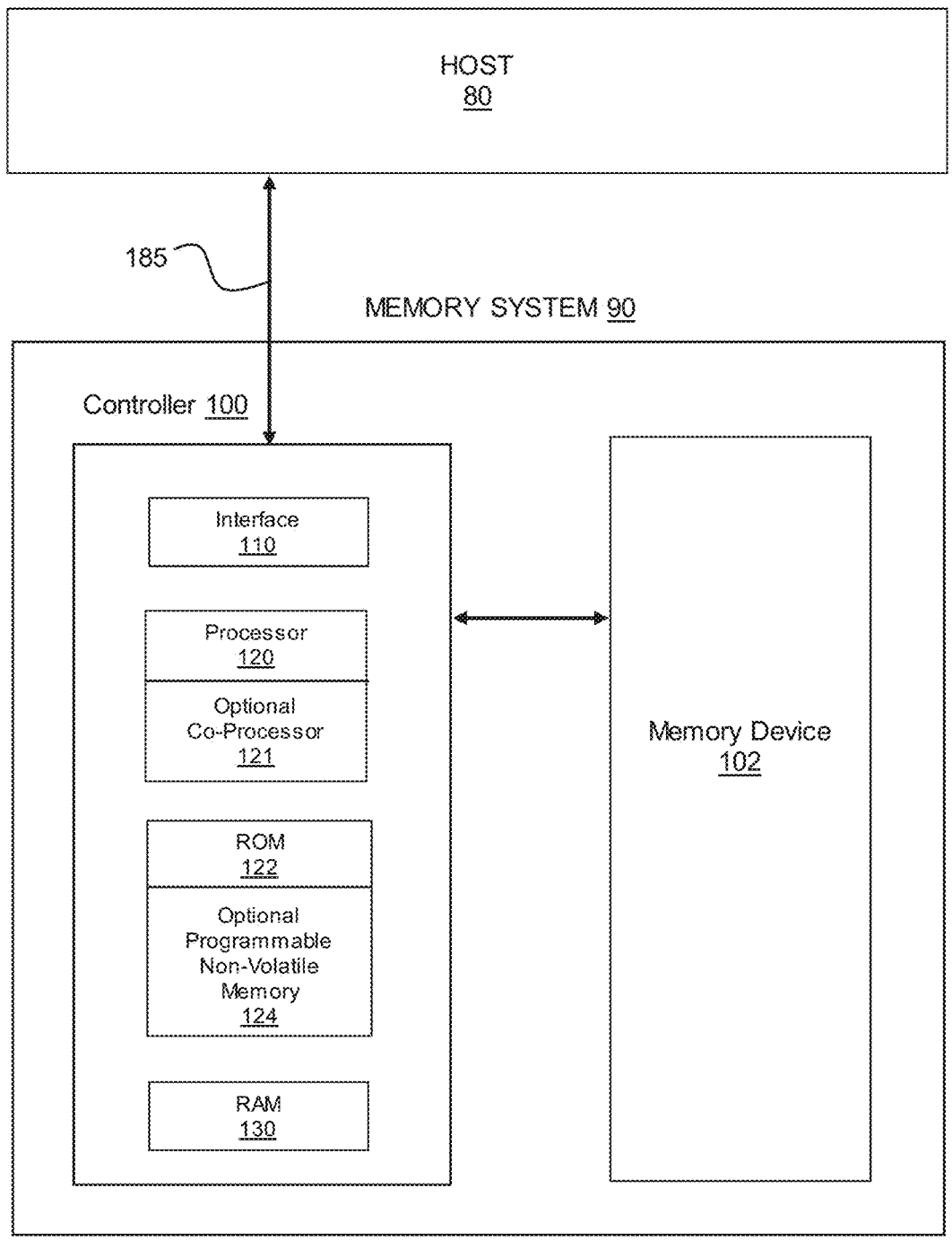
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically-written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
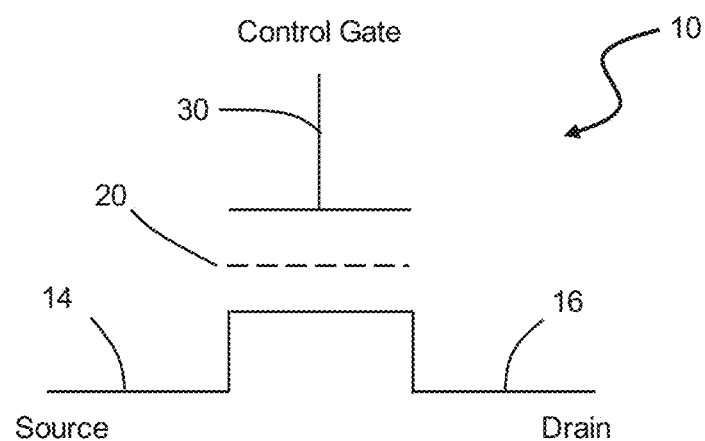
FIG. 2 schematically depicts a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of the bit line.

Figure 3:
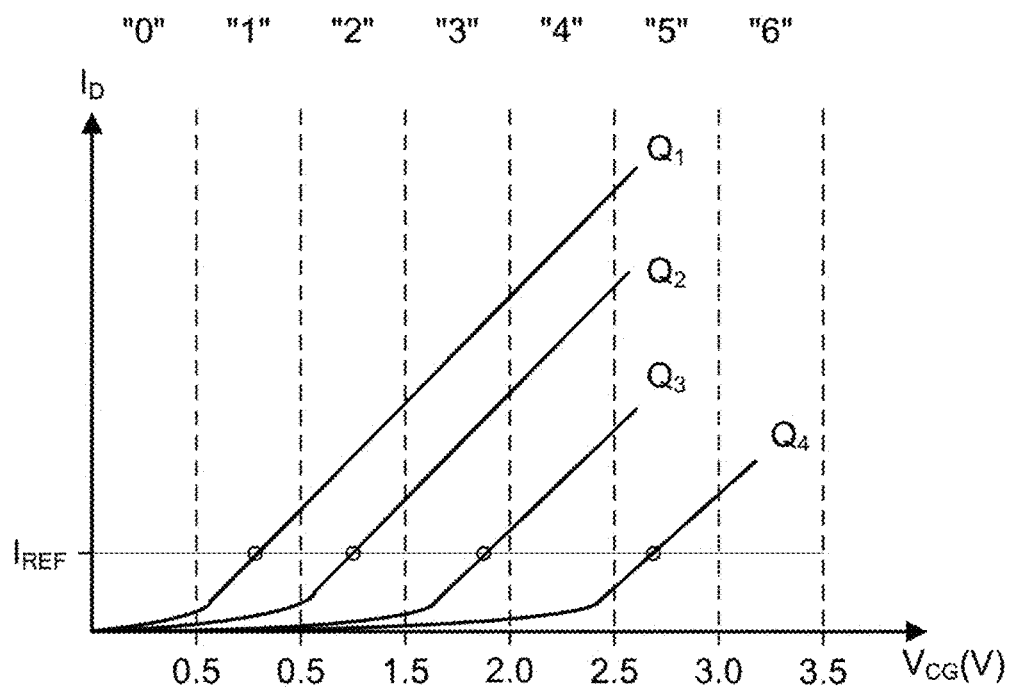
FIG. 3 depicts the relationship between a source-drain current $I_D$ and a control gate voltage $V_{CG}$ for four different charges Q1-Q4 that a floating gate of a non-volatile memory cell may be selectively storing at any one time at a fixed drain voltage, in accordance with exemplary embodiments.

FIG. 3 provides a graphical illustration of the correlation between the source-drain current $I_D$ and control gate voltage $V_{CG}$ for, for example, a non-volatile memory cell 10 having four different charge states Q1-Q4 that the floating gate may be selectively storing at any given time. As shown, with a fixed drain voltage bias, there exists four solid $I_D$ versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2μA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
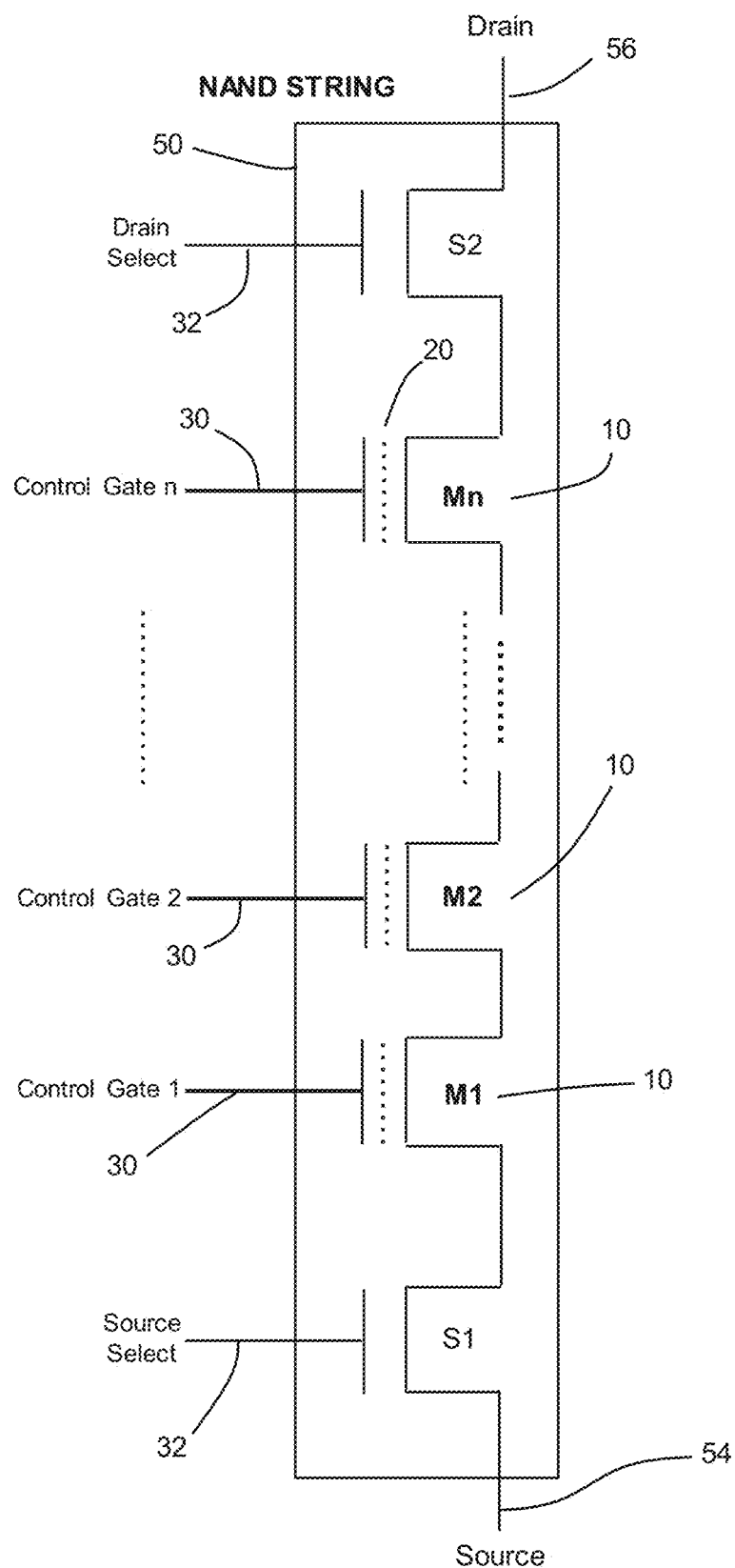
FIG. 4A schematically depicts a series of NAND-type memory cells organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, . . . , Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
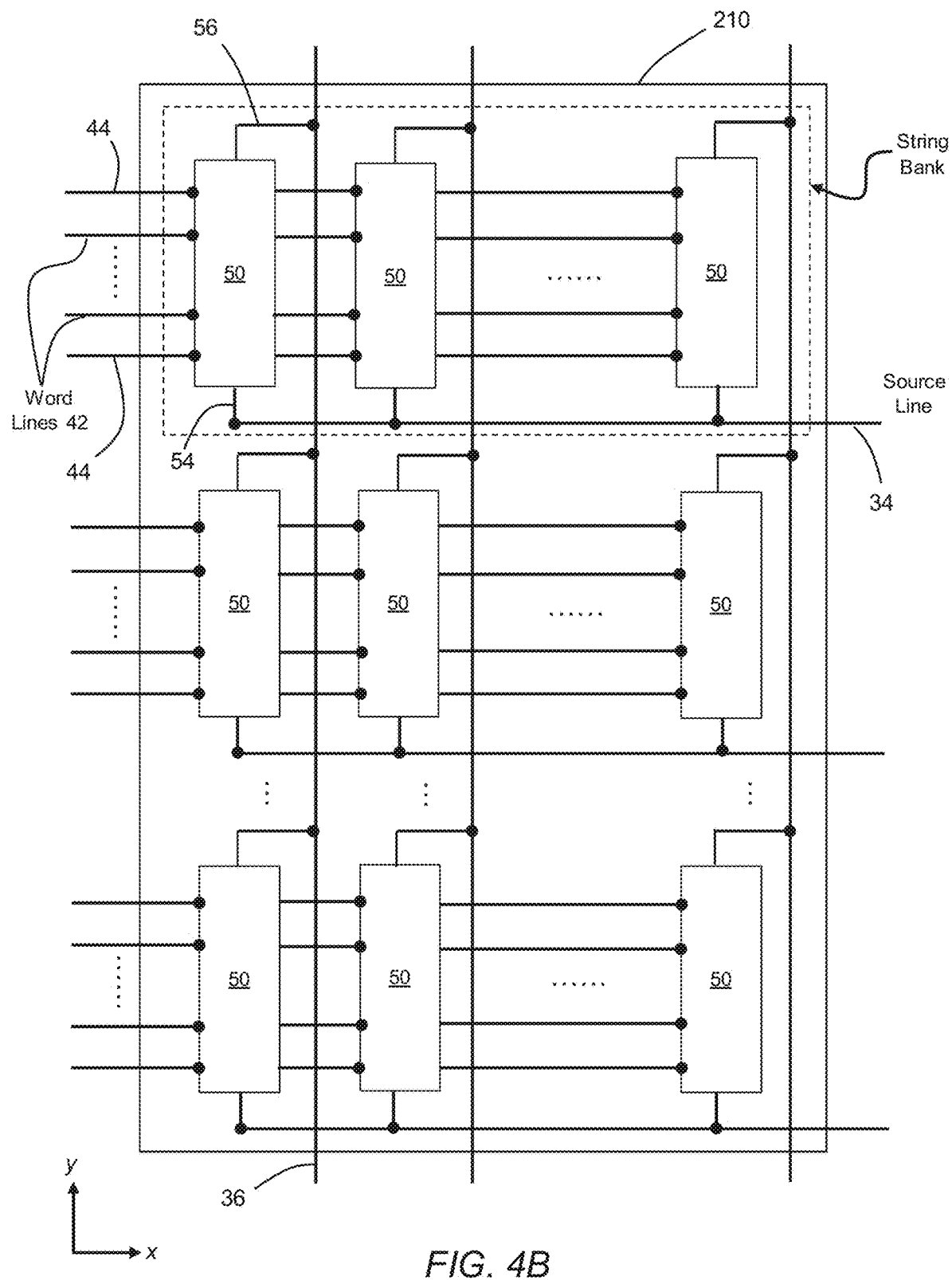
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
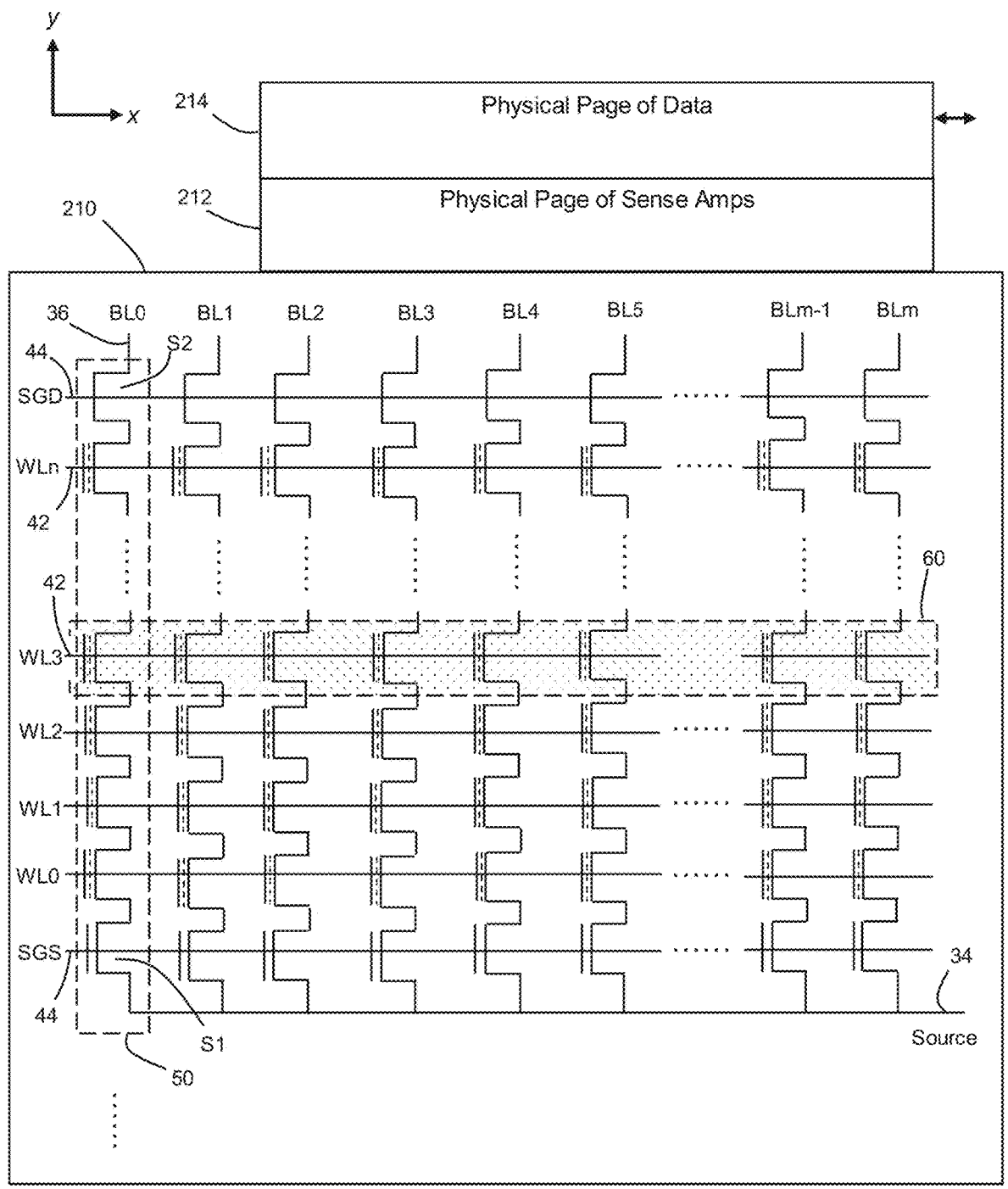
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, . . . , BLm-1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6:
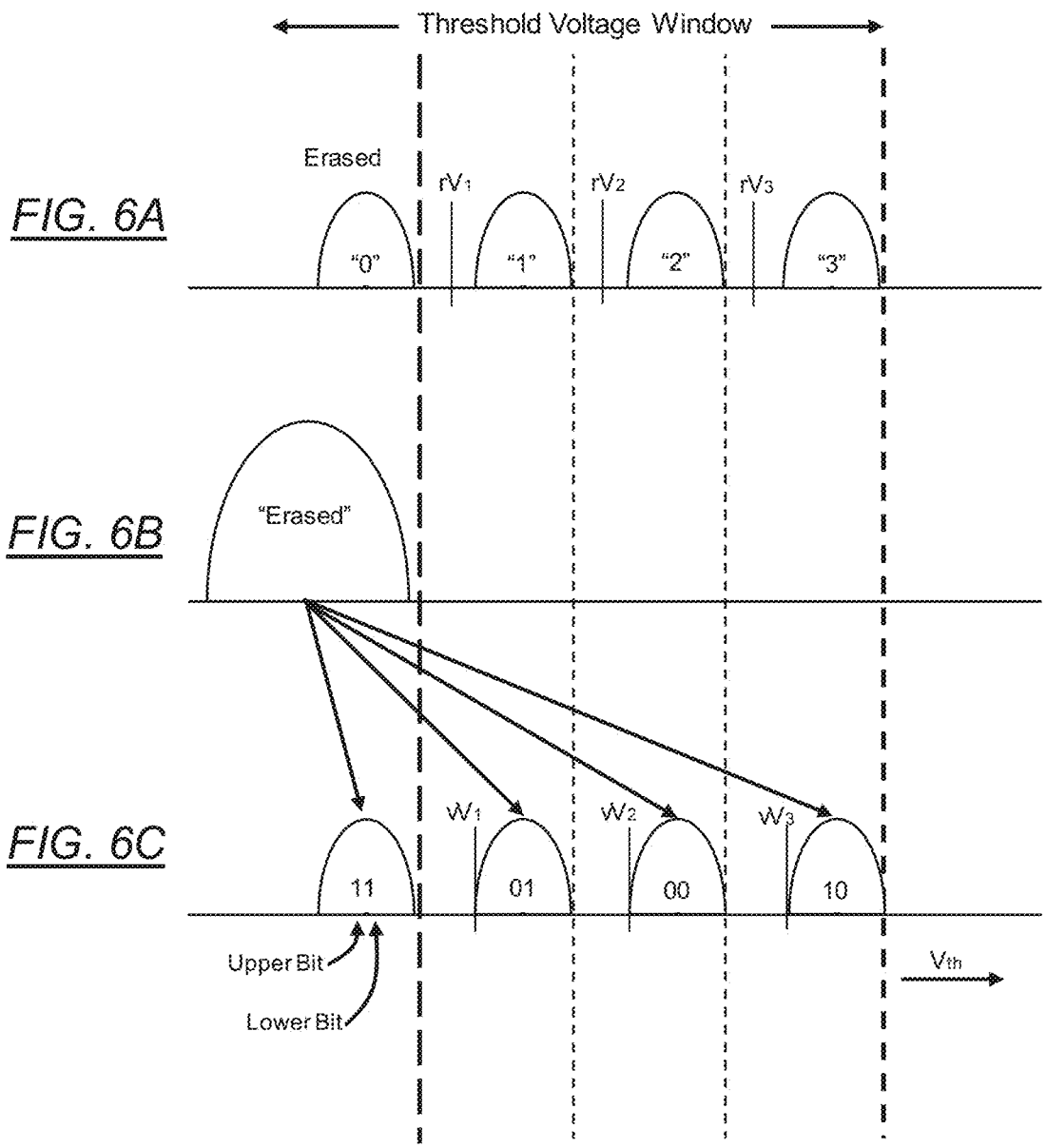
FIGS. 6A-6C depict stages of programming four states of a population of MLC-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages rV1, rV2, and rV3 in three sub-passes respectively.

Figure 7:
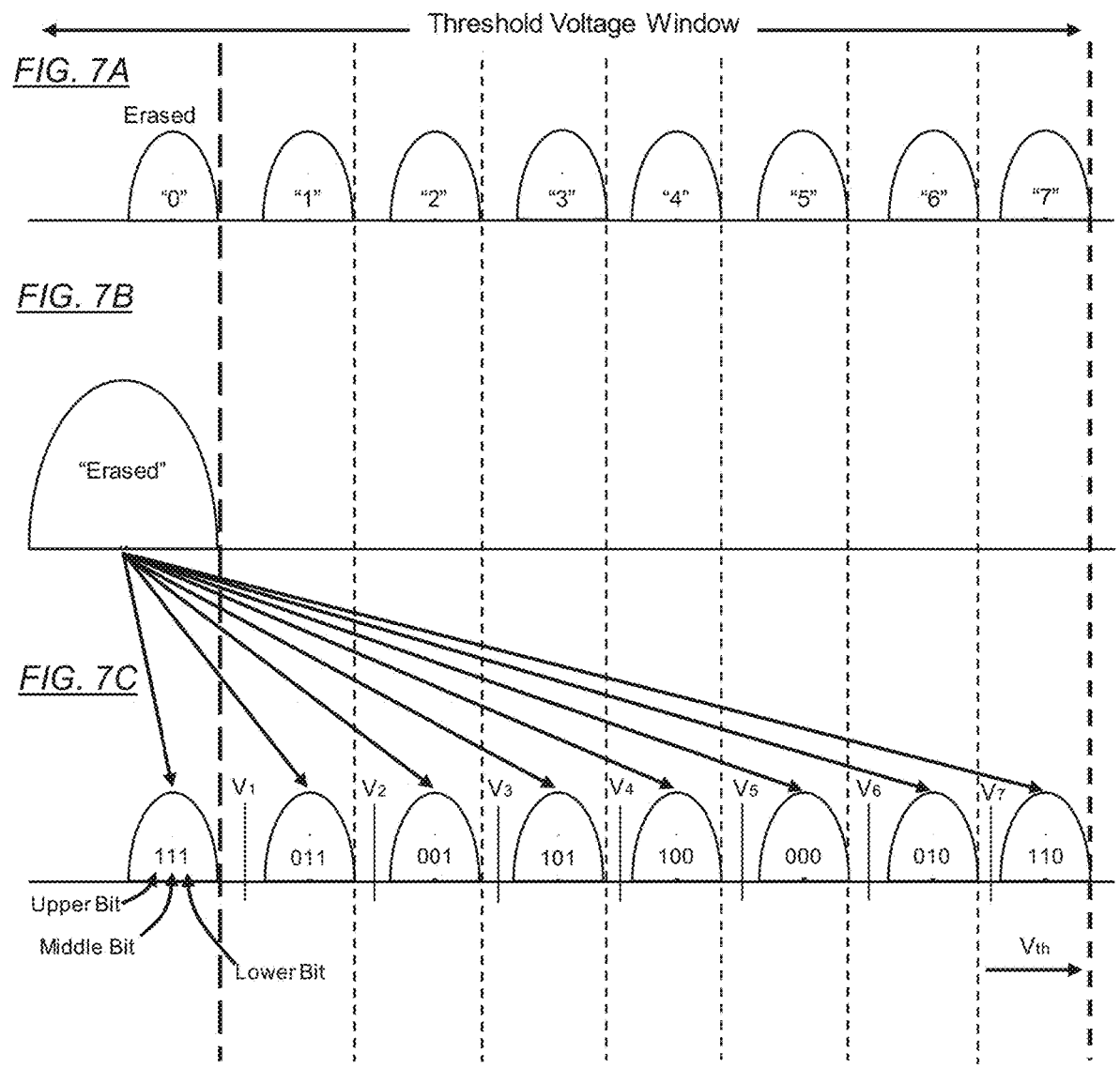
FIGS. 7A-7C depict stages of programming eight states of a population of TLC-type memory cells, in accordance with exemplary embodiments.

Similarly, FIGS. 7A-7C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 7A). Thus, FIG. 7B depicts an initial distribution of "erased" threshold voltages for an erased memory. Further, FIG. 7C depicts an example of the memory after many of the memory cells have been programmed. As a result, a cell's threshold voltage is moved higher into one of the distinct voltage ranges demarcated by levels $V_1$, $V_2$, $V_3$, $V_4$, $V_5$, $V_6$, and $V_7$. Accordingly, each memory cell can be programmed to one of the seven programmed states "1" through "7," or can remain unprogrammed in the "erased" state. As a consequence of the programming, the initial distribution of the "erased" state as shown in FIG. 7B becomes narrower as indicated by the "0" state in FIG. 7C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values $V_1$ through $V_7$ in seven sub-passes respectively.

In FIGS. 4A-4B and 5 and the foregoing corresponding discussion, there is generally described a two-dimensional (or planar) memory array 210 (lying in a x-y plane, for example), which may comprise NAND-type memory cells.

Figure 8:
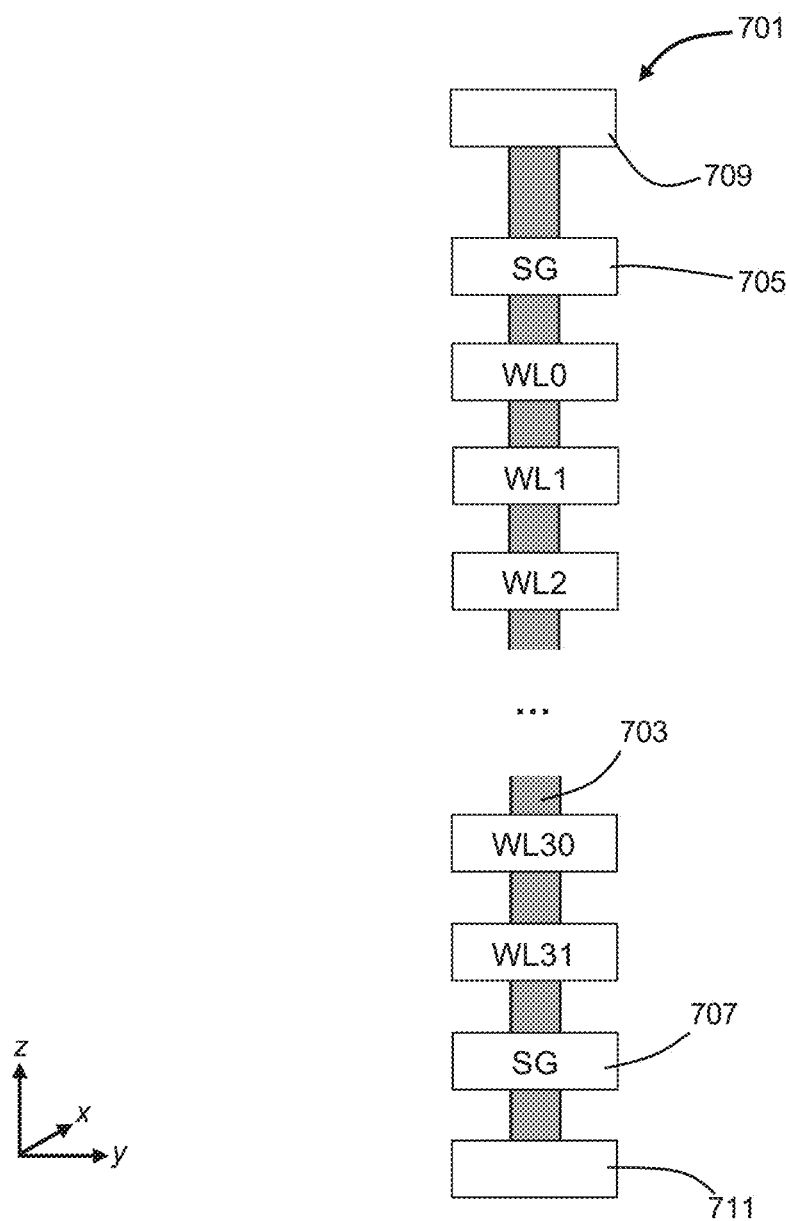
FIG. 8 depicts a vertical NAND-type string in accordance with an exemplary embodiment.

However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 8 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 7, the vertical NAND-type string 701 has 32 memory cells (i.e., at the juncture between local bit line 703 and word lines 0 through 31) connected in series. However, a NAND-type string 701 may comprise any suitable number of memory cells.

Figure 9:
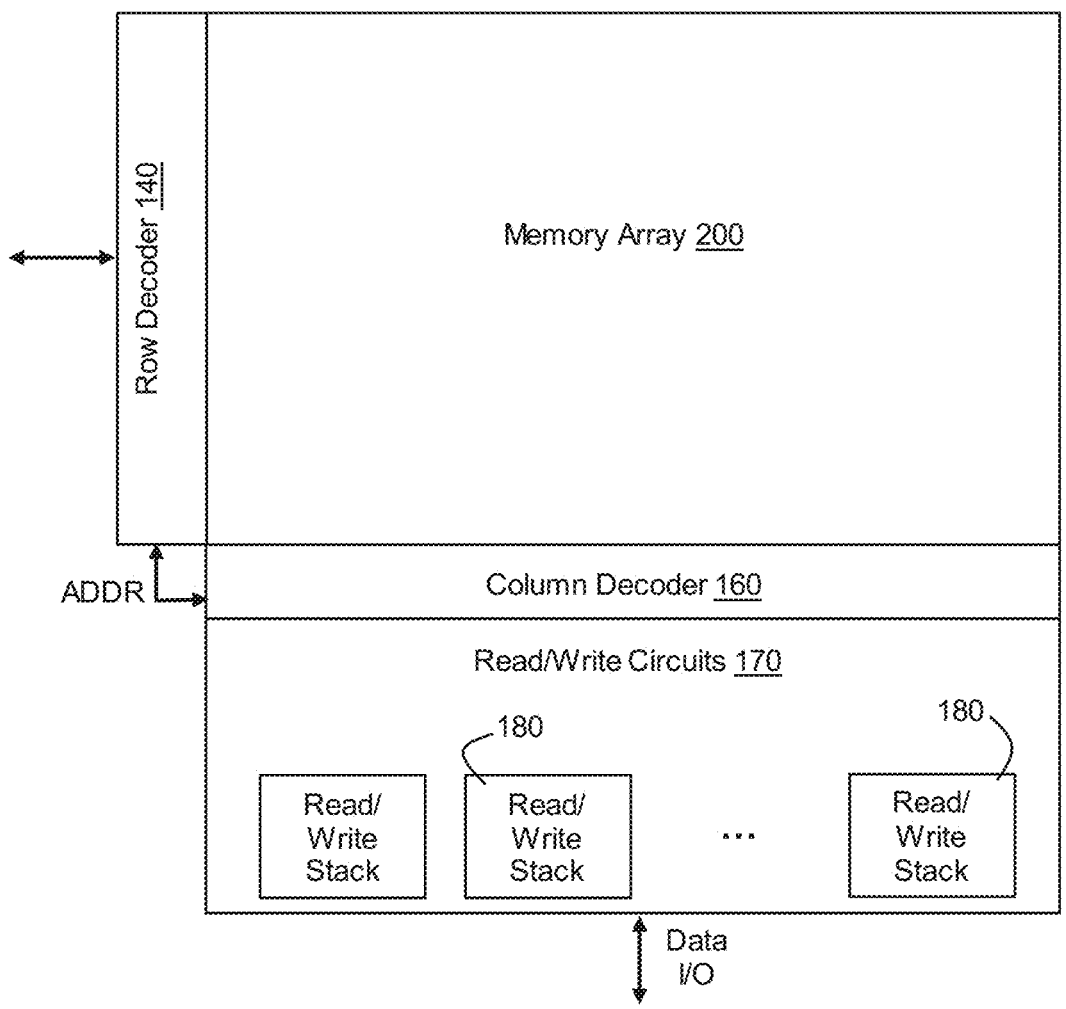
FIG. 9 schematically depicts a configuration of a non-volatile memory array that is accessible by read/write circuits via row and column decoders, in accordance with exemplary embodiments.
Figure 10:
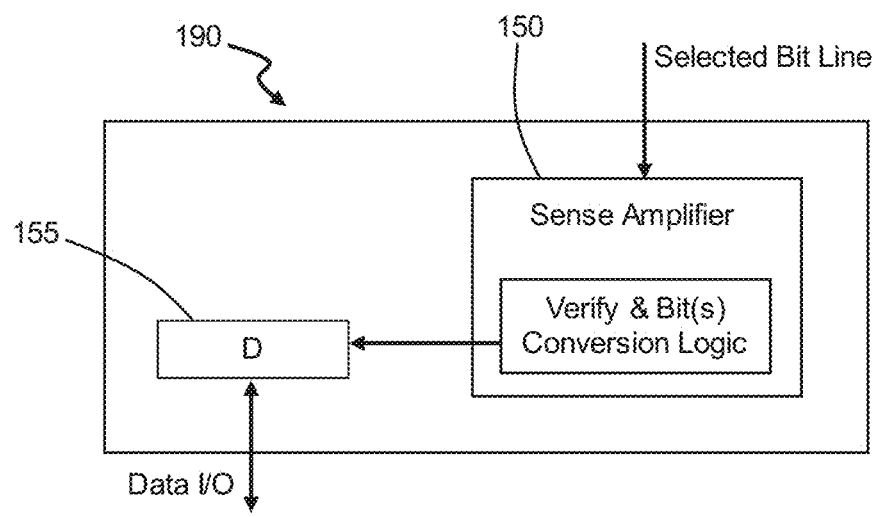
FIG. 10 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 9. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 10, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 9, the read/write circuits 170 are organized into banks of read/write stacks 180 wherein each read/write stack 180 is a stack of read/write modules 190.

Figure 11A:
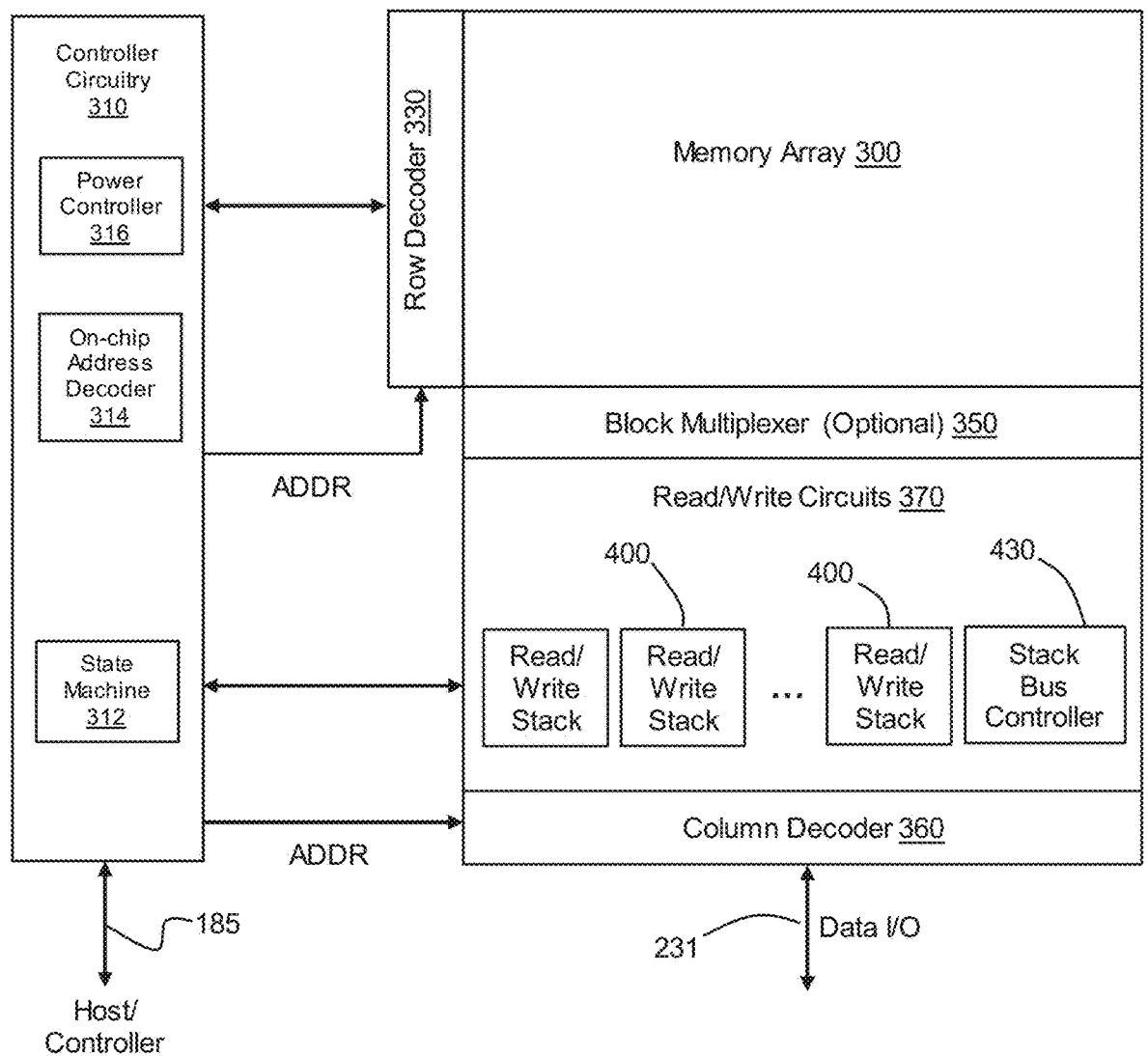
FIG. 11A schematically depicts a memory device with a bank of partitioned read/write stacks, in accordance with exemplary embodiments.

Referring now to FIG. 11A, there is shown an exemplary embodiment of a memory device (such as memory device 102 in FIG. 1, for example) comprised of a non-volatile memory array 300 (which may include NAND-type SLC, MLC, and/or TLC cells in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. The memory array 300 is addressable by word lines via row decoder 330 and by bit lines via column decoder 360. Alternatively, the memory array 300 may comprise rows of memory cells that are partitioned into multiple blocks or pages. In such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 11B:
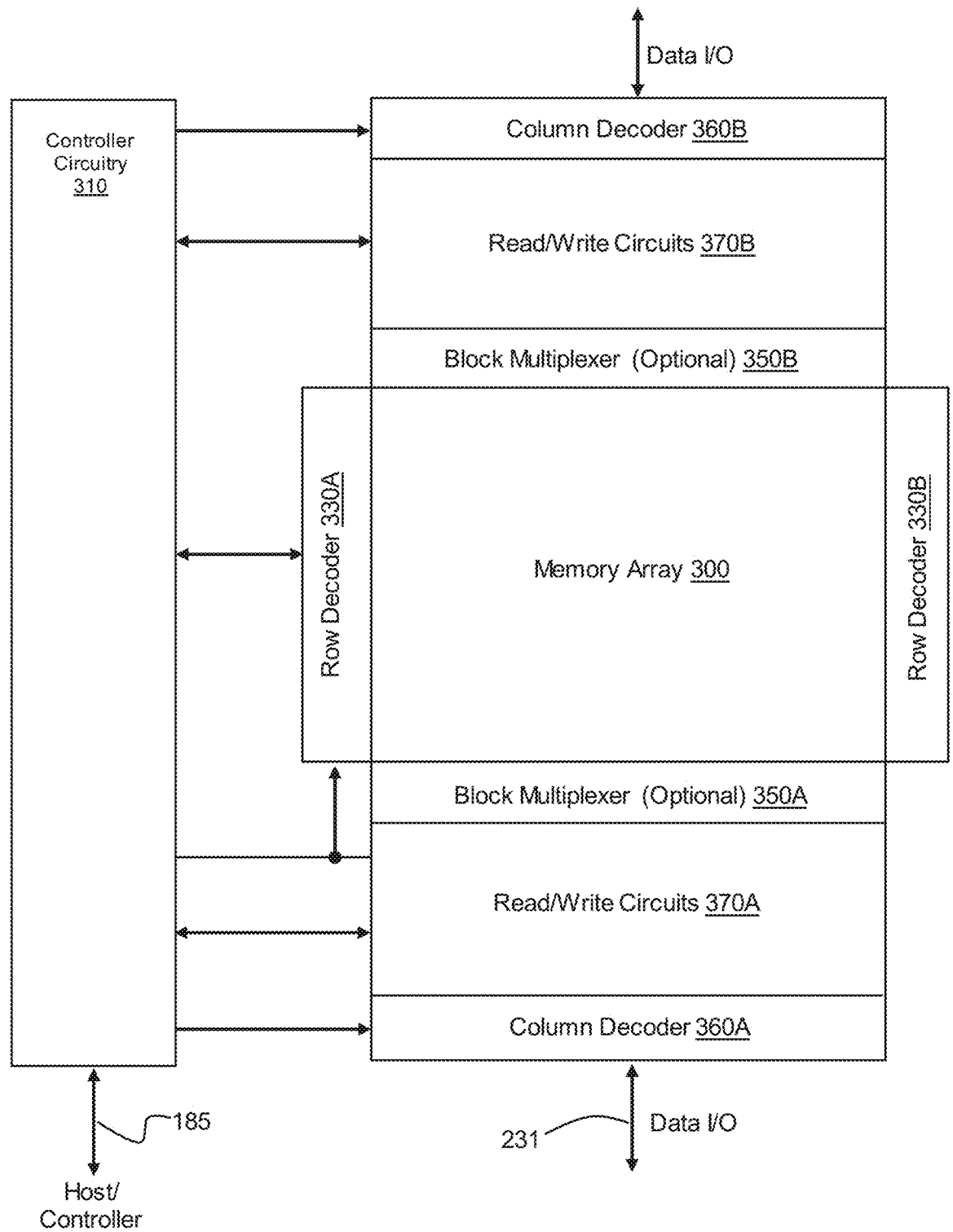
FIG. 11B schematically depicts the memory device of FIG. 10A in a slightly different configuration, in accordance with exemplary embodiments.

FIG. 11B depicts a slightly different exemplary embodiment of the memory device of FIG. 11A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 11A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 12:
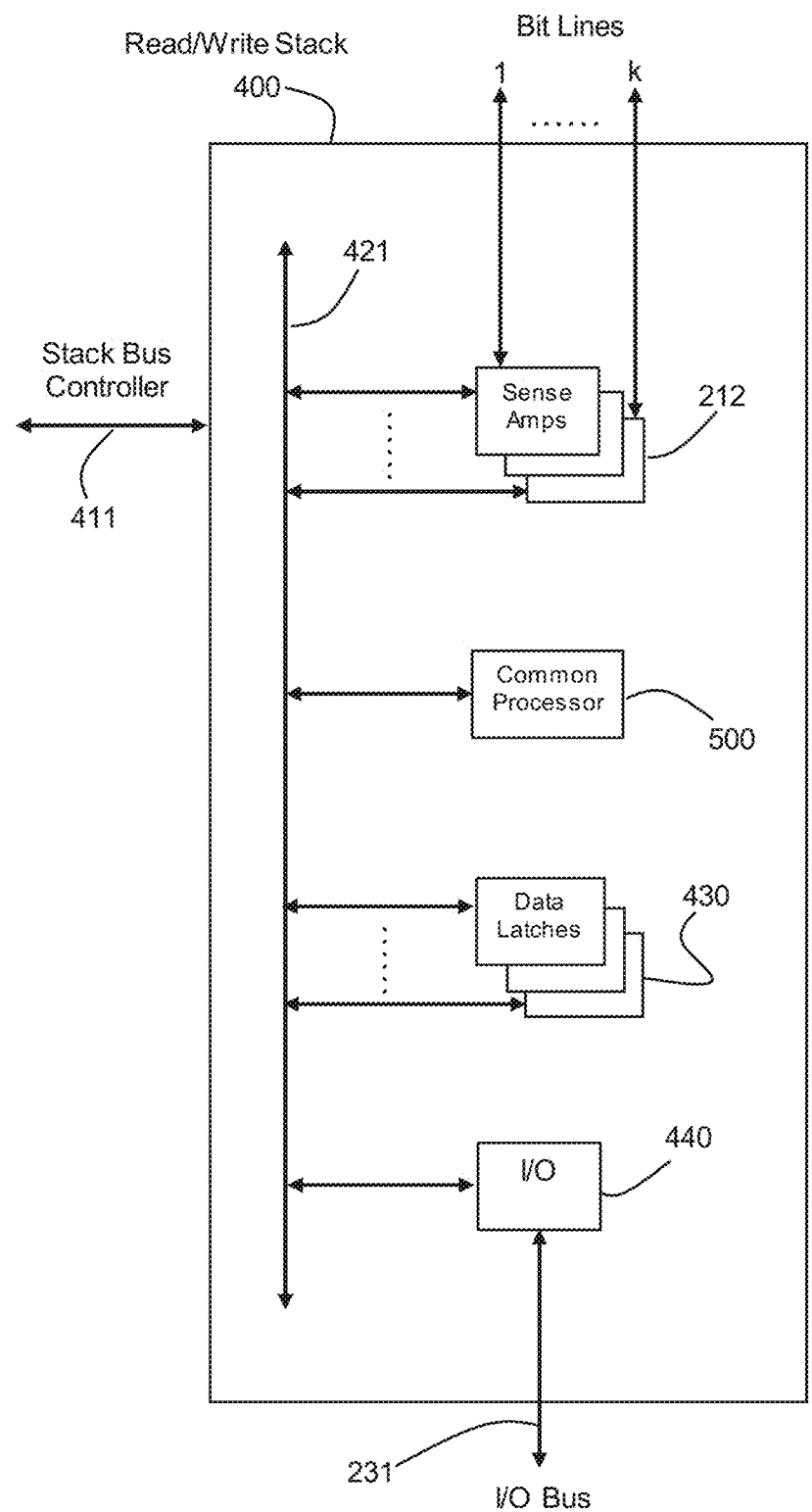
FIG. 12 schematically depicts various components of a read/write stack, such as the read/write stacks depicted in FIG. 10A, in accordance with exemplary embodiments.
Figure 13A:
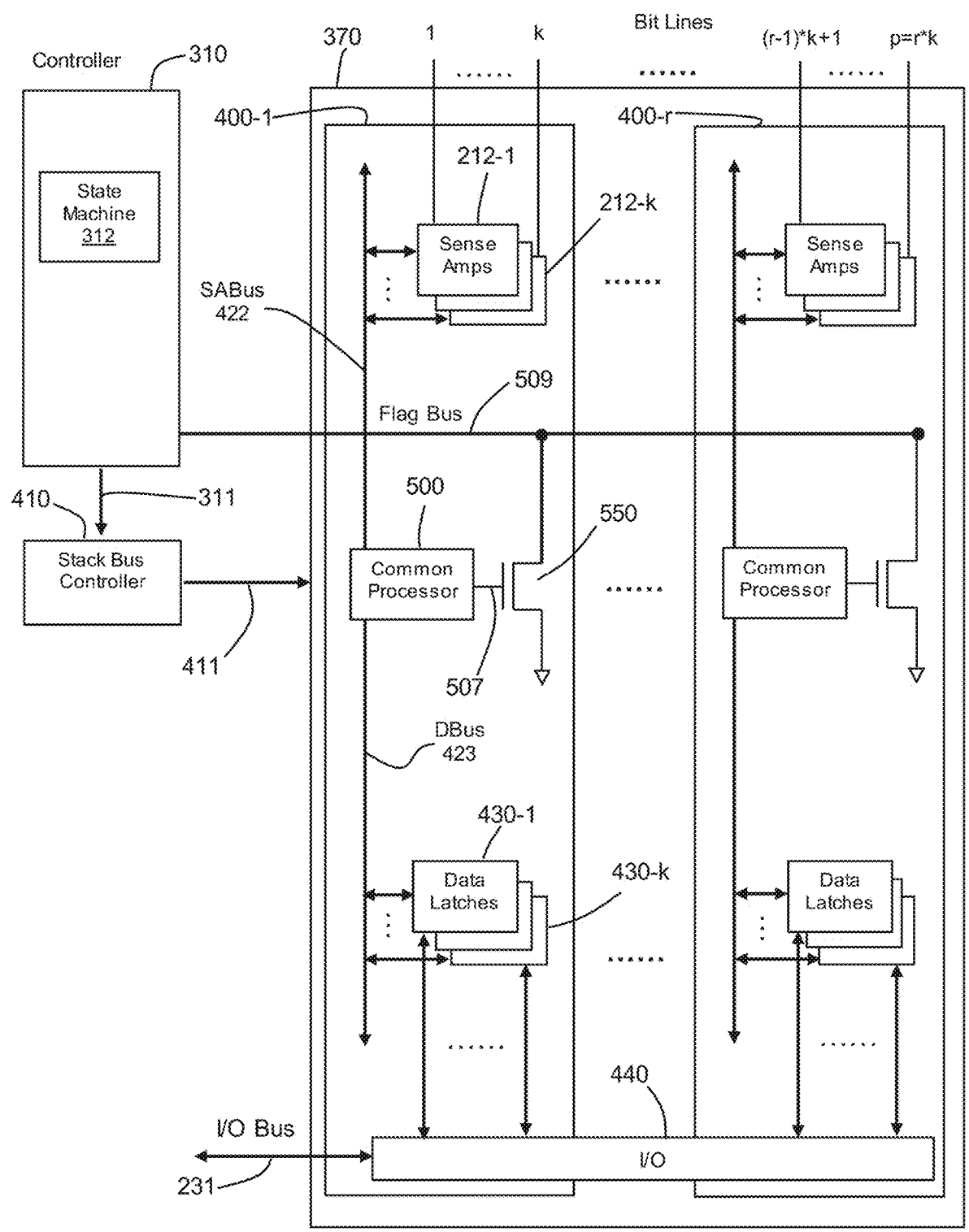
FIG. 13A schematically depicts a plurality of read/write stacks arranged amongst read/write circuits of a memory device, such as the memory device depicted in FIG. 10A, in accordance with exemplary embodiments.

Referring now to FIG. 12, there is illustrated an exemplary embodiment of certain components in a read/write stack, such as the read/write stacks 400 of FIG. 11A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 13A depicts an exemplary embodiment for incorporating the read/write stack 400 of the embodiment in FIG. 12 amongst the read/write circuits 370 of the memory devices depicted in FIGS. 11A-11B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 13A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, . . . , 212-k, and the DBus 423 provides a communication pathway between the common processor 500 and the stack of data latches 430-1, . . . , 430-k. With respect to the common processor 500, it further comprises an output 507 for output of a status signal of a memory operation, such as an error condition. As is depicted in FIG. 13A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-r.

Figure 13B:
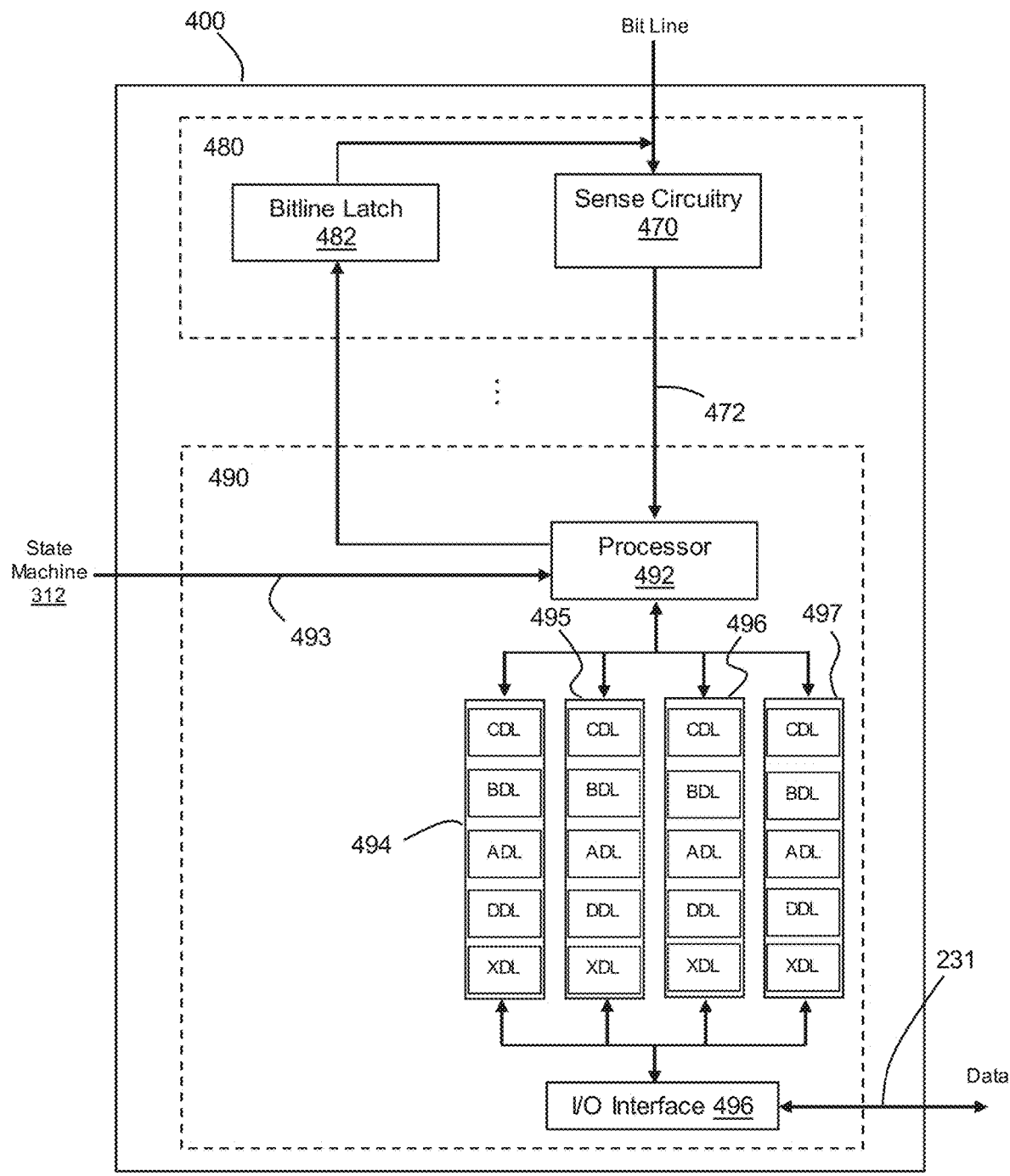
FIG. 13B is a block diagram depicting a sense block of a read/write stack, such as the read/write stacks depicted in FIG. 10A, in accordance with exemplary embodiments.

Further, an exemplary embodiment of an individual sense block (as encompassed by a read/write stack 400) is depicted in FIG. 13B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 13B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits determined by processor 492 during a read operation, and to store data bits imported from the data bus 231 during a programming operation which represent write data meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 serves double duty, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

Each set of data latches 494-497 may be implemented as a stack of data latches for each sense module. In one exemplary embodiment, there are three data latches per sense module 480. In some implementations, the data latches are implemented as a shift register so that the parallel data stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules is adapted such that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

Figure 14:
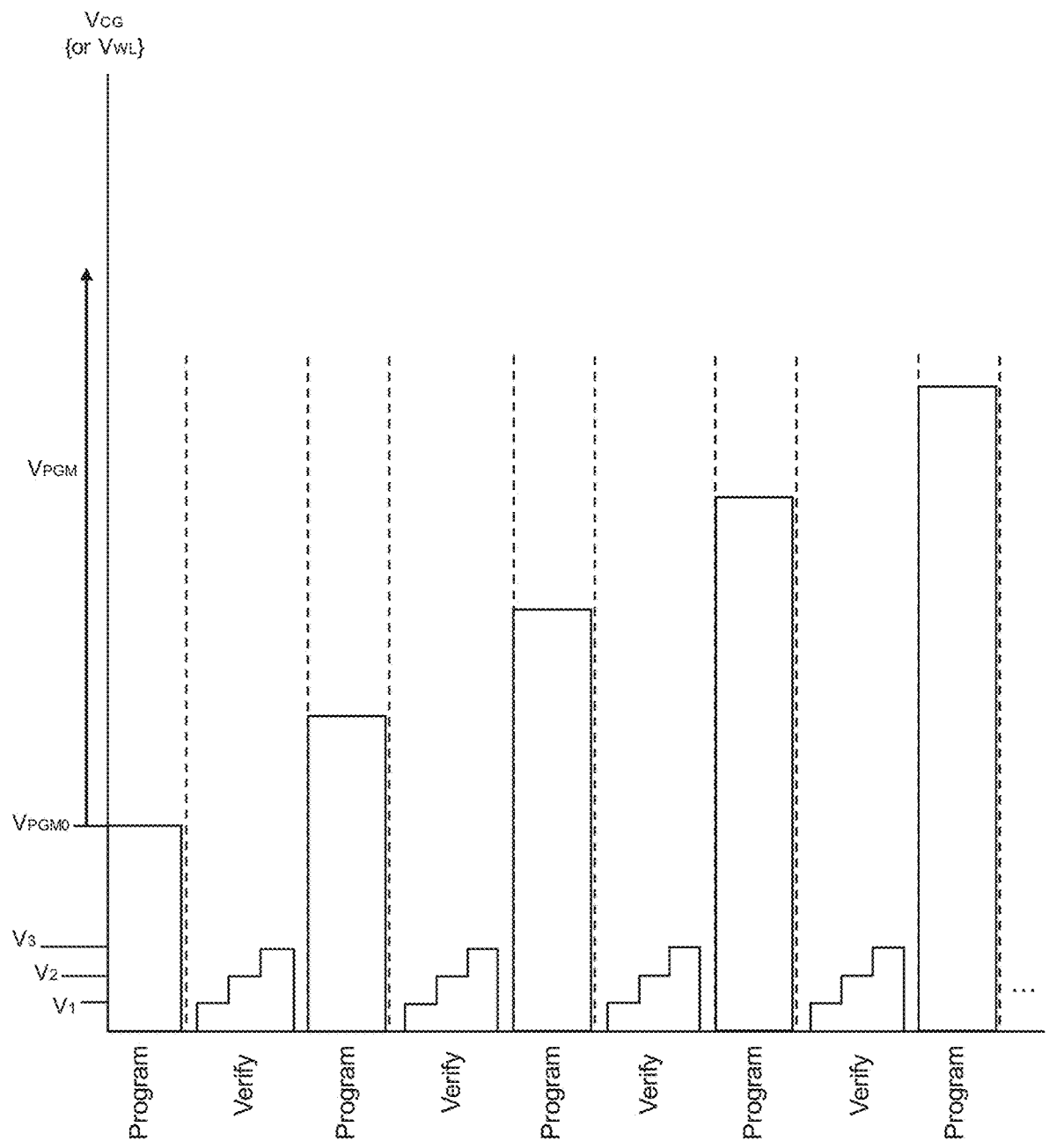
FIG. 14 illustrates a process of programming a 4-state memory cell to a target memory state, in accordance with exemplary embodiments.

An exemplary embodiment of a process for programming a 4-state memory cell to a target memory state is depicted in FIG. 14. As mentioned above, during a program operation, programming circuits will apply a series of programming pulses to a selected word line of the memory array. Thus, a page of memory cells whose respective control gates are coupled to the selected word line are therefore subject to the same series of programming pulses such that the cells are programmed in unison. As illustrated in FIG. 14, the sequence of applied pulses in the programming train may have an increasing period or amplitude in order to counteract the accumulating electrons programmed in the charge storage unit of the cell being programmed. Designated as $V_{PGM}$ in FIG. 14, the programming voltage may comprise a series of pulses in the form of, for example, a staircase waveform beginning at an initial voltage $V_{PGM0}$ and increasing thereafter, wherein each pulse attempts to add incremental charges to the charge storage element of the cell. Between the programming pulses, the cell is read back to determine its threshold voltage level using one or more sensing operations. Once the threshold voltage of the cell is verified to be within the threshold voltage window of the target state, the cell is signaled as program-inhibited such that no further programming of that cell can occur. However, the other cells may continue to be subject to programming until all cells of the page have been program-verified.

Focusing now on the issue of word line defects, as mentioned above, with the scaling down of memory cells to a 20 nm or 10 nm size, the distance between adjacent word lines is consequently 20 nm or 10 nm, thereby narrowing tolerances and increasing the risk of word line defects. Word line defects can include both word line leakages (due to, for example, shorting between adjacent word lines or leakage to the substrate) and broken word lines. However, it is possible to detect a word line defect prior to an actual program status failure. Accordingly, the detection of a leakage can be done during the testing of a memory chip prior to its assembly as part of a device. In an exemplary embodiment, testing is conducted by applying high voltage levels directly to a device's pins and measuring the resultant current/voltage levels at the pins. Clearly however, this method requires an external testing device and the word lines cannot be tested after device burn-in. Thus, it would be beneficial to have a suitable on-chip means for detection of a word line leakage in situ or in the field.

Figure 15:
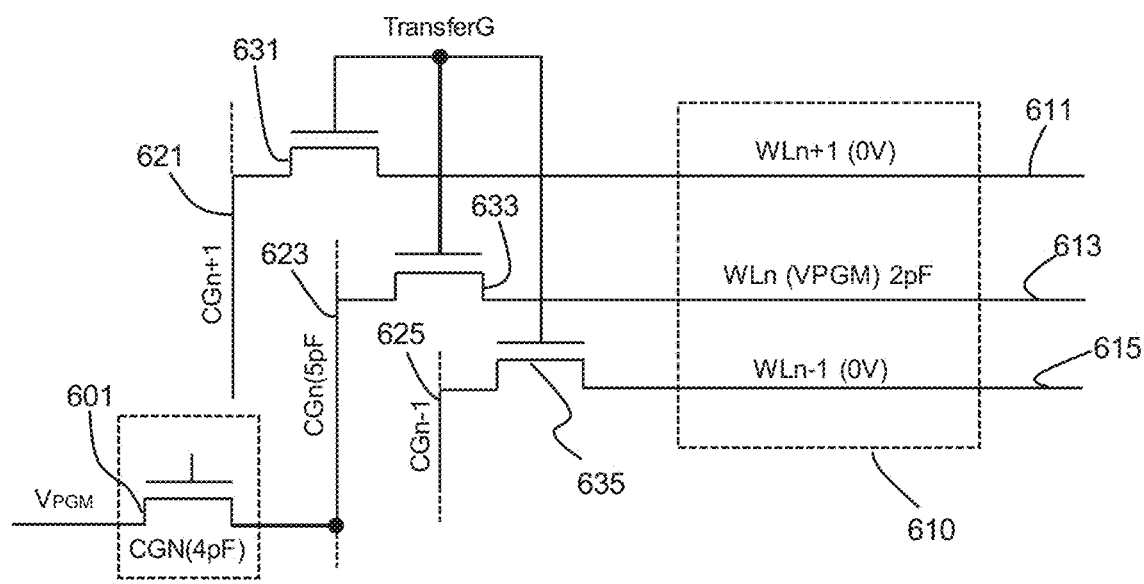
FIG. 15 is a circuit diagram illustrating the application of voltage to a representative block of word lines.

One of the challenges in detecting a word line leakage is the small magnitude of the leakage current. In a typical device, the leakage current could be on the order of 100 nA at high voltage stress such as 10 to 20 volts and the difficulty in detecting this level of current at high voltage is a result of the NAND-type architecture. In FIG. 15 there is depicted an illustrative portion of a memory circuit in accordance with an exemplary embodiment thereof. As is mentioned above, in a flash memory, circuits such as these typically comprise on the order of several thousands of blocks in which each block has several dozen word lines. With respect to FIG. 15, there is shown one representative block 610 and, for ease of illustration, only three example word lines (see WLn-1 615, WLn 613, and WLn+1 611) in the block are specifically shown. In addition, word line drivers are connected to the word lines from one end of the word line array and a high voltage is applied on a selected word line, such as WLn 613, during the program and read operations. By connecting the word line drivers to both ends of the word lines, a word line leakage or breakage can be detected by, for example, sending a known current from one end and detecting the same current at the other end. For example, with respect to the exemplary circuit in FIG. 15, a generated high voltage $V_{PMG}$ signal is applied to a first decoding block, CGN 601 (which is represented as a switch in this example), wherein CGN block 601 supplies the various (e.g., 3 to 5 different kinds) voltages according to the mode of operation for each of the global control gate (CG) lines. In corresponding to the depiction in FIG. 15 of the three word lines (611, 613, and 615), there is also specifically shown three CG lines (621, 623, and 625). The CG lines route to the row (block) decoder of the memory array. In practice, the CG lines will run to the other blocks in the array (in addition to block 610), and usually route through the top metal layer and run through all of the row decoders of the circuitry. In an exemplary embodiment, each block is decoded with a local pump wherein, when the block is selected, a logic signal enables the local pump to apply a high passing voltage transferG on the control gates of the passing transistors (see 631, 633, and 635) in the row decoder. The high voltage on the corresponding global CG will then be transferred to the word line of the selected block. In the circuit embodiment of FIG. 15, word line 613 is the only word line connected to receive voltage $V_{PGM}$ as the two adjacent word lines 611, 615 are routed to ground (or to a low voltage level) in accordance with an exemplary word leakage test pattern that is discussed in greater detail below.

It should be noted that during a word line leakage test, different voltage bias topologies may be applied to the word lines according to the types of defects to be detected. For example, in the case of detecting a word line-to-substrate short, all the word lines may be biased to a high voltage of the same level with the substrate at ground. However, in the case of detecting a word line-to-neighboring word line short, the word lines in the block may be biased differentially at a high $V_{PMG}$ voltage and 0 volts (as shown in FIG. 15). As a result, the parasitic capacitance is significantly greater in this latter case. To that point, also indicated in FIG. 15 are certain exemplary estimated values for the parasitic capacitances that may be anticipated. For example, from the high voltage pump to the CGN (high voltage to multiplexing block) in a 64-word line architecture, the contribution may be approximately 5 pF. Moving to inside the CGN block, the loading may be approximately 4 pF. In addition, each global top metal routing from the CGN block to the row decoder at the end of the array may be approximately 4 pF. And, the junction capacitance of one plane of the circuit may be approximately 1 pF. Further, each local word line may have approximately 2 pF.

However, in a differential bias configuration wherein 32 of the 64 word lines are biased to a high voltage and the other 32 word lines are biased to 0 volts, the total word line capacitance is 2×32=64 pF. Accordingly, the total global CG line will be 5×32=160 pF. Therefore, to detect a leakage on the high voltage supply node $V_{PGM}$, the total capacitance will be 64+160+4+5=233 pF. Therefore, were the system to use a 100 nA of leakage to discharge the large capacitance of 233 pF and let the high voltage drop to 1 volt, this would necessitate a 2.3 ms detection time. As such, after detecting the leakage on an even word line, a further 2.3 ms will be needed to test an odd word line. Accordingly, the total leakage test time would be approximately 5 ms. To reduce the detection time, the voltage drop required for the detection can be reduced to 100 mV, with a corresponding reduction in the detection time to approximately 500 µs. These parameters may be used for in-field detection operations.

In an exemplary embodiment, this detection mechanism could be executed before each erase operation and, for example, could be included as part of an erase operation sequence or, in another example, can be done before the erase in response to an instruction that is issued by the controller. In the event that a block fails during detection, the controller can then remove it from the population of usable blocks.

Accordingly, the discharge and detection time will depend on the parasitic capacitance of the CG routing of the memory circuit. To manage this, exemplary embodiments of a leakage detecting mechanism include an on-chip calibration system built into the memory chip such that precise leakage criteria can be used and the detection time can be automatically (dynamically) adjusted according to the chip architecture, word line voltage stress topology, number of planes, and any other contributing factors.

Figure 16:
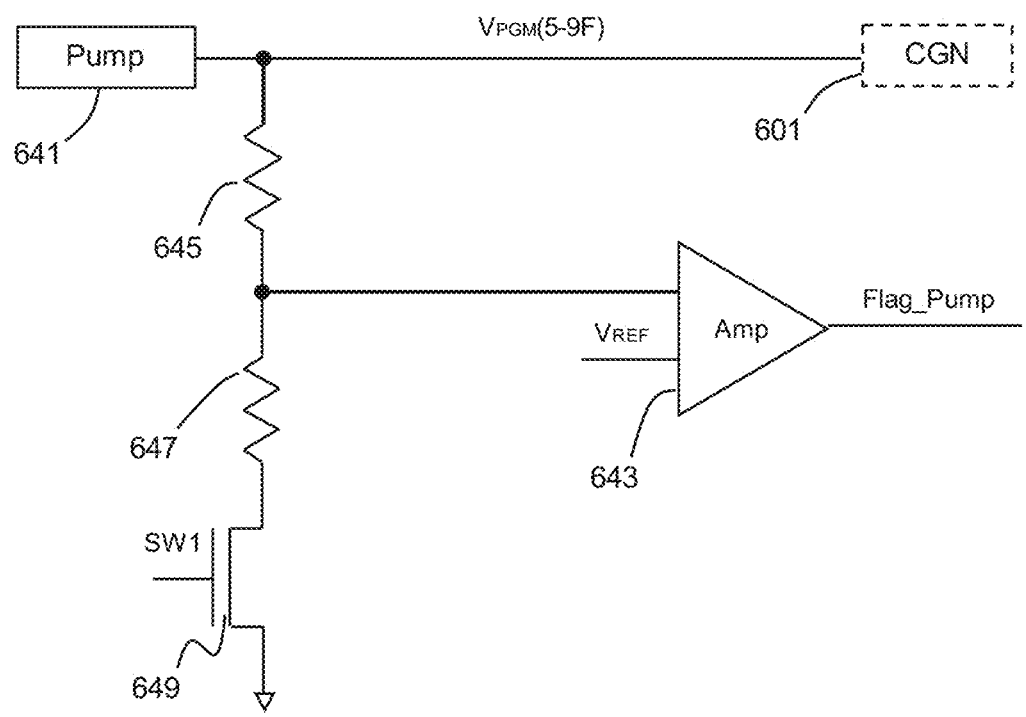
FIG. 16 is a circuit diagram of a charge pump circuit, in accordance with exemplary embodiments.

With respect to FIG. 16, it depicts an exemplary embodiment of a high voltage pump regulator utilizing a resistor divider. Specifically, the high voltage ($V_{PGM}$) is divided by two resistors 645, 647, which are connected to ground (or to a low voltage level) by way of switch SW1 649, wherein the compare point voltage for the amp 643 is a reference voltage ($V_{REF}$) of approximately 1.2 volts. The resistor chain will have a leakage current of approximately 10 µA. Accordingly, differential amplifier or comparator 643 is used to output, for example, a digital voltage flag pump signal used to control the pump clock. For example, when the pump 641 is pumped to the target level, the flag pump output signal will be low to stop the pump clock. Conversely, when the high voltage is dropped below a certain level, the flag pump output signal will go high, thus enabling the pump clock to turn on the pump 641 in order to supply the high voltage ($V_{PGM}$).

Figure 17:
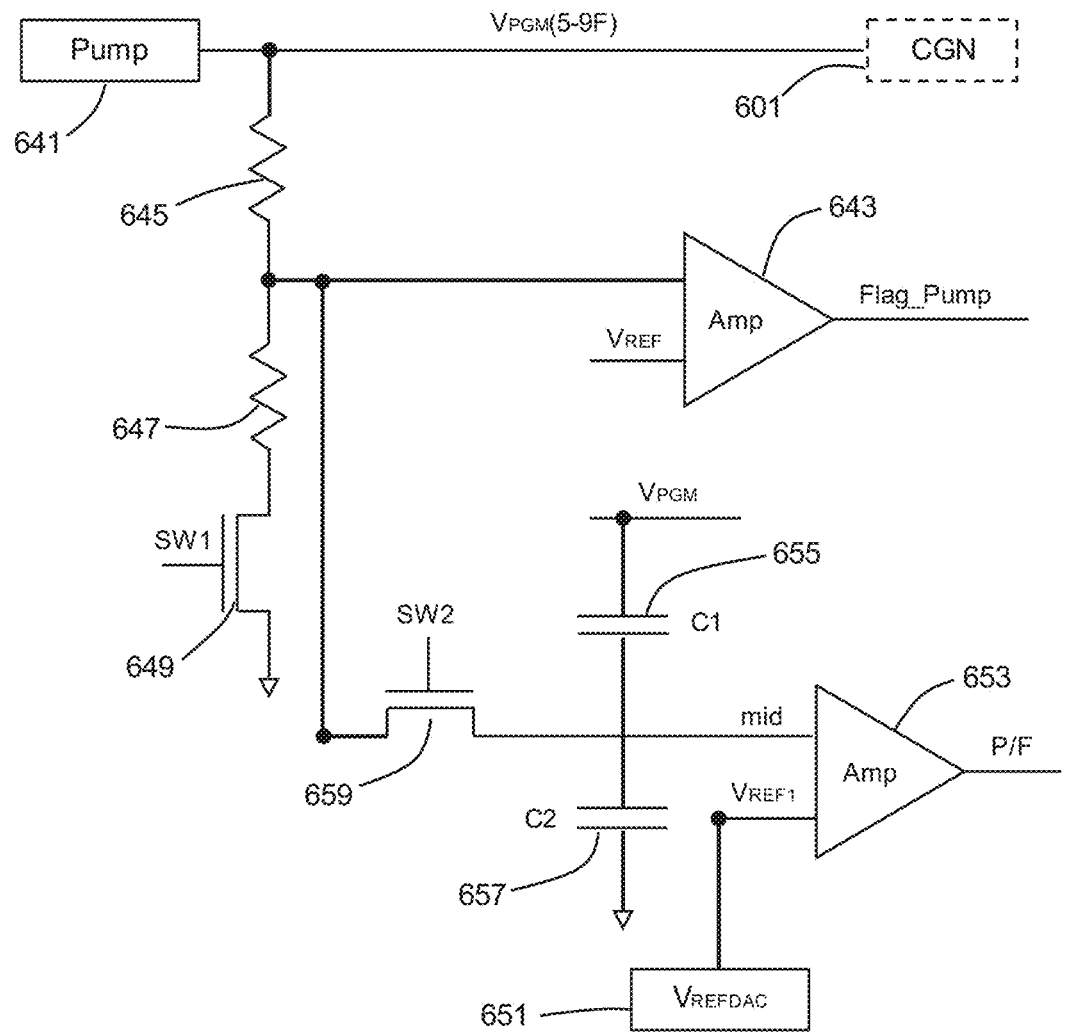
FIG. 17 is a circuit diagram of a leakage detection circuitry, in accordance with exemplary embodiments.

Referring now to FIG. 17, there is shown an exemplary embodiment of a leakage detection circuit designed to detect the voltage change on the large parasitic high voltage node present in, for example, the memory circuit embodiment of FIG. 15. As the leakage current is approximately 100 nA, a comparator is normally built with a low voltage supply for saving $I_{cc}$ current. In this particular embodiment, a capacitive divider is used and has the advantage of no leakage current. However, the challenge with respect to a capacitive voltage divider is that the initial voltage at the detection point must be accurately set. Thus, as depicted in FIG. 17, a new set of differential amplifiers or comparators 653 is used for the word line leakage detection in addition to the regulator 643. The comparison voltage $V_{REF1}$ can be set by a digital-to-analog converter voltage circuit 651, whose input can be set according to the device or during the calibration process. In addition, switch transistor (SW2) 659 is used to initialize the compare nodes at the same voltage level as the regulating level. Further, the two capacitors (C1) 655 and (C2) 657 may comprise the voltage divider wherein a ratio of 1:1 is used. Accordingly, the detection point voltage ($V_{mid}$) will have a delta (change) as follows:

$$\Delta V_{mid} = \Delta V_{output}\left(\frac{C1}{C1 + C2}\right), \quad \text{(Equation \#1)}$$

where $\Delta V_{output}$ is the high voltage drop due to word line leakage. Therefore, in order to detect a high voltage change of 100 mV, wherein the C1=C2, a 50-mV change will be shown at the comparator point. The reference voltage for the comparator will be moved down by 50 mV.

Figure 18:
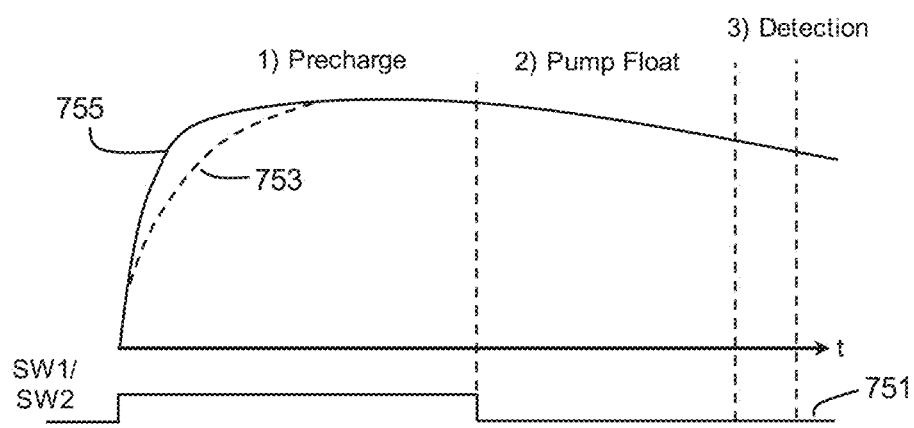
FIG. 18 illustrates the phases of a leakage detection process, in accordance with exemplary embodiments.

With respect to the leakage detection circuit of FIG. 17, there is a three-phase detection process, which is shown in the diagram of FIG. 18 wherein the word line voltage level is indicated as 755. According to this exemplary embodiment, during a precharge phase, the high voltage pump is on with a regulator setting to a targeted level of SW1=vdd and the word lines are precharged to the high voltage. A sufficient period of time should be used to charge the whole word line. (This complete charging of a word line may take some time and the voltage charge level may accumulate at a rate that is more in accordance with the dotted line 753). Furthermore, the high voltage can be pumped in two stages, the first stage being to pump to an intermediate voltage with another pump and the second stage being to charge the word line to a higher voltage level with the high voltage pump. Also during the precharge stage, the detection point voltage, $V_{mid}$, may also be initialized by turning on switch transistor SW2 (659). Once the word line is fully charged to the target level, the pump is turned off (float), along with the resistor regulator wherein switch SW1=0. In addition, the switch SW2 is turned off thereby trapping a voltage on the mid node. Subsequently, after a discharge period has occurred (which may be regulated according to a timer set to a certain time parameter), the voltage drop is measured by the comparator 653. The discharge period will depend on the total parasitic capacitance and the targeted detection leakage current. To be specific, the mid-point voltage is compared with the $V_{REF1}$ to generate a Pass or Fail (P/F) signal, wherein the $V_{REF1}$ is generated from the analog-to-digital converter 651 delivering, for example, a voltage that is between 0 to 1.2 V with a 50-mV resolution.

As mentioned above, one solution to a word line leakage being detected is to flag the entire block containing the defect as a bad block and to cease its use. In such an approach, any valid data in the defect block may consequently be transferred as needed to another block. However, as noted above, the leakage process may be executed as part of an erase operation. A word line leakage detection according to the embodiments described above can be conducted as part of the testing during manufacture, or it may be a part of in-field tests performed later on in which a microcontroller issues a command to perform the leakage test in the user application. A suitable time for the leakage detection test is, for example, prior to an erase operation as the program disturb incurred during the leakage test can be eliminated by the subsequent erase operation.

Figure 19:
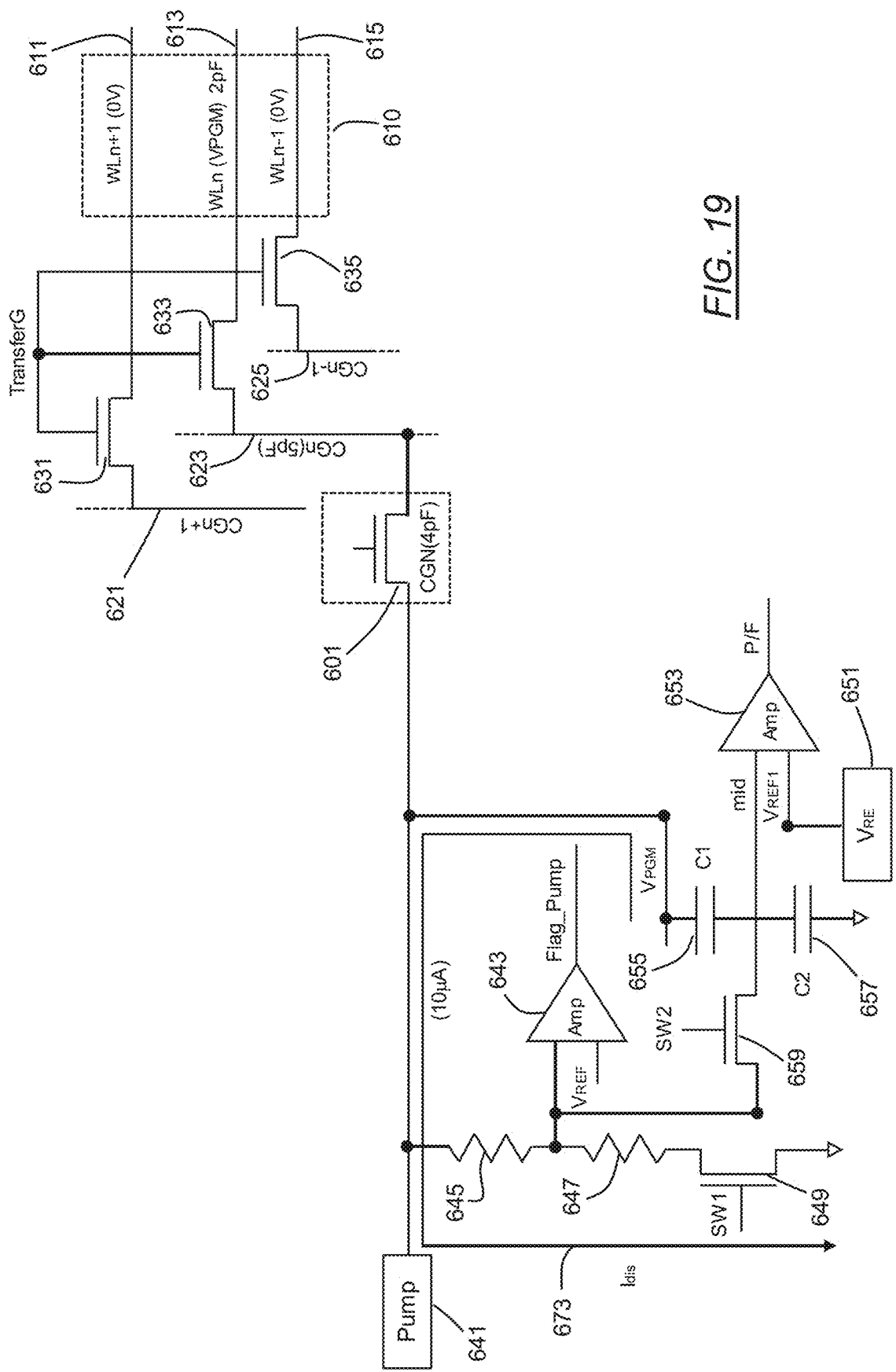
FIG. 19 is a circuit diagram of a leakage detection circuitry, including circuitry for a calibration process in accordance with exemplary embodiments.

Referring now to FIG. 19, there is depicted an exemplary embodiment of the word line leakage detection circuit of FIG. 17 and on-chip calibration circuitry as incorporated into the memory circuit of FIG. 15, wherein the resistor voltage divider is used to discharge the high voltage during an exemplary word line leakage detection calibration process (supplied by the current path $I_{dis}$ 673). Accordingly, these elements may be implemented as part of the peripheral circuitry on the memory chip and the path tested during the calibration process should match the path actually used for leakage detection. To effectuate an accurate calibration process, a good block should be used to determine the characteristics of a block that is without any word line leakage. A good block may be identified by its program characteristics or from a previously conducted good block check. For example, data corresponding to the highest program state can be programmed and read back to see if it is correct. When the calibration is done on a fresh memory die, a word line leakage is likely to not have manifested itself and therefore locating a good block is relatively easy at this point in time.

Figure 20:
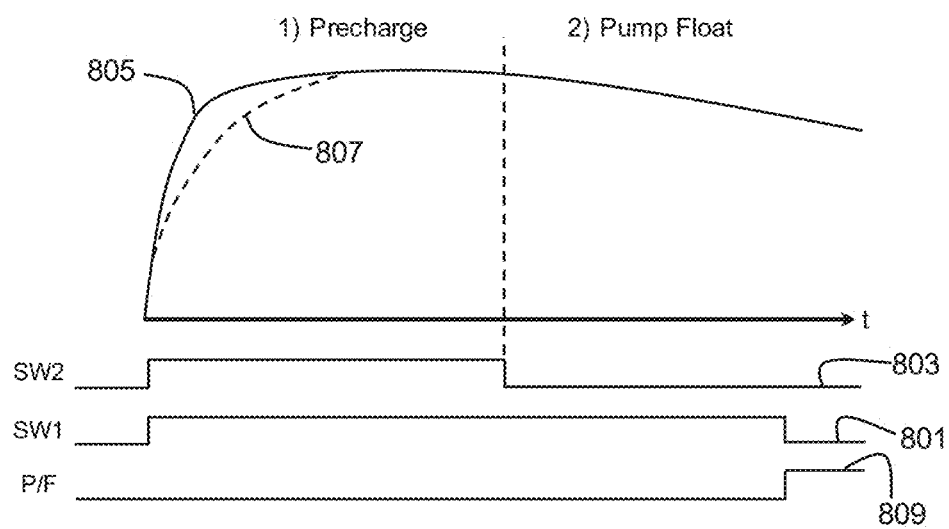
FIG. 20 illustrates the phases of a calibration of the leakage detection process, in accordance with exemplary embodiments.

An exemplary calibration process performed with the circuitry in FIG. 19 may be similarly conducted in three stages, which are shown in the diagram in FIG. 20. In the precharge phase, the word lines of a test block are precharged to the target voltage level by turning on the high voltage pump 641, the CGN voltage selection circuits and the row decoder of the selected block. As discussed above, the high voltage is regulated by the resistor voltage divider and the comparator to enable the pump clock. Both of switches SW1 and SW2 (see 801 and 803) are in an ON state and the word lines are brought to a charged state as depicted at 805 and 807 in FIG. 20. However, in contrast to the discharge stage of the word line leakage detection process illustrated in FIG. 18, the resistor voltage divider in this calibration process is kept on with the switch SW1=Vdd. In addition, the pump 641 is disabled and left floating, wherein SW2=0 to isolate the mid node from the resistor divider. Accordingly, the high voltage $V_{PGM}$ will be discharged through the resistor chain with a fixed leakage current along path 673 of a discharge current $I_{dis}$ on the order of 10 μA. When the P/F output signal 809 of differential amplifier 653 flips after comparing with a selected $V_{REF1}$ value, the P/F signal will, in a feedback manner, turn off the switch SW1. Further, a timer can count the period of time beginning at the start of the discharge phase and until the flip of P/F output from pass to fail as a result of the comparator. Additionally, based on the leakage detection criteria and the ratio of this to the resistor leakage, the timer can be multiplied by a factor of 2 (such as 128) to set the time counter for detecting a targeted leakage current. For example, if the resistor leakage is 10 μA, the timer multiplier 128 will result in a leakage detection current of 78 nA. Although other multiplier factors could be used, factors of two are readily implemented by performing a shift of binary digits to the higher bits. This calibration process only needs to be conducted in one instance for a given voltage topology during a die sort test. The timer digits can then be fixed and stored, for example, in a ROM fuse block. During the power on read, the timer digits will be read out to registers and control the word line leakage test. However, for a different stress topology, a new calibration is necessitated by the change in the parasitic capacitance and, after each new calibration, a corresponding timer parameter can be determined and saved in the ROM flash memory, for example.

Another important factor to be considered with respect to the issue of detecting a word line leakage is the ability to differentiate a leakage current from a background noise current that may be inherently present in the device. For example, even if no word lines are selected, there may be a degree of junction leakage current on the path by which the word lines receive their voltage as it is delivered through one or more junctions that supply the control gate voltages. Referring for example to the memory circuit shown in FIG. 15, even in the case in which every one of the word line select gates (e.g., 631, 633, 635) are turned off, there will still exist some measure of background leakage noise that varies with both process and temperature variations, and can range over a rather large difference of magnitude. Various mechanisms can be used to separate out the background noise in order to isolate any word line leakage. According to some exemplary embodiments, a comparison is made between the current drawn by a plane of the memory when no word lines are selected and the current drawn when a set of word lines are selected. This can be achieved using two different planes or by the same plane, whereby one of the values (such as the reference value with none of the word lines selected) is measured and recorded and then compared to the other value. Once the background noise is determined, the leakage detection process according to suitable embodiments such as those that are described above, may proceed as normal.

Figure 21:
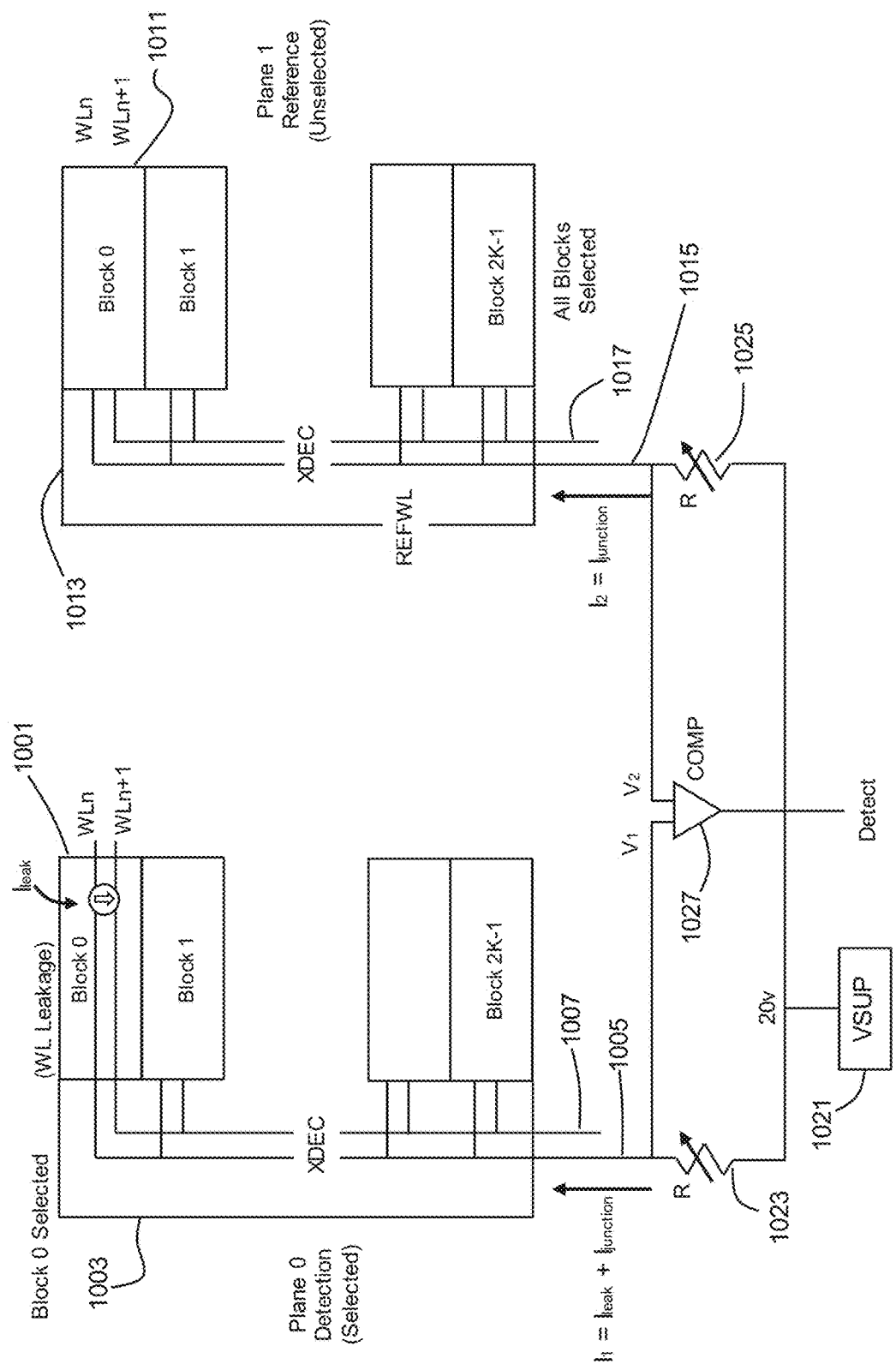
FIG. 21 is a schematic illustration of a configuration for determining a leakage using a current-based comparison approach with respect to two different memory arrays, in accordance with exemplary embodiments.

The concept of using a current comparison for determining the background noise is depicted in FIG. 21, according to one example. In this example, two different arrays are used, wherein one is unselected and one has an erase block selected for testing. The two currents are generated at the same time and compared directly. More specifically, a voltage level (e.g., 20 V) is generated by the supply VSUP 1021 and supplied through respective resistances 1023, 1025 to the word line decoding circuitry of a pair of planes (semi-autonomous memory arrays), Plane 0 (1001) and Plane 1 (1011). Each plane may be of the same design—e.g., each having 2K erase blocks having respective word line decoding circuitry, including word line selection switches, XDEC of 1003 and 1013. Accordingly, as shown in FIG. 21, Block 0 of Plane 0 is selected for leakage testing and, as such, the selection circuitry applies a voltage pattern to Block 0's word lines. For example, a stripe pattern could be applied with the high voltage line (e.g., from line 1005) to every other word line and the non-selected word lines may be left to float or taken to ground by line 1007. Therefore, using this configuration, it is possible to detect the leakage between the word lines and also between the (high) word lines and the substrate.

The word lines of the unselected blocks of Plane 0 (1001) and all of the blocks in Plane 1 (1003) are left to float with their word line select switches turned off. Although the entirety of Plane 1 is unselected, all of the same voltages are supplied along lines 1015, 1017 to Plane 1's XDEC circuit 1013. Thus, despite none of the word lines in Plane 1 being selected, a certain amount of current ($I_1=I_{junction}$) is still being drawn due to junction leakage that will serve as a reference value. Whereas, Plane 0 will draw both junction leakage current and any word line leakage current ($I_{leak}$). By determining the voltage difference between node $N_0$ and node $N_1$, the current leakage can be isolated. If the voltage difference, i.e., $\Delta V=(V_1-V_2)=I_1R=I_2R=I_{leak}R$, as compared in COMP 1027, exceeds a threshold value, a "Detect" signal is asserted indicating that a word line leakage is present in Block 0. Accordingly, this signal may initiate a mitigation procedure with respect to the bad block, including mapping the block out or other corrective actions.

Thus, by using a reference plane and current sensing, the word line leakage can be accurately detected and isolated. Any background noise (junction leakage) will be canceled through the comparison since both Plane 0 and Plane 1 see the same amount of junction area. Therefore, due to the differential sensing, there is no reference noise. In addition, the sensing speed is improved due to the use of current sensing and, as described further below, additional reference current can be injected in the reference path for margin testing.

As mentioned above, the configuration of the embodiment in FIG. 21 requires that the memory device have at least two planes and, to be accurate, also needs for the planes to be well-matched such that: (1) the reference and selected planes and word lines are well-matched in loading, (2) the background junction leakage average of the 2K blocks should be at the mean of the distribution, (3) the actual leakage criteria is measurable over the difference in background leakage, (4) and the device and resistors are well-matched. Further, as the current being drawn through the resistor 1023 increases by higher $I_{leak}$ values, this can effect the R value and result in the $I_{junction}$ component not accurately canceling between the planes.

Now described is a next exemplary embodiment that attempts to reduce or effectively overcome these various challenges by utilizing only a single plane of a memory device to isolate the background noise current from any word line leakage current. More specifically, both word line-to-word line leakage and word line-to-substrate leakage can be detected in-field by, for example, determining a reference level, with all the word lines and blocks deselected, and applying a stress mode level done on the same plane by applying voltage levels in a stripe mode on a selected set of word lines, typically from a single erase block, for example. In this specific embodiment, a current mirror scheme is used to facilitate accuracy. Each plane independently uses a current mirror and current sensing to determine the word line leakage current whereby, to determine the leakage, current is sensed two times with respect to a reference current value and word line leakage current, and the values are stored digitally and subsequently compared at the end of the operation. This arrangement reduces the error from current mirror, leakage, and op-amp mismatch.

Figure 22:
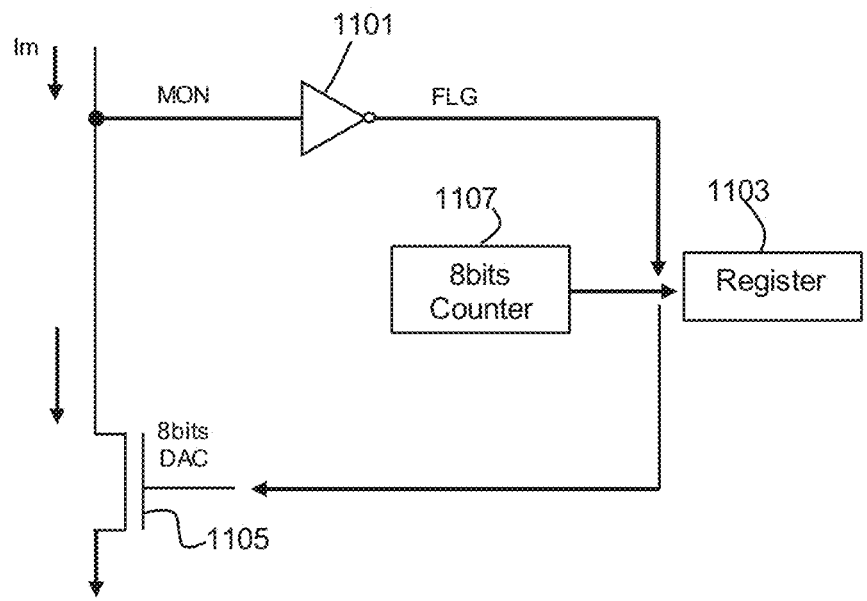
FIG. 22 schematically depicts the basic circuitry operation for detecting a leakage current, in accordance with exemplary embodiments.

The basic operation is illustrated in FIG. 22. As depicted, where used to determine the reference value or for the leakage testing, the current $I_m$ being drawn by the memory array is mirrored and flows down the left side through transistor 1105. Accordingly, the level MON is at a high voltage and FLG, on the other side of the inverter 1101, is low. The gate of the transistor 1105 is controlled by, for example, an 8-bit DAC counter 1107, which starts from the high value (FF in hex) and decrements downward. (Alternatively, the counter could start at the low end and incrementally increase, although the converse can have certain benefits with respect to settling times). The count continues until the MON level is pulled above a trip point of FLG, at which point the counter value is stored into a latch register 1103. Once the reference values are determined, the selected testing pattern is then applied and the process repeated, after which the results are compared to determine if the leakage for the selected set of word lines exceeds the allowed amount. (Alternatively, the reference value determination could be second in the order).

Figure 23:
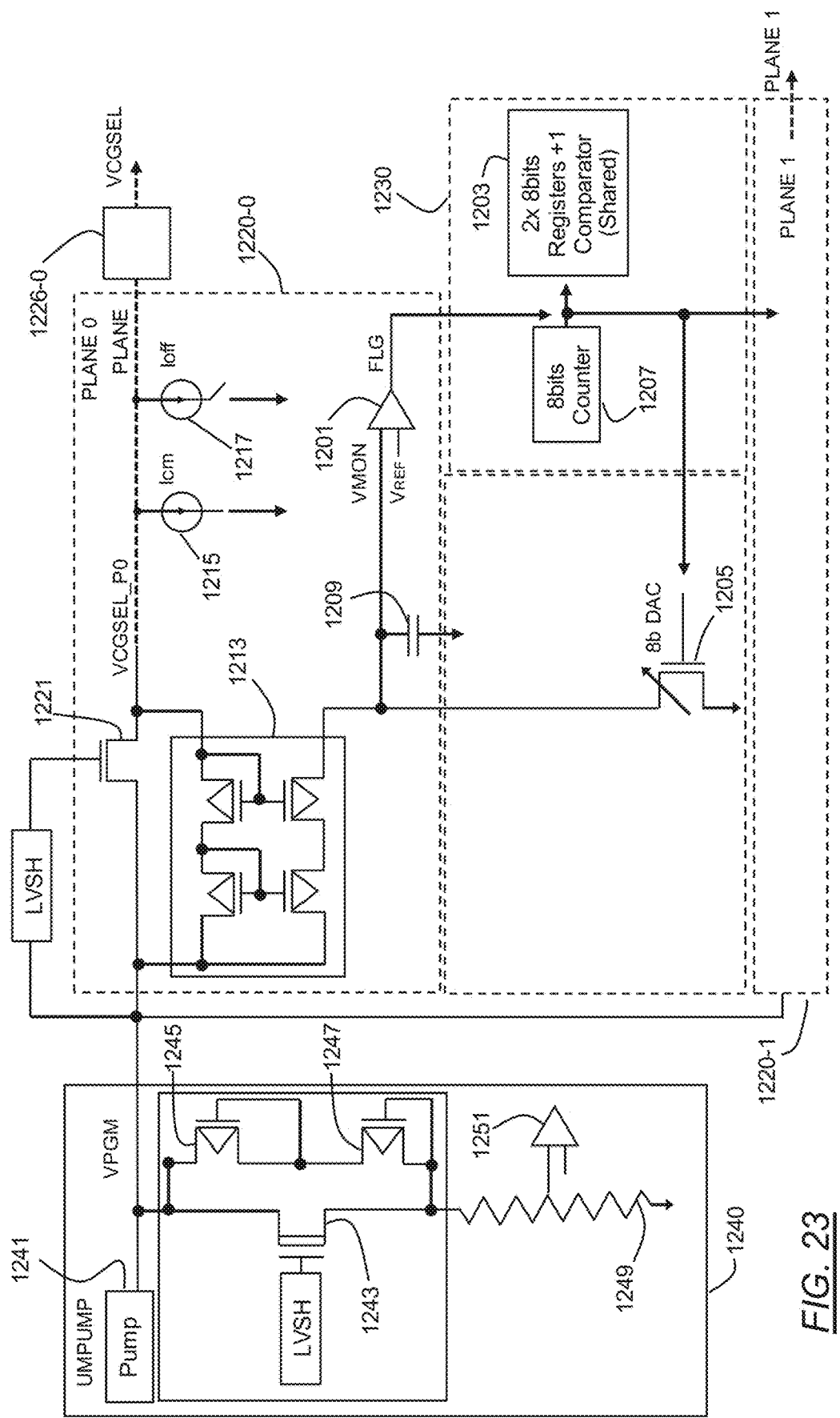
FIG. 23 is a circuit diagram of a leakage detection circuitry that comprises the circuitry elements of FIG. 22 and with added elements that include a current mirror, in accordance with exemplary embodiments.

Referring now to FIG. 23, there is shown an exemplary embodiment of a leakage detection circuit comprising the elements of FIG. 22 with the further incorporation of certain elements used in the leakage determination. These elements are connected between the charge pump circuitry 1240 (which supplies the high voltages used to apply the test voltages) and the decoder circuitry of the memory plane(s) (which applies the supplied voltage to a selected set of word lines). In this particular embodiment, the circuitry is split into a part specific to each plane and, for multi-plane devices, a portion that is shared between multiple planes.

For explanatory purposes, this example uses a two-plane device. The charge pump system (UMPUMP 1240) comprises the high voltage pump 1241 that supplies the high voltage (i.e., programming voltage $V_{PGM}$) used for testing, wherein the voltage is supplied to leakage determination circuitry 1220, 1230. As designated, the portion of the circuitry that is specific to Plane 1 is 1220-0, the portion specific to Plane 1 is 1220-1, and the shared portion is 1230. Circuitry 1220 transfers the high voltage from the charge pump system UMPUMP 1240 to the decoding and word line circuitry VCGSEL 1260-0 (shown only with respect to Plane 0). This is supplied as VCGSEL_P0 and the switch of the high voltage transistor 1211 is used to bypass the detection circuitry for normal operations by passing the voltage $V_{PGM}$ to the gate of 1211 by closing the circuit through the LVSH. Similarly, during normal operations, the high level of the LVSH is, according to this embodiment, also applied to the gate of the high voltage switch of transistor 1243 and the pump system UMPUMP 1240 operates in its typical manner and bypassing 1245 and 1247. Therefore, during testing, both of switches 1211 and 1243 are turned off During testing, the amount of current being drawn by the plane may be determined according to the process described above with respect to the embodiment depicted in FIG. 22. However, rather than using the actual current (which dilutes the measuring process), here the current is mirrored by a current mirror 1213 that, according to this particular embodiment, is formed by two pairs of high voltage PMOSs. As some voltage is dropped across the path of the current mirror 1213 between UMPUMP 1240 and VCGSEL 2260-0, two high voltage PMOSs 1245, 1247 are used to replicate the threshold voltage drop across the current mirror 1213. The mirrored current is then used to detect the leakage (either the reference value or the actual leakage test value) according to the process described with respect to FIG. 22. The transistor 1205, comparator (represented as an inverter 1201), counter 1207, and register 1203 of FIG. 23 correspond to elements 1105, 1101, 1107, and 1103 of FIG. 22, respectively. The comparator 1201 is now also explicitly shown in FIG. 23 to have as its input a reference voltage $V_{REF}$ that could be supplied by, for example, a bandgap circuit. Also incorporated is a capacitor 1209 that smooths out the VMON level. In this embodiment, the elements 1205, 1209, and 1201 are, as designated, specific to block 1220 of each plane. The block 1230, including counter 1207 and resistor/comparator 1203, is shared between blocks. As such, the counter/comparator 1203 has a register for each block (2 by 8-bits in this example) and one comparator that is shared by both planes.

Block 1220 also includes $I_{cm}$ 1215 as a common mode current source to set a minimum current flow through the current mirror 1213 to meet settling/detection time. The offset detection current source $I_{off}$ 1217 is used during the leakage determination process (including determining the reference value) so that a good block is not detected as bad due to noise determination or detection of error. Thus, the offset detection current is used to set a threshold for marking a bad block for this purpose.

Figure 24:
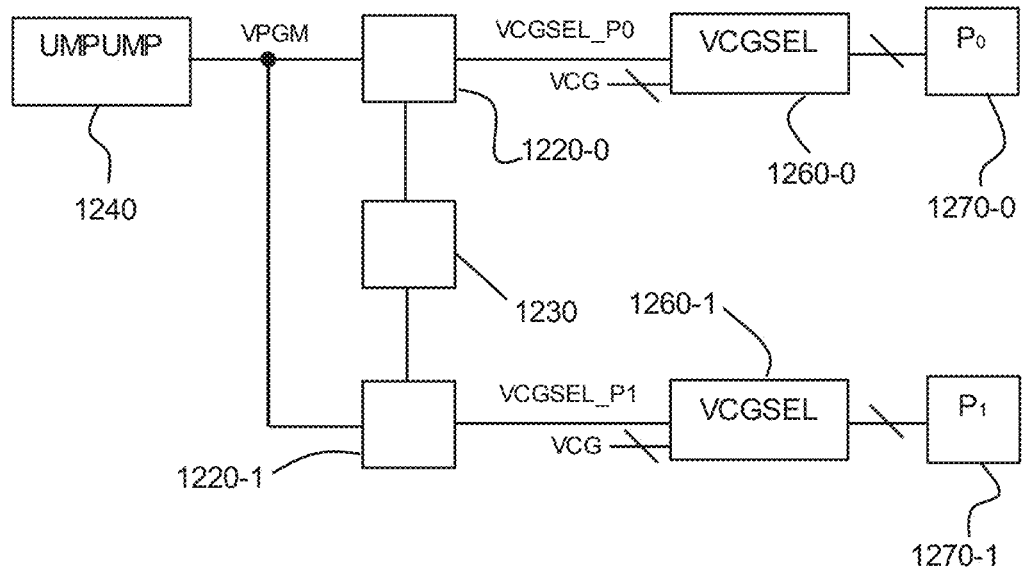
FIG. 24 is a block diagram depicting the relationship of the circuit elements shown in FIG. 23 with respect to two planes, in accordance with exemplary embodiments.

FIG. 24 is a block diagram that schematically illustrates the relationship of the elements of FIG. 23 to the two planes, Plane 0 (1270-0) and Plane 1 (1270-1). Each plane has its own respective word line decoding circuitry VCGSEL 1260-0 and 1260-1 that includes the word line select switches (631, 633, 635 of FIG. 19), as well as any other intervening selection circuitry. In addition to selectively applying the voltage $V_{PMG}$ to word lines, this will apply any other appropriate word line levels for the various memory operations, where these voltages are collectively indicated as VCG. (The other periphery circuitry of the memory circuit is not shown for simplicity purposes). The blocks 1220-0, 1220-1, 1230, and the pump UMPUMP 1240 are then discussed with respect to FIG. 23. In normal programming operations, the blocks 1220-0, 1220-1 are basically bypassed and the same basic paths can be maintained, delivering the VPGM as needed. However, during the word line stress, the additional elements are used.

Figure 25:
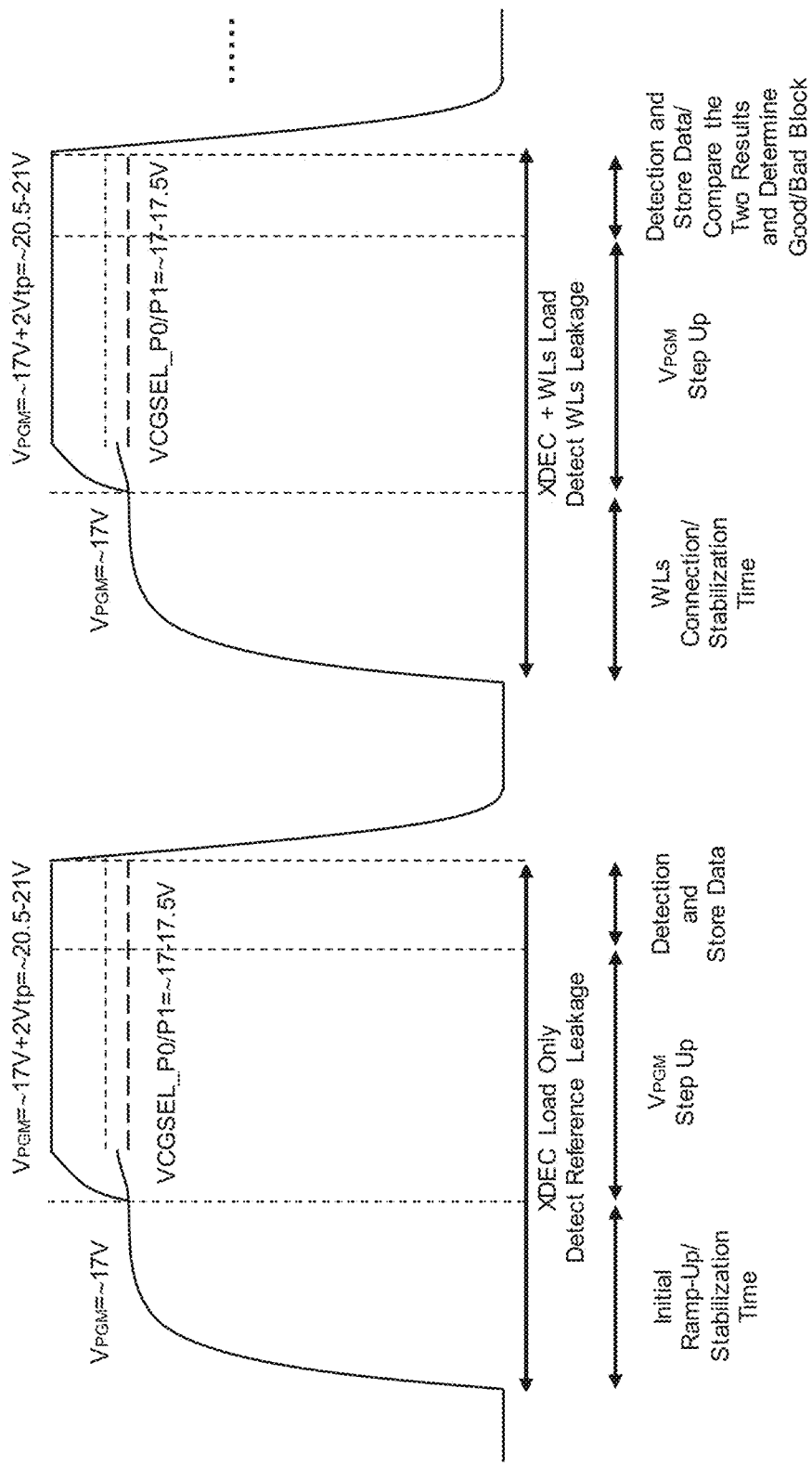
FIG. 25 is a timing diagram with respect to an implementation of a leakage detection operation, depicting both the reference and actual leakage determinations, in accordance with exemplary embodiments.

In FIG. 25, there is shown a timing diagram of an exemplary implementation of the leakage determination process as described with respect to FIGS. 22-24. In this implementation, the reference value for an array is acquired first. However, as mentioned above, the order could be switched. Accordingly, in a first sub-operation (left side of the diagram), only the load from the word line decoding and selection circuitry (or XDEC) is driven to determine the reference leakage. Beginning with an initial ramp-up and stabilization time, the current mirror circuits (1213, 1245, 1247) are bypassed. In addition, the $V_{PGM}$ value is taken to be around 17V and the duration of this beginning phase may be, for example, approximately 50 μs, to give concrete values. In the next phase, the $V_{PGM}$ voltage is stepped up in order to compensate for the voltage drop across the current mirror by replicating the threshold voltages along the path, wherein the LVSH switches are disabled and the current mirror circuits are enabled. During this stage, the $V_{PGM}$ voltage increases to, for example, 17V+2 Vtp=~20.5–21V, wherein Vtp is the threshold voltage of the PMOS devices in the path. As a result, the VCGSEL voltage on the other side of the transistors, remains at around the initial $V_{PGM}$ voltage of approximately 17-17.5V. In this example, 200 μs is allotted for this beginning phase. Thereafter, the detection and storage sub-phases occur, and the duration thereof is determined by the step time of the counter's (e.g., 1207) time step. Once the reference value is determined, the $V_{PGM}$ voltage can be driven low and the leakage determination phase (right side of the diagram) can begin. As such, to detect the word line leakage, the load includes a selected set of word lines as well as the decoding circuitry. The first two sub-phases (i.e., initial ramp up/stabilization and $V_{PGM}$ step up) are largely identical in process to these sub-phases in the reference level acquisition process with the exception of the change in load. Further, the last sub-phase (i.e., detection and storage of the value) of the leakage detection process is similar thereto with the exception that it now includes a comparison step of the two results in order to determine whether the selected set of word lines contains a leakage. Further, if any additional checks are to be done at this time (for example, by switching the word line selection pattern), they can be executed using the same reference value.

Figure 26:
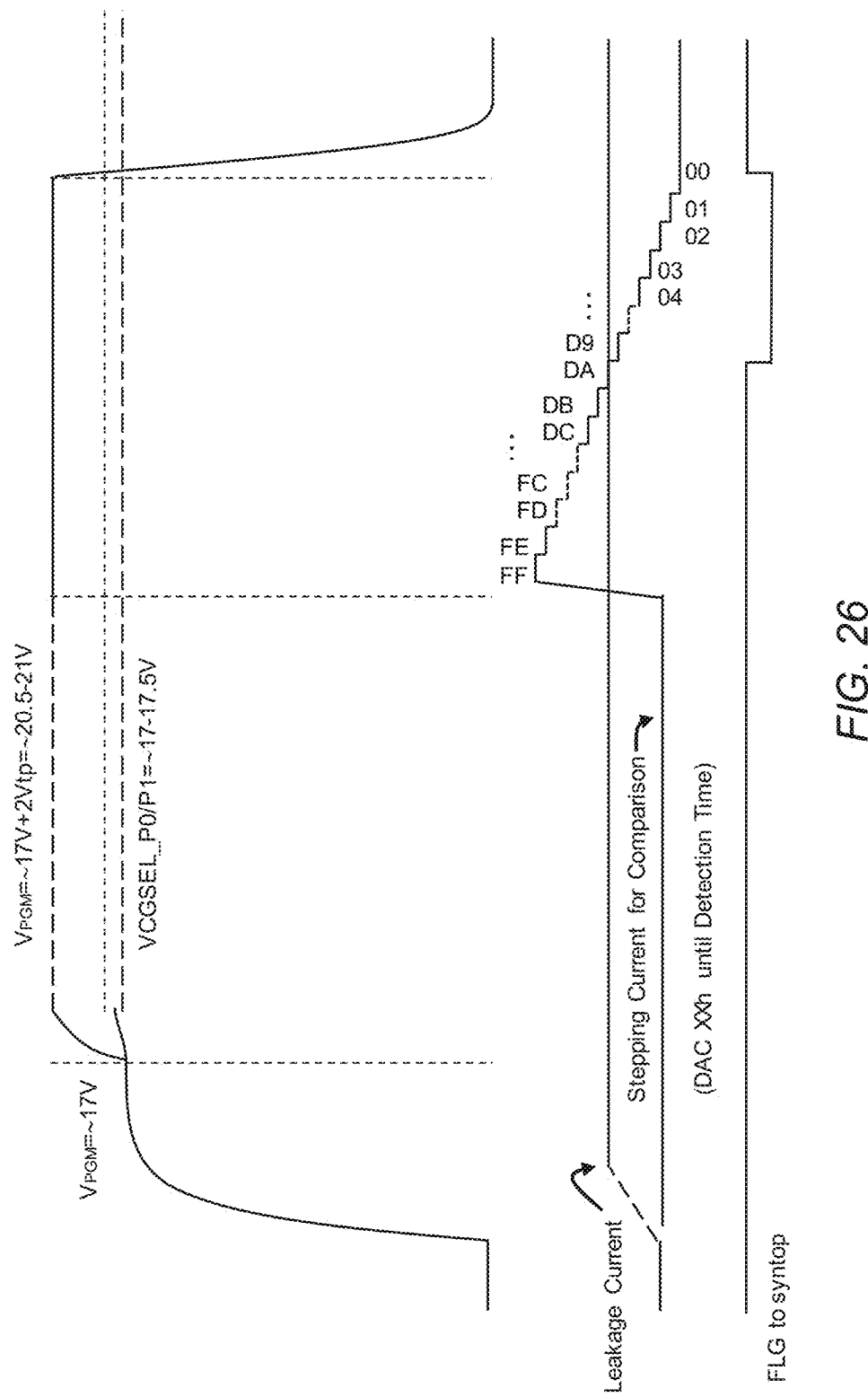
FIG. 26 is an expanded diagram of a section of the waveform in FIG. 25, to show in greater detail leakage current determination elements, in accordance with exemplary embodiments.

The waveform depicted in FIG. 26 is a repetition of the timing waveform in FIG. 25 of either the reference leakage or the word line leakage determination with the addition of a superimposed diagram of the leakage current from the array with the stepping current as determined by the counter 1207, and the FLG signal from the comparator 1201. As the $V_{PGM}$ voltage is increased during the ramp-up and stabilization phase, the draw of any leakage current begins and the $V_{PGM}$ voltage is then stepped up. Next, in the detection phase, the stepping current begins counting. As mentioned above, according to this particular embodiment, the count will start high and then decrement as potentially providing a more suitable $V_{PGM}$ settling time and accuracy through the detection range. At the point in which the stepping current falls below the leakage current, FLG goes low and the data value is latched in the register. Once the reference (REF) and leakage detection (DET) values are latched, the two values can be compared. If the result of the comparison is that the DET value is greater than the REF value, the block (or other selected set) is marked as bad. Conversely, if the DET value is less than the REF value, the block is marked as good.

It should be noted that FIG. 26 illustrates a "normal" case in which the leakage current is within the range of the stepping current. The logic also preferably handles the cases in which the leakage exceeds the stepping current range and also when the level of leakage current is very small. In such cases, when the reference leakage determination is high, the result is marked as good; however, for a leakage determination, the block is marked as bad. Further, the case in which the leakage current is less than the stepping current for the reference leakage determination may be avoided as the common mode current, offset current, or both can be adjusted to set the REF value to lie in the stepping range. With respect to the leakage determination value, the block (or selected set of word lines) is marked as good if the leakage (DET) value is below the stepping range.

Figure 27:
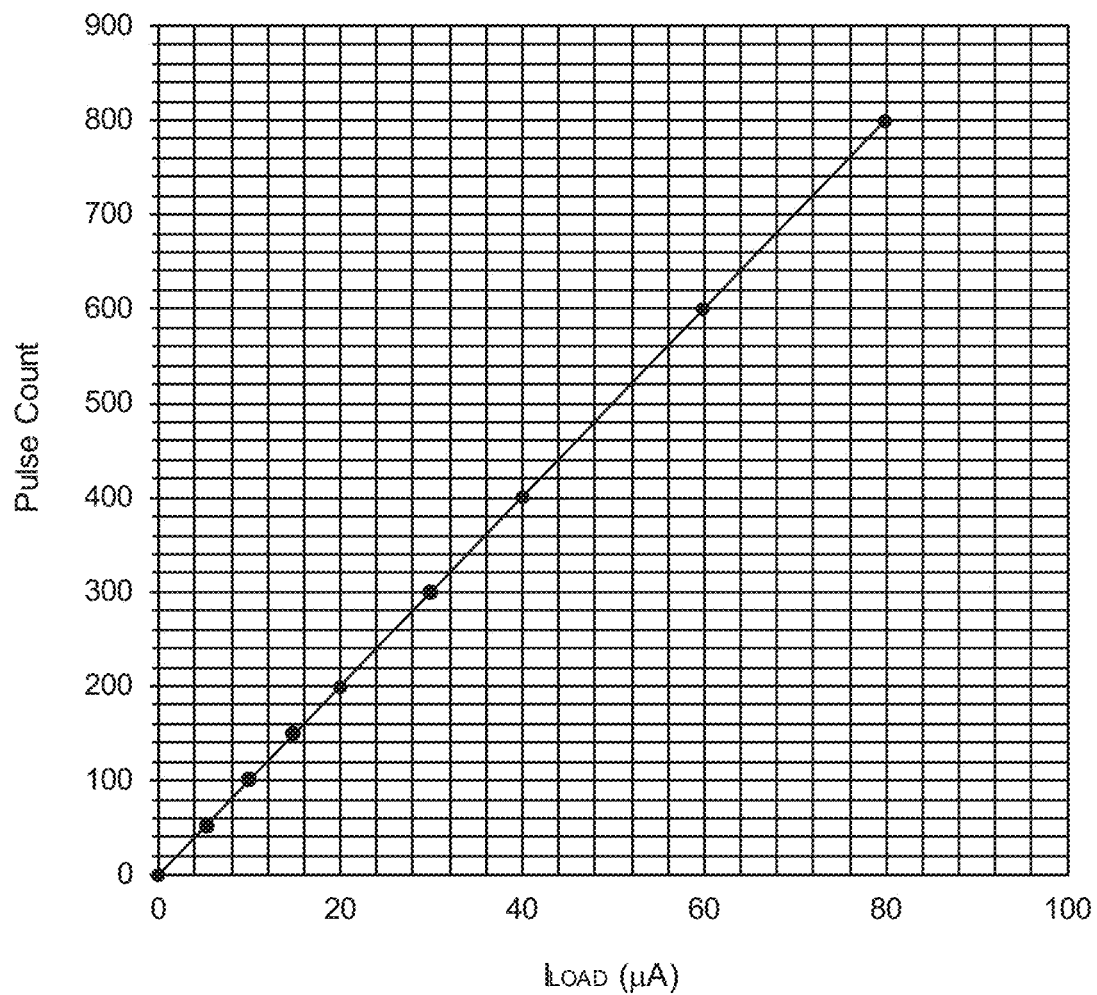
FIG. 27 is a plot diagram of the load versus pulse count with respect to a charge pump system that is driving a load under regulation with a fixed time duration, in accordance with exemplary embodiments.

Further techniques for determining a word line leakage involve observing the charge pump system's behavior while driving the word line under regulation. Thus, such techniques are more broadly applicable for determining load current or leakage current from other circuit elements that are under a charge pump output bias and, even more generally, for determining the magnitude of current values supplied from the output of a charge pump. To further explain the basis for these techniques, an informative plot diagram is provided in FIG. 27. When a charge pump is driving a load in regulation, such that $I_{output}=I_{load}$, the relationship between the pump load (or leakage current) and the pump clock signals used by the pump to maintain regulation may be derived as follows:

$$I_{output}(\text{pump})=C*V*f, \quad \text{(Equation \#2)}$$

where C is the pump coupling capacitance per stage, V is the clock amplitude driving the capacitance C, and f is the frequency of the pump clock to maintain the output load of the pump $I_{load}$, wherein both C and V are, for example, fixed values for a pump design, and with the frequency varying linearly as the load changes. Within a set time T, the number of pump clocks that occur will have a linear relationship with $I_{load}$. Accordingly, as applied and shown by the device in FIG. 27, there is a highly linear relationship of 100 pulses/10 μA within 50 μs. This behavior allows for accurately determining even very low current levels based on counting the number of clocks. This technique of pulse counting for a charge pump within a fixed duration incorporates oversampling ADC techniques. Rather than directly comparing the load (leakage) current with a reference current by use of an analog comparator, the pulse counting approach incorporates many counts over the integration time, and the sampling noise (or the background noise) is, as a result, beneficially lowered by accumulating and averaging the results over many pulse counts. If the counting was conducted with only a few pulses, the resulting error could be large due to noise. However, by counting many pulses, the randomness of noise is averaged out over the integration period. Therefore, the noise floor of the current sensing error is reduced through this oversampling technique. Further, due to the fact that the charge pump is already driving the circuit element connected as the load, the leakage detection can be performed in the background while the memory operation(s) are ongoing, without the need for a separately dedicated leakage detection operation. Thus, this approach improves the accuracy and speed of leakage detection, and reduces the complexity of the chip design. At focus in the following description is the circumstance in which a charge pump system is driving a word line on a flash memory array and is used to determine the presence of a word line leakage. However, because this approach is based on the number of clocks in an interval, it can also be applied to negative voltage charge pumps as well as the more typical positive voltage case. Further, in addition to detecting any word line-based leakage (or originating from other elements of a non-volatile memory circuit), this approach could also be used to detect background leakage with respect to DRAM devices, for example.

Figure 28:
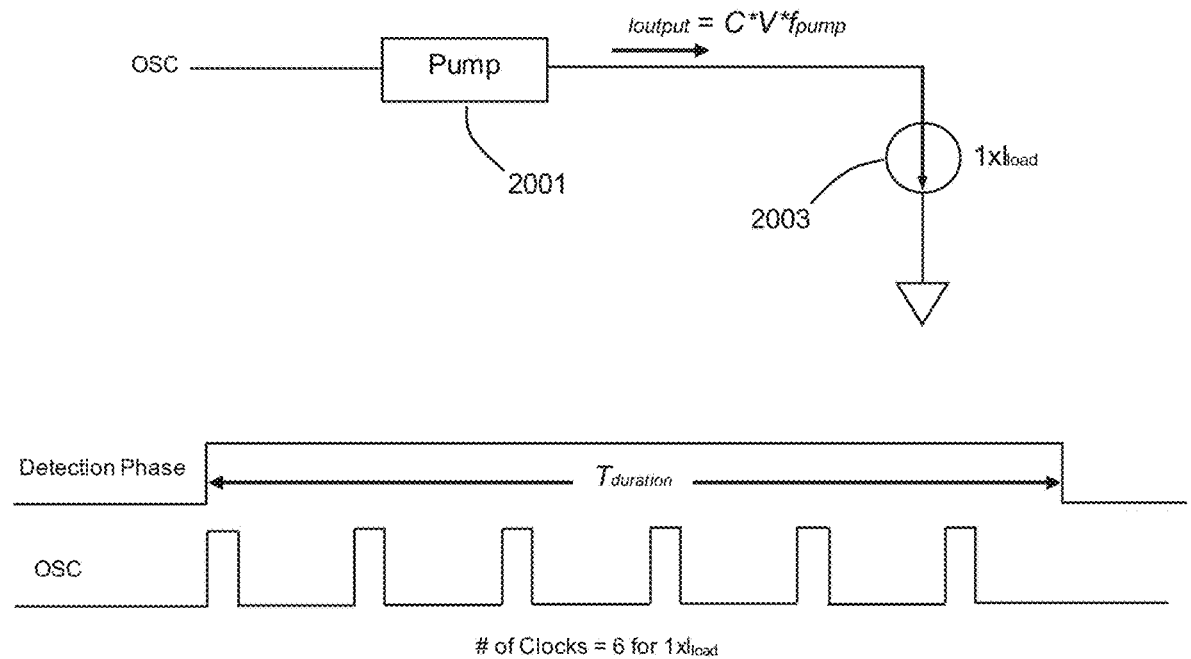
FIG. 28 schematically depicts a charge pump system driving a load, in accordance with exemplary embodiments.
Figure 29:
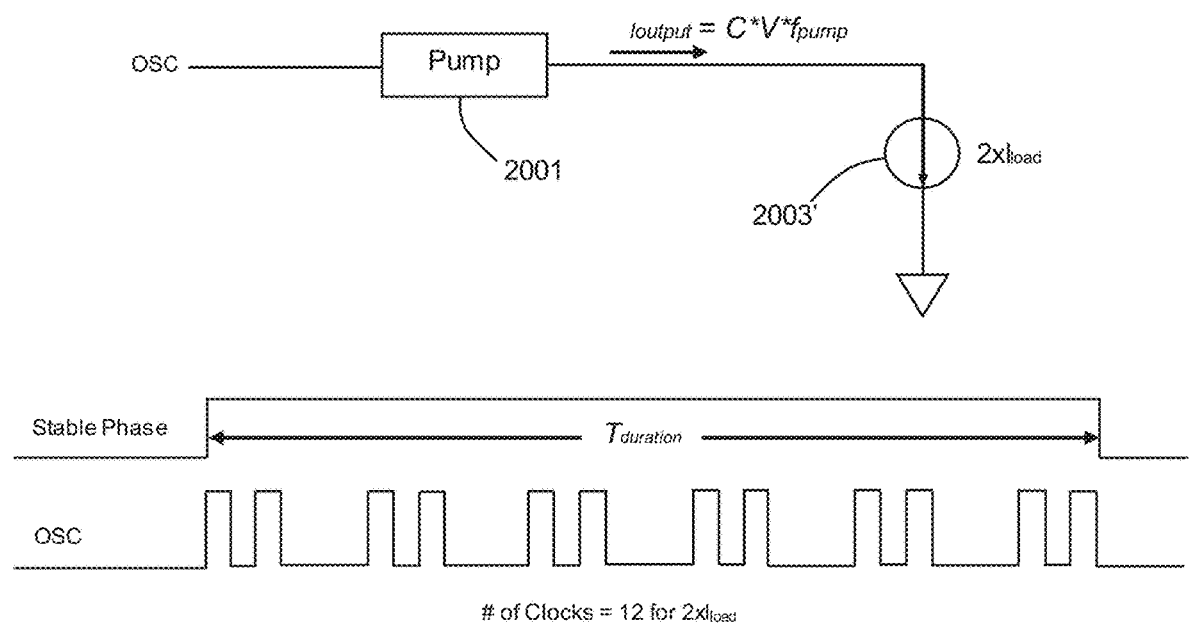
FIG. 29 schematically depicts a charge pump system driving twice the load of that in FIG. 28, in accordance with exemplary embodiments.

FIGS. 28 and 29 further illustrate the general principle as applied to a system in which the charge pump is driving a current load, $I_{load}$ (FIG. 28), and a load of twice $I_{load}$ (FIG. 29). With respect to FIG. 28, the pump 2001 receives an oscillator signal (OSC) from the regulation circuitry (not shown) that is based on the output level. Continuing forward, the pump 2001 generates an output current, $I_{output}$, that drives the load 2003 at Load. While operating under regulation, the number of clock pumps is counted over a time, $T_{duration}$, while a control signal Detection Phase is high. In this particular embodiment, the number of clocks is six. FIG. 29 depicts the identical case with the exception of the load 2001' now drawing twice the current (i.e., $2\times I_{load}$), and 12 clocks are counted during the $T_{duration}$ interval. This count is then compared to a reference, which could come from a calibration process or driving other components, to determine the amount of current and if there is a word line leakage.

Figure 30:
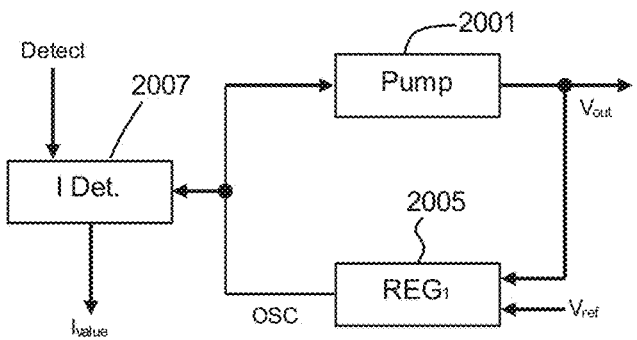
FIG. 30 is a block diagram depicting a charge pump system comprising a current level detection block, in accordance with exemplary embodiments.

To illustrate the circuitry of an exemplary implementation of this approach, FIG. 30 provides a block diagram. Accordingly, the output ($V_{out}$) of the pump 2001 is fed back to the regulation circuitry 2005 where it is compared to a reference value and, dependent upon the comparison, the signal OSC is varied in order to maintain the output in regulation. Further, the OSC signal is sent to current detection block 2007 in which the number of clocks is counted for $T_{duration}$ in response to a control signal "Detect." In this particular example, the control signal "Detect" is depicted as an input to block 2007, but may be determined internally in alternative embodiments. Thereafter, current detection block 2007 outputs the result, $I_{value}$, which can be presented in different ways according to various embodiments. If determining the presence of leakage, the output may indicate whether or not the count exceeds the reference value. In other cases, the output could be the count itself, which may then be converted into a current value elsewhere or by block 2007. Consequently, there is a simple relationship between leakage (or more generally the load current) and the number of pump clocks, which provides for an accurate current determination. Although higher order corrections could be introduced, they are not necessitated in most applications due to this high degree of linearity. As the number of clocks over the interval provides an accurate determination, additional circuitry in the current path for measuring current is not needed. In most memory operations, just by accumulating the total number of pump clocks during a given detection phase, and comparing this with a criterion (pre-defined or pre-calibrated), the system can determine whether leakage is occurring or, more generally, the amount of load current being drawn. Accordingly, this comparison provides a straightforward indication that, for example, a word line leakage is causing an extra load current for the pump. Therefore, in referring back to FIGS. 23 and 24, this approach eliminates the elements of blocks 1220 and 1230, and the pump element 1240 can be a standard pump system with the addition of current detection elements based upon the count.

Figure 31:
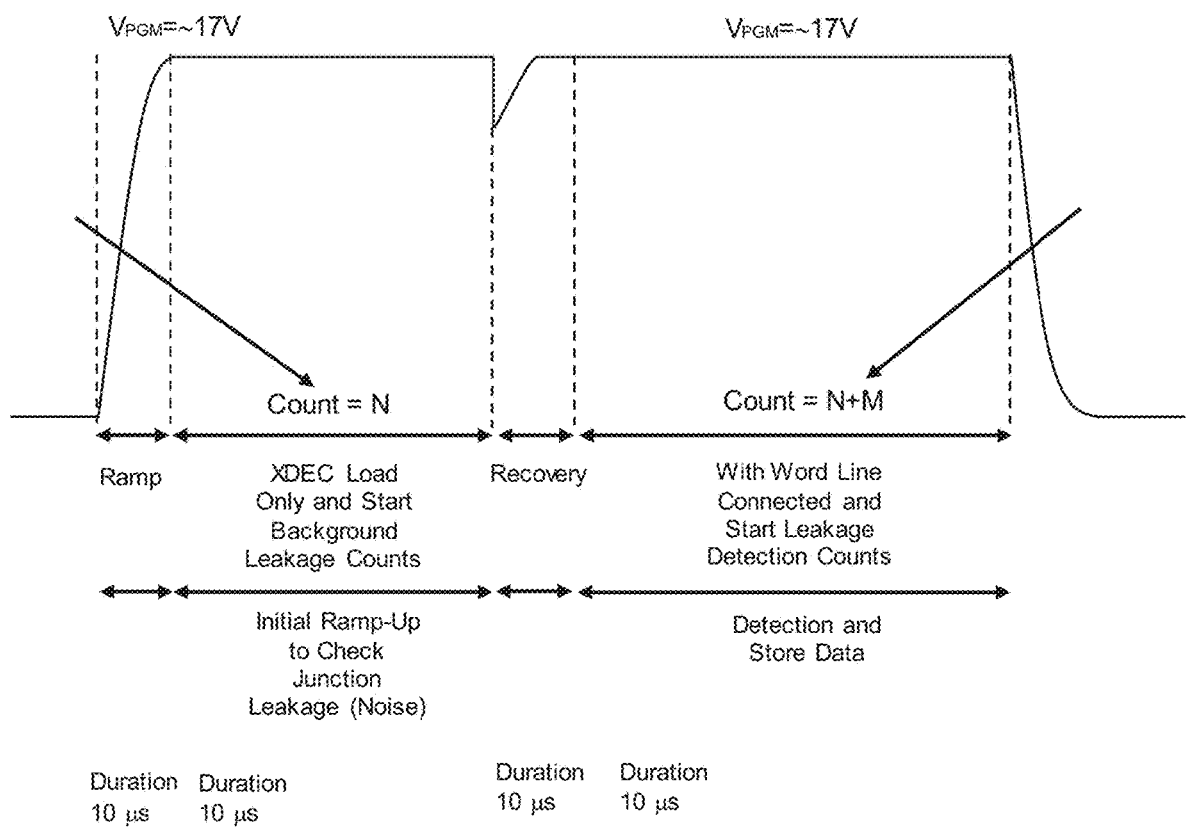
FIG. 31 is a timing diagram with respect to a pump-based current determination approach, in accordance with exemplary embodiments.

In similarity to the information provided in the timing diagram of FIG. 25, FIG. 31 illustrates a leakage determination process as implemented according to the exemplary approach discussed with respect to FIGS. 28-30. In the initial ramp phase, the pump is driven to output a voltage $V_{PGM}$ that is, for example, approximately 17V. It is important to note that unlike the implementation in FIG. 25, the voltage level does not need to be pumped to the higher level but rather, need only be at the level that is actually used in the operation. Without a word line load attached, the system begins to detect any background noise (i.e., due to, for example, junction leakage and other current being drawn despite that the subject component to be tested/measured has not yet connected as a load). Once under regulation, the system acquires the pump clock counts, "N." Once out of an intermediate recovery phase and now with a selected word line connected, the system begins to check for the noise leakage in addition to any word line leakage current. Accordingly, during the measurement window (e.g., 10 µs), the system acquires pump clock counts, "N+M," that can then be compared to a reference value to determine if word line leakage is present. For example, the system can acquire the pulse counts "M" and then subtract, for instance, two counts, and compare the result with a pre-defined criterion to determine the presence of word line leakage. In this particular example, the duration of each of the different phases is 10 µs. However, other values can be used.

This clock counting approach is faster in comparison to the current mirror approach described in reference to FIGS. 22-25 as it does not require stepping up the $V_{PGM}$ value to the higher level before the detection interval. Also as mentioned above, this process can be done on the fly during regular operation. Further included in its advantages is its lower susceptibility to noise due to the absence of additional circuitry elements (such as the current mirror 1213 in the embodiment of FIG. 23). In addition, as a longer integration time can be used to determine the count in the process depicted in FIG. 31 relative to the detection time of the process in FIG. 25, other noise (such as from word line-to-word line coupling) is smoothed out due to an effective oversampling technique for a DAC encoding of the load's current.

In applying "Equation #2" (set forth above) to the embodiment of FIG. 30, the pump is given by $I_{output}=C*V*f$, in which C is the pump coupling capacitance per stage, V is the clock amplitude driving the capacitance C, and f is the frequency of the pump clock for the output load of the pump, $I_{load}$, in regulation. Thus, to determine the current being drawn by the load, the number of clocks of a time period is counted. For example, in the embodiment of FIG. 28, six clocks are counted over the interval of $T_{duration}$. As the smallest variation that can be determined is a difference of a count, the smallest change from the base line calibration value that can be established is 1/6 calibration value. Therefore, this can be made more accurate by designing the pump system to have a high number of clocks during the detection phase by having a lower capacitance (C) value, V (clock amplitude) value, or both.

Directing attention now to additional embodiments for improving the accuracy of the charge pump based current determination approach, different current determinations may be performed at different voltage levels, for example. To be more specific, when testing for word line-to-word line leakage, a high voltage can be used as these structures are designed to support programming-level voltages. However, when testing for leakage of a word line with respect to, for example, a local interconnect, such structures may not be able to support such high voltage differences. Thus, it is useful to be able to accurately detect the amount of current being drawn for a wide range of applied voltages. As a charge pump will have different levels of efficiency when operated to supply different output voltages, the accuracy of the current determination (or the time needed to make a sufficiently accurate determination) will vary based on the voltage. Accordingly, the following discussion describes exemplary mechanisms for performing the leakage determination with higher accuracy and/or performance across a wide range of drive voltages, wherein these mechanisms are not only applicable to the issue of detecting word line leakage, but can be more generally applied to other control or bias lines of a memory array (e.g., bit lines and select lines), as well as other circuit components, in a leakage test or a more basic determination of the current drawn.

Figure 32:
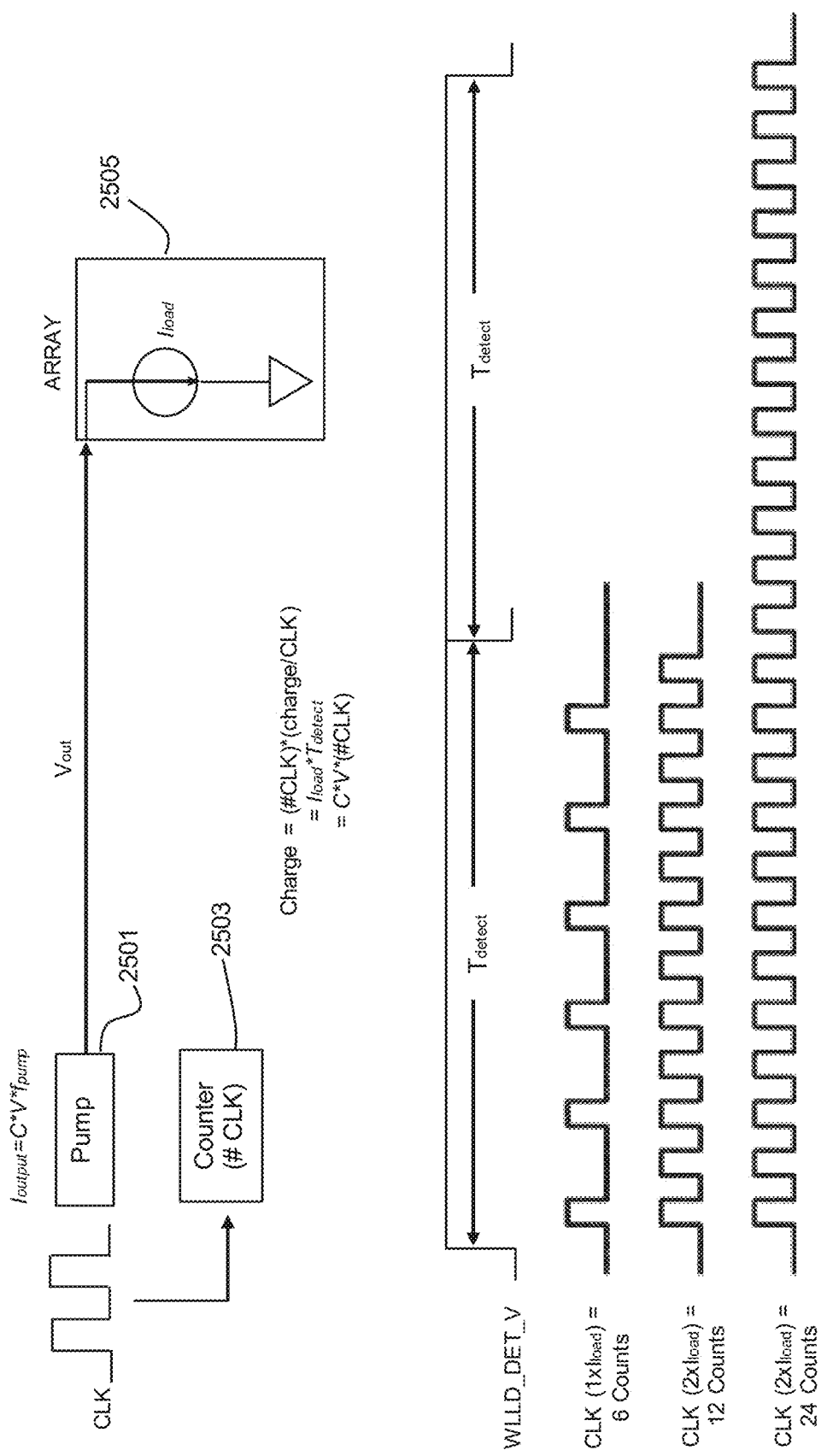
FIG. 32 examines a charge pump and certain corresponding waveforms when driving a load at a current level and twice that current level, in accordance with exemplary embodiments.

Referring now to FIG. 32, there is depicted an exemplary arrangement of a pump 2501 which, under regulation, generates a $V_{out}$ to drive a load on an array 2505 that draws a current, $I_{load}$. Again, the current out of the pump, $I_{output}$, is governed by "Equation #2" set forth above. A counter 2503 counts the number of clocks (#CLK) of the pump clock during a detection period, $T_{detect}$. Further, the corresponding amount of charge is the number of clock cycles (#CLK) multiplied by the amount of charge per cycle, which is equal to $I_{load}*T_{detect}$ or $C*V_{out}*(\#CLK)$. Therefore, according to this configuration, the current leakage from the array or, more generally, the current drawn by the load, is translated to the pump count (#CLK), or the number of on/off cycles of the clock. As such, the count is directly proportional to the leakage current, where a longer detection time is realized to achieve a smaller step size, where the step size is the load current divided by the number of cycles during $T_{detect}$ (i.e., step size=leakage current/(#CLK)). This relationship is illustrated in the waveforms appearing in the lower half of FIG. 32, whereby WLLD_DET_V is the enable signal for the current detection operation. As indicated, over a detection period $T_{detect}$ for a reference load level, the number of counts is 6, while for twice this current, the count is 12. Furthermore, if the count is taken over a period of $2*T_{detect}$, the count for twice the reference load current is 24.

Figure 33A:
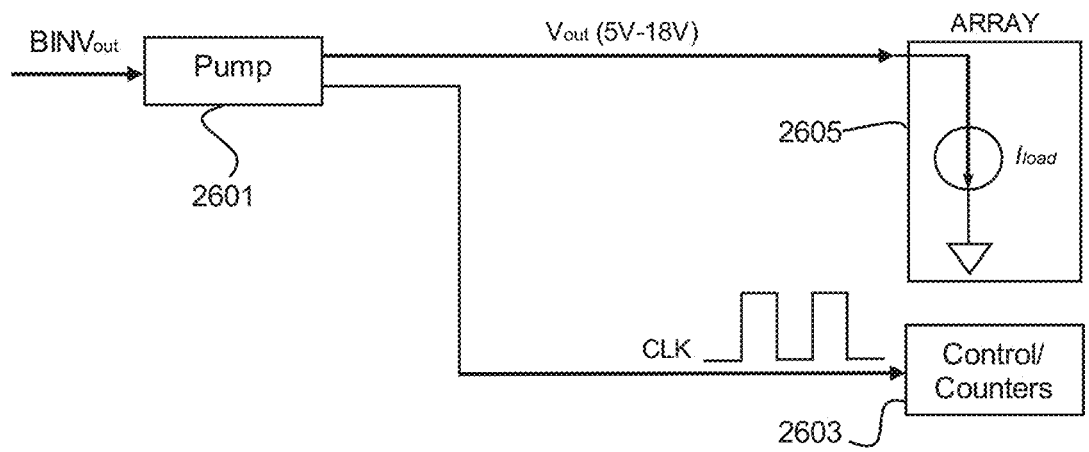
FIG. 33A is a block diagram depicting a charge pump system configured to drive a load at differing output voltages, in accordance with exemplary embodiments.
Figure 33B:
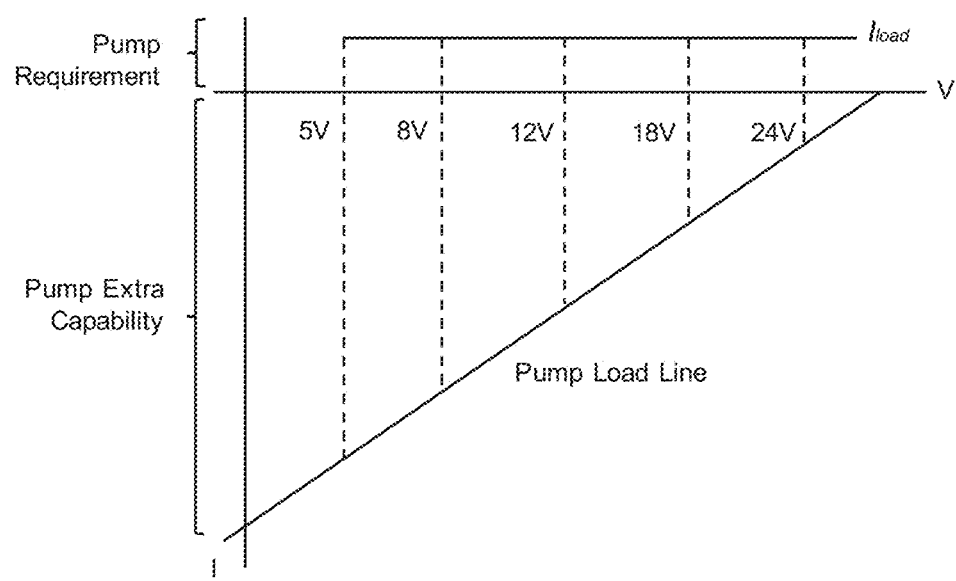
FIG. 33B illustrates a load line with respect to the pump of FIG. 33A.
Figure 34:
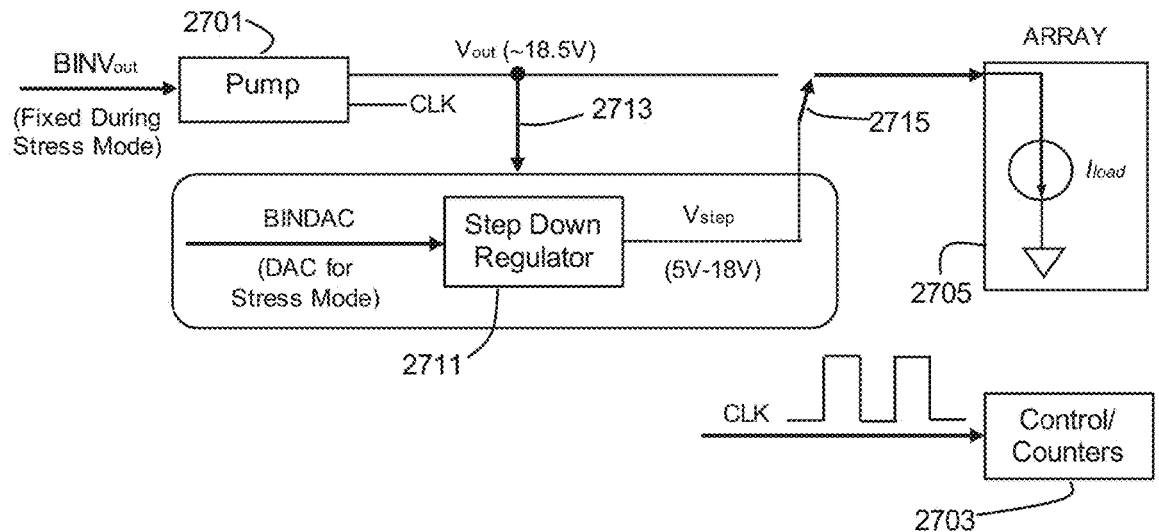
FIG. 34 is a block diagram depicting the incorporation of a step-down regulator for driving a load, in accordance with exemplary embodiments.

Depicted in FIG. 33A is a schematic representation of an arrangement that is similar to that of FIG. 32. Here, a pump 2601, under regulation, drives a word line or other load in array 2605, while the control circuitry and counters 2605 tracks the number of cycles of the clock (#CLK). Also according to this exemplary embodiment, the $V_{out}$ may be regulated based on control input $BINV_{out}$, to change from, for example, 5V to 18V. A charge pump's strength tends to have a large amount of variation depending on the output voltage (i.e., $V_{out}$) level at which it is being regulated. This behavior is illustrated in FIG. 33B, wherein the current requirement of the pump is shown as $I_{load}$, which is level above the I=0 line across the different voltage levels indicated. The pump load line represents the drive capability relative to Load across this voltage range. As shown, extra capability (represented by how far the load line extends below the I=0 axis) at the low end of the $V_{out}$ range is much greater than at the higher end. As a result, fewer pump cycles are needed to supply the same Load at a lower $V_{out}$ and the $V_{out}$ waveform will be "spikier" (that is, having higher or longer ripples) at the lower value, showing fewer pumps of greater charge. Accordingly, in FIG. 34, there is depicted an exemplary embodiment of an arrangement designed to isolate the pump strength variation due to varying $V_{out}$ and to have a uniform step size across the $V_{out}$ range. As shown, an intermediate step-down regulator 2711 is introduced between the pump 2701 and the load at 2705, and the pump 2701 is configured to generate a single fixed voltage (e.g., approximately 18.5V) as a regulated level during detection that is then supplied to the step-down regulator 2711. The clock counter 2703 is still generated from the pump 2701, however, step-down regulator 2711 is used to drive the load at the target stress voltage (such as, for example, $V_{step}$ over a range of 5V-18V), according to a control signal BINDAC. In addition, switches 2713 and 2715 respectively are intended to schematically represent how the step-down regulator 2711 can be connected to use the fixed $V_{out}$ as the supply level to drive the load at levels lower than the fixed $V_{out}$. As the pump is now being operated at the same $V_{out}$ level independently of the $V_{step}$ level applied to the load, the count for a given $I_{load}$ is consistent regardless of the stress voltage being applied.

Figure 35:
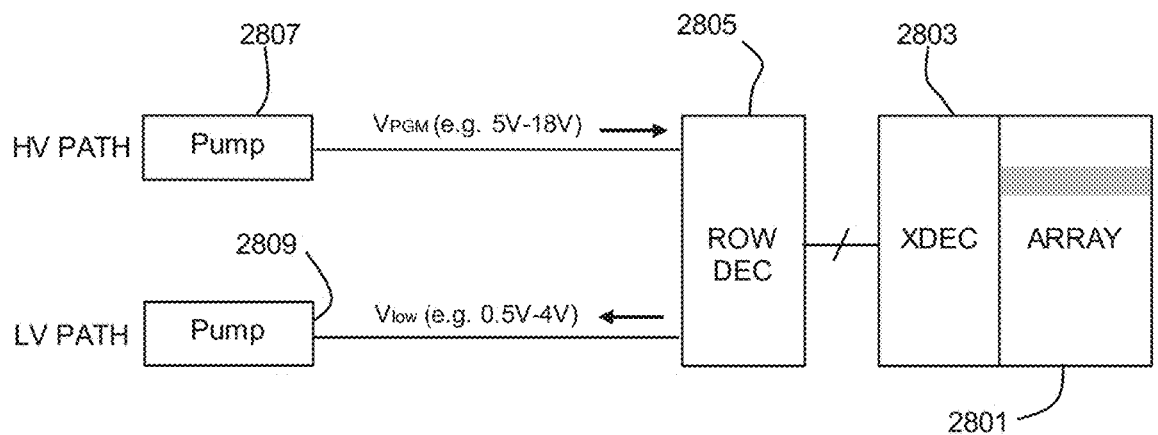
FIG. 35 is a block diagram depicting both high and low voltage paths as applied to a memory array, in accordance with exemplary embodiments.

At focus in the exemplary approaches discussed above for determining the existence of a word line leakage is the inspection of the amount of current that is going into a memory array. However, it is also possible to detect a word line leakage by looking at the amount of current coming out of the memory array, thereby allowing for the use of low voltage biasing for these detection purposes rather than using the higher voltage levels described above. The use of such low voltage biasing can aid in early and highly accurate leakage detections for many leakage sources. With respect to the circumstance of a word line-to-word line leakage, FIG. 35 is a schematic illustration of this current-out approach according to an exemplary embodiment. As depicted, in this example is a memory array 2801 (with a block shaded) and XDEC 2803 representing the associated word line/select gate decoding circuitry. Further, a high voltage $V_{PGM}$ (e.g., 5V-18V) is supplied by a charge pump 2807 and a low voltage $V_{low}$ (e.g., 0.5V-4V) is supplied by a generator 2809. The high and low voltages are supplied to a row a decoder 2805 responsible for decoding the appropriate input voltages to the memory array 2801 and passing them to the XDEC 2803. It should be noted that this arrangement is generally used for the application of bias levels to the memory array 2801 in both normal and leakage detection operations.

In the embodiments described above, a leakage determination is conducted by sensing the current supplied from the high voltage path and determining the current flowing in to the circuit. Here however, a leakage is instead (or additionally) determined by sensing the current sink due to the drop through the $V_{low}$ path. Depending on the leakage mode (i.e., the elements between which the leakage occurs), the use of the low voltage path ($V_{low}$) may provide a high signal-to-noise profile and have a lower degree of background noise.

Referring again to FIG. 35, as discussed above with respect to FIGS. 28-33, leakage can be detected from the high voltage path by keeping track of the frequency used in operating the pump to provide the voltage for the high voltage ($V_{PGM}$) path. Accordingly, based on where the high voltage level is applied and how the array is biased, many different leakage paths can be tested. Similarly, by tracking the frequency of the detector through the low voltage ($V_{low}$) path, any leakage of various leakage modes can be determined. Further depending upon the leakage mode, one or more of the high voltage and low voltage paths may be used. As mentioned above, in some cases, the low voltage path will provide less background noise and an improved signalto-noise profile. However, for some leakage modes, the high voltage and low voltage paths can be used together for a more accurate determination.

Figure 36:
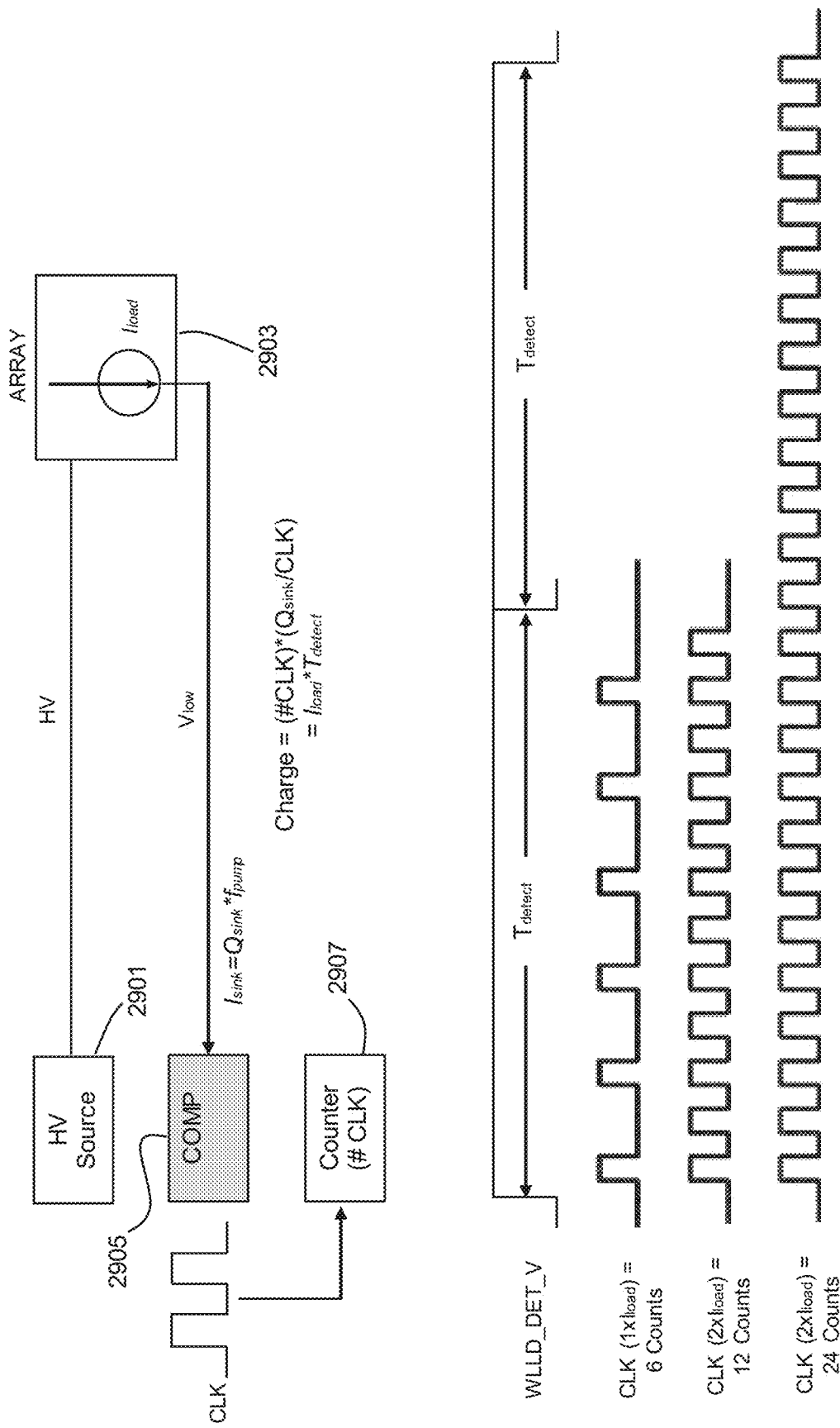
FIG. 36 illustrates some of the concepts of low voltage clock sampling, in accordance with exemplary embodiments.

FIG. 36 depicts an exemplary embodiment of a low voltage counting approach, which may be considered with FIG. 32 for purposes of comparison with the high voltage counting approach. As depicted, a high voltage (relative to the low voltage ($V_{low}$) value) HV is supplied from a high voltage source 2901 to a memory array 2903 or other load drawing a current $I_{load}$. Depending upon the leakage mode being checked, the high voltage level may be as high as 20V or, in the case of a programming or erase voltage, may be as low as 5-8V when constituting, for example, a pass voltage used for non-selected word lines or other memory operations. In some embodiments, the high voltage source 2901 may comprise a high or mid-level charge pump, or may be provided from a voltage regulator from the on-chip supply level (VSUP or Vdd). Accordingly, the current flows out at the low voltage level along the $V_{low}$ path and enters a comparator 2905 that is a part of the regulation circuitry that sets the low voltage level. The regulation circuitry also receives a clock value (CLK) which, based on a comparison of the low voltage level to a reference level, gates the clock signal to set a clocked control signal (LV_CLK) that is supplied to a counter 2907 and used to set $V_{low}$. The count, or DAC value, is directly proportional to any leakage current that is being sunk at the $V_{low}$ node that is connected to the memory array 2903 or other load below $I_{dc}$. Again, as with the high voltage embodiments discussed above, a longer detection time ($T_{detect}$) will result in a smaller step size (recalling that step size=DAC/$I_{load}$). The noise is the actual current leakage from the array. The low voltage path tends to have a faster settling time relative to the high voltage path.

The series of FIGS. 37A-37D illustrate various exemplary circuitry embodiments for regulating the low voltage ($V_{low}$) level and detecting leakage. Beginning with the embodiment of FIG. 37A, there is depicted a comparator 3001 with the $V_{low}$ connection of the array (or other circuit) as a first input and a reference level (VREF) as a second input. Resistors 3015 and 3017 form a voltage divider that sets the input for the comparator 3001 from the $V_{low}$ level. The comparator 3001 produces an output signal, flag value FLG, which is supplied to the block FLG SYNC 3003 along with a clock signal (CLK). Based on the FLG value, the FLG SYNB block 3003 generates the control signal LV_CLK that is supplied to the gate of a transistor 3005 for purposes of regulating the $V_{low}$ voltage level. In addition, a second transistor 3007 can also be placed in series with transistor 3005, the gate of which can be set to a level BIASN to adjust the range of the current being sunk through transistor 3005 to ground. Included is a current source ($I_{pch}$) 3011 to provide a fast charge up current to take the $V_{low}$ node up to near the target voltage for $V_{low}$. Further, the current $I_{reg}$ is the $V_{low}$ regulation current and the current $I_{dc}$ is a DC current source that supplies the regulation current, wherein $I_{dc}$>$I_{reg}$ in order to trigger the $I_{sink}$, which is the current sinking capability when the LV_CLK signal is active. To realize different step counts, $I_{sink}$ can be adjusted by the different biasing conditions (BIASN) of transistor 3007. The CLK count is synchronized based on the FLG level and sent to the logic counter DIG CNT 3009 to provide a leakage value. In addition, it should be noted that, with the exception of the counter 3009, the other circuit elements can be used to regulate the $V_{low}$ voltage during normal operations.

Figure 37A:
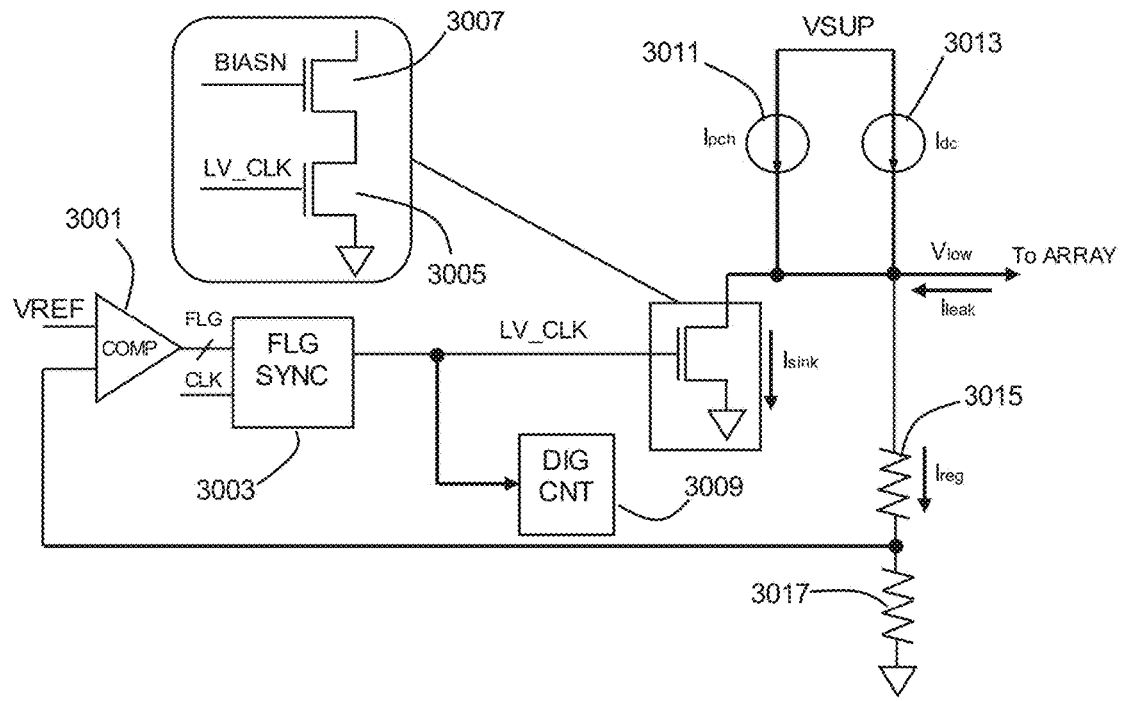
FIGS. 37A-37D illustrate various alternative circuitry configurations for regulating the low voltage ($V_{low}$) and leakage detection, in accordance with exemplary embodiments.
Figure 37B:
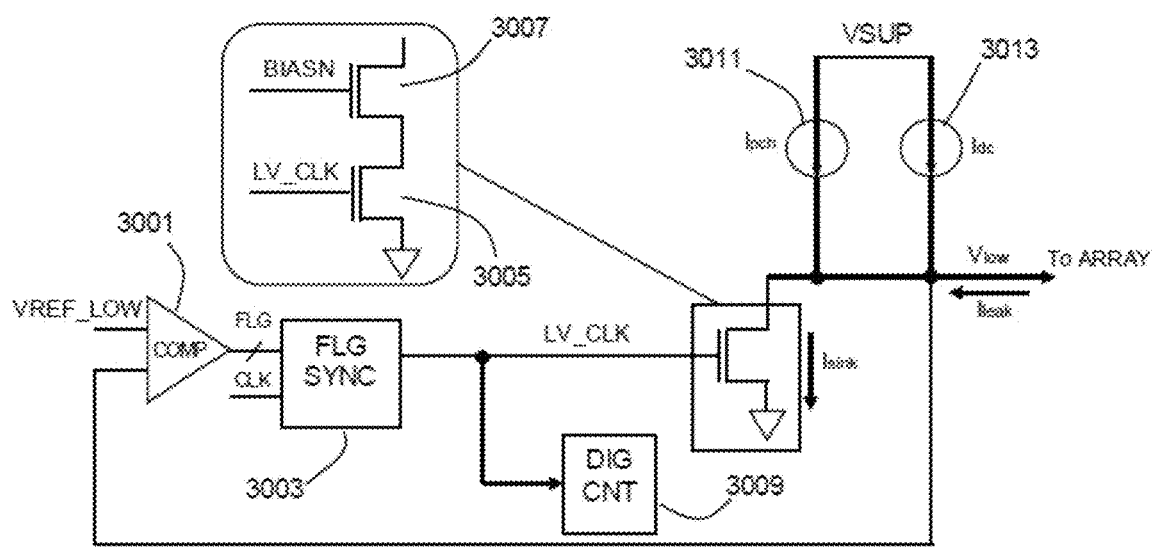

FIG. 37B depicts an alternative exemplary embodiment that is highly similar to the embodiment of FIG. 37A. However, in this example, the first input of the comparator 3001 is connected directly to $V_{low}$ rather than to an intermediate node of the voltage divider formed by resistors 3015, 3017, and the second input is connected to a reference level VREF_LOW to regulate the $V_{low}$ voltage level. Accordingly, whereas $I_{dc}$+$I_{leak}$ is equal to $I_{sink}$+$I_{reg}$ in the embodiment of FIG. 37A, $I_{dc}$+$I_{leak}$ is now equal to $I_{sink}$ in the embodiment of FIG. 37B. Hence, the frequency of LV_CLK for $I_{sink}$ is directly proportional to leakage current from the memory array.

Figure 38:
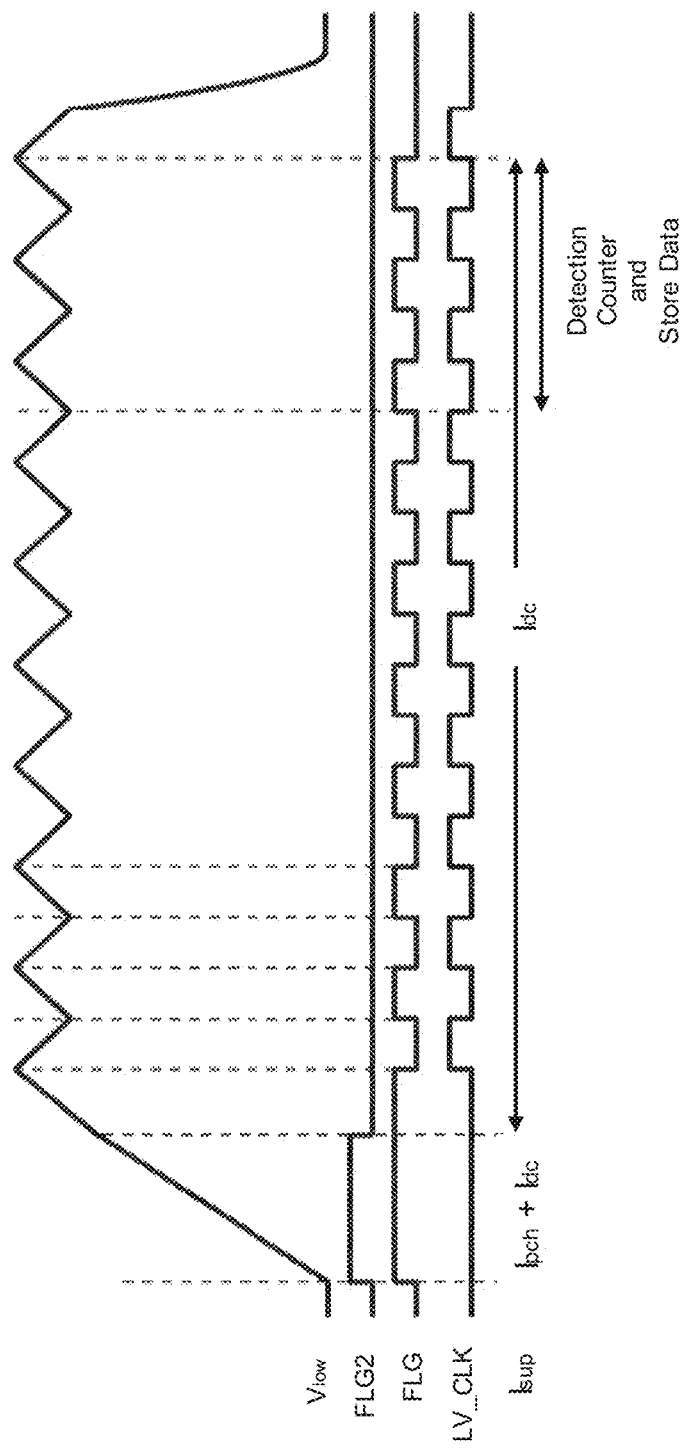
FIG. 38 is a set of waveforms with respect to sampling a low voltage clock signal (LV_CLK), in accordance with exemplary embodiments.

Briefly taking a closer look at the LV_CLK sampling process, there is depicted in FIG. 38 a set of waveforms, the top of which represents $V_{low}$ as it is initially ramped up to a target voltage and is thereafter regulated at that level. Accordingly, during the ramp up of $V_{low}$, the current $I_{pch}$ is enabled with FLG2 high and both $I_{dc}$ and $I_{pch}$ are supplied to the $V_{low}$ node. Once the target voltage is reached, the FLG2 signal goes low and $I_{pch}$ is turned OFF, and, beginning at high, the FLG signal alternates between ON and OFF thereby generating the LV_CLK signal for the gate of transistor 3005. Under regulation, the number of cycles of the LV_CLK signal is counted over the detection period in a similar manner to the exemplary embodiments discussed above with respect to the high voltage path.

Figure 37C:
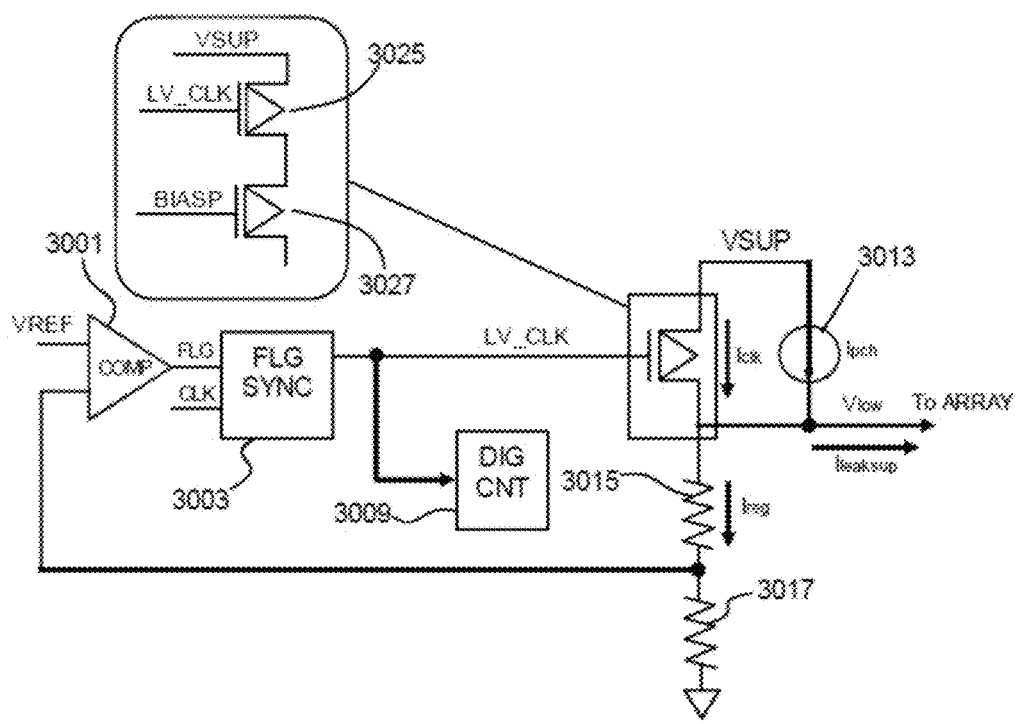
Figure 37D:
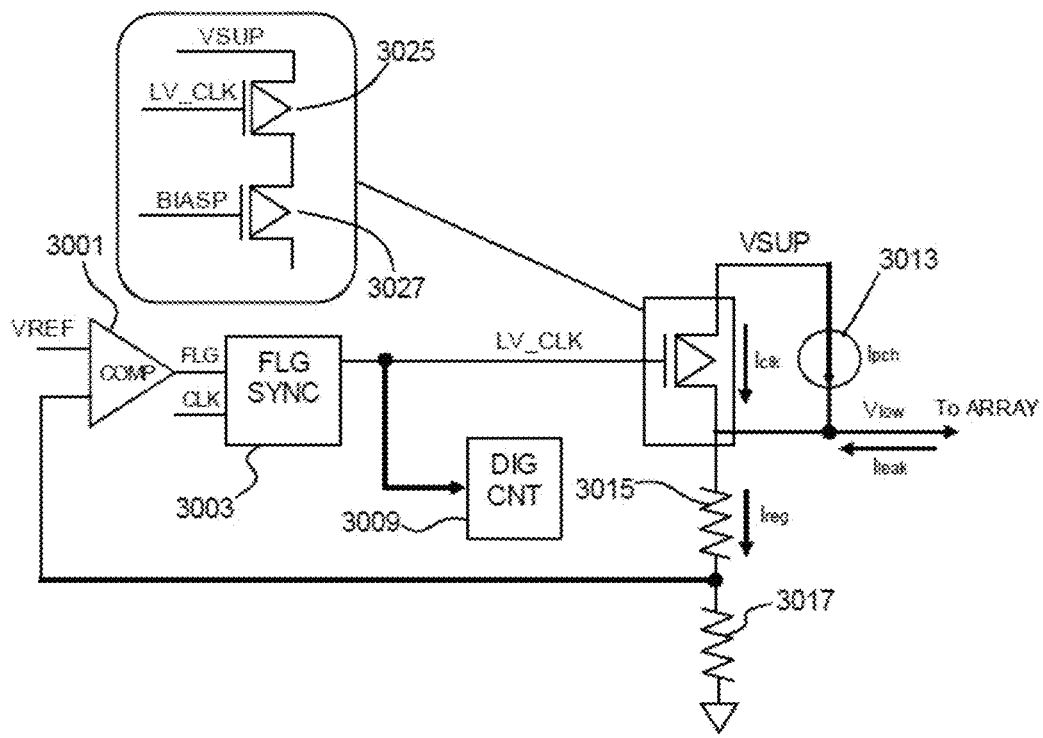

Continuing with the further exemplary circuitry embodiments in FIGS. 37C and 37D, these configurations utilize a PMOS 3025 (and, if included, a second PMOS 3027) connected between $V_{low}$ and the supply level VSUP as opposed to an NMOS 3005 (and a second NMOS 3007, if included) as used in the embodiments of FIGS. 37A and 37B. Accordingly, a current source $I_{dc}$ is no longer included as current source $I_{pch}$ 3013 provides the necessary fast charge up current for nearing the target for $V_{low}$. Further, $I_{reg}$ is the $V_{low}$ regulation current and $I_{clk}$ is the current supply to $V_{low}$ for maintaining regulation thereof. To realize different step counts, the $I_{clk}$ current can be changed by different biasing conditions on BIASP for PMOS 3027. And, the DAC/CLK count is synchronized and sent to logic counter DIG CNT 3009. In operation, during detection, FIG. 37C illustrates the case in which the output current to the memory array is being detected, wherein $I_{clk}$=$I_{reg}$+$I_{leaksup}$. The frequency of the LV_CLK signal determines $I_{clk}$, which is directly proportional to the current output to the array and regulation current. This is the case when, for example, $V_{low}$ is greater than ground (Vss), which is the case when the leakage mechanism is from the low voltage path to an even lower level.

With respect to the exemplary embodiment of FIG. 37D, it should be noted that when detecting current from the array according to this configuration, $I_{clk}$+$I_{leaksup}$=$I_{reg}$. Accordingly, as indicated by the circle at the input to the counter DIG CNT 3009, the polarity of the counting should be inverted from LV_CLK in this case.

Figure 39:
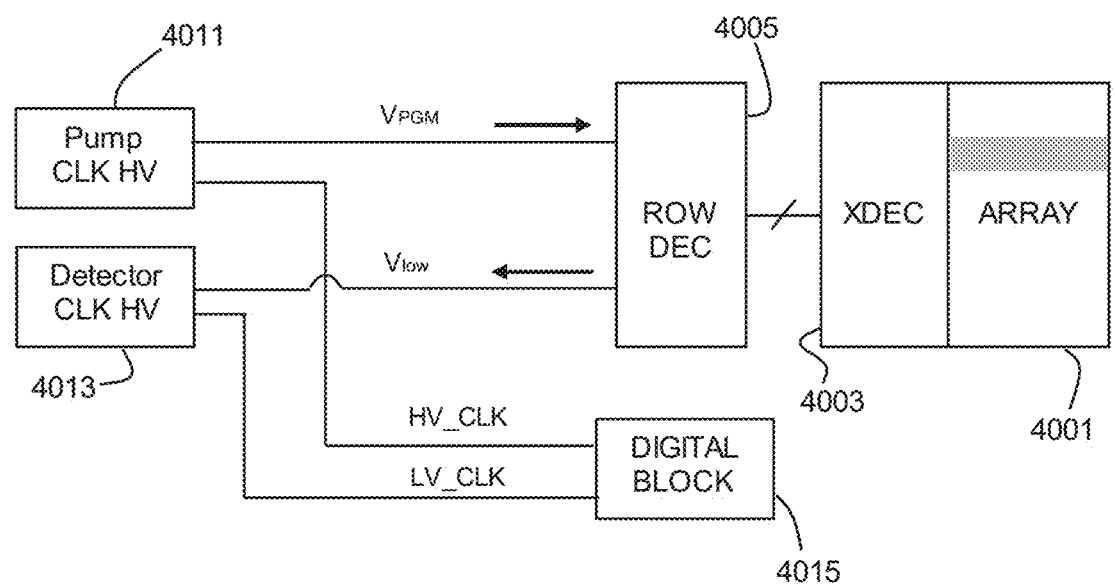
FIG. 39 is a block diagram depicting a configuration that combines sampling from both high voltage and low voltage paths, in accordance with exemplary embodiments.

Referring now to FIG. 39, there is shown an exemplary embodiment that is similar to that of FIG. 35 and combines sampling from both the high voltage and low voltage paths. Both the clock value HV_CLK from a pump 4011 that supplies the high voltage path ($V_{PGM}$) and the clock value LV_CLK from a detector 4013 of the low voltage path ($V_{low}$) can be used by digital block 4015. Accordingly, using sampling of both paths, high accuracy leakage detection can be achieved as, depending on the leakage mechanism, the leakage may be more apparent in a high voltage path or a low voltage path, or the results from the two paths can be compared to confirm or refine the results that would be obtained from just a single path.

Advantageously, this process can be used as part of a test process or incorporated in the normal memory operations using the bias levels that would usually be applied to the operation. For example, in detecting a word line-to-word line leakage, a stripe pattern could apply the $V_{PGM}$ and $V_{low}$ voltage levels to alternate word lines and check for any leakage—or, the counts could be monitored for word lines in, for example, a verify operation to determine whether there is current leakage occurring between a selected word line and an adjacent non-selected word line. FIG. 40 examines an example of conducting a word line-to-word line leakage detection process in the context of a normal memory operation such as, for example, a read or verify operation. As is shown, the memory array 4101, ROW DEC 4105, and XDEC 4103 elements of this exemplary embodiment are repeated from the circuitry embodiment of FIG. 35. However, in this example, the high voltage $V_{high}$ is now VREAD, which is the voltage that is applied to non-selected word lines in a sensing operation, and the low voltage $V_{low}$ is the voltage that is applied to a selected word line in a ready or verify operation. Further, the selected block 4181 of the memory array 4101 is shown in more detail on the righthand side of FIG. 40. Accordingly, in block 4181, the $V_{low}$ voltage is applied to a selected word line, while the adjacent word lines are at the higher VREAD voltage level, and the possible word line-to-word line leakages indicated. Waveforms for the read or verify operation are shown at the bottom section of FIG. 40; the detection time being incorporated within the normal timing of the operation. In this example, the $V_{low}$ and VREAD voltage levels can be according to the normal operating voltages (as opposed to specific test values), such that the leakage detection operation can be incorporated into a normal memory operation. The low voltage path detection can be calibrated similarly to the high voltage path to determine the step size and leakage current. The calibration can be implemented during testing, adding an additional reference detection phase using an extra known current (e.g., a calibration current). More specifically, while under regulation using a calibration current, reference values can be established based on values obtained from other memory blocks or by biasing the circuit according to the test mode, while shutting off the leakage mode to be able to determine the associated junction leakage so that it may be isolated from any actual leakage occurring in the device.

In further examining the current-based or current-comparison based leakage detection mechanisms as described above with, for example, reference to the exemplary embodiments of FIGS. 21-40, considerations arise as to the accuracy and resolution of the DAC functions in the circuitry, including the trade-off relationship between accuracy and resolution, as well as the resulting impact on the leakage detection time. For purposes of understanding the nature of the accuracy and resolution parameters, the following is a brief discussion of certain principles of analog/digital conversion, wherein this conversion is used to interface a digital system to an analog-based input.

Figure 41:
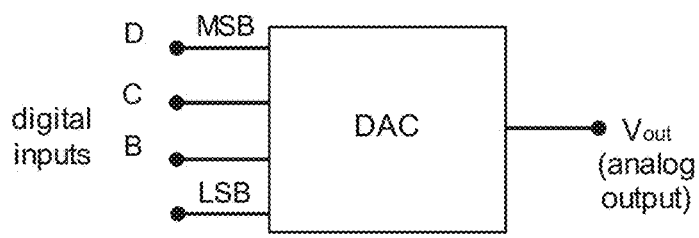
FIG. 41 is a block diagram of a 4-bit digital-to-analog converter (DAC), in accordance with exemplary embodiments.

With respect to an analog-to-digital converter (ADC), it operates to convert an analog input to a digital output. The digital output consists of a number of bits representing the value of the analog input. For example, an ADC may convert an 800 to 1500 mV range of analog values to binary values ranging from 01010000 (80) to 10010110 (150), with the binary output being proportional to the analog voltages so that each unit of the digital output represents 10 mV. Conversely, in the case of a digital-to-analog converter (DAC), a digital input value is converted into a proportional analog voltage or current. For example, a DAC may convert a digital input ranging from 0000000 to 11111111 to a voltage ranging from 0 to 10V. FIG. 41 depicts an exemplary 4-bit DAC converter with a voltage output ($V_{out}$). The four digital inputs may be derived from an output register of a digital system. In this example, there are $2^4=16$ different binary numbers represented by the four bits and for each input number, the output voltage is a unique value as governed by the following:

$$\text{analog output} = k*(\text{digital input}), \quad \text{(Equation \#3)}$$

wherein k is a proportionality factor and is a constant value for a given DAC. The analog input can be either a voltage or current and, as such, the k factor will be expressed in the units of the analog input. If, in the example of the DAC of FIG. 41, the k factor is assumed to equal 1V, application of "Equation #3" results in $V_{out}=(1V)*(\text{digital input})$. From this equation, it is then possible to calculate Vout for any value of digital input. For example, given a digital input of $1100_2=12_{10}$, the output voltage of the DAC is $V_{out}=(1V)(12)=12V$. However, it is important to note that the output of a DAC is not a true analog quantity from a technical standpoint as it can take on only specific values like the 16 possible output voltage levels for $V_{out}$ in the example of FIG. 41. Despite this limitation, the number of different possible output levels can be increased and the difference between the successive values can be decreased by increasing the number of input bits. Accordingly, it is possible to produce an output that is increasingly more comparable to a true analog quantity that various continuously over a range of values.

Further with respect to a DAC, each digital input contributes a different amount to the analog output such that the inputs are considered to be weighted. The below Table illustrates an example of weighted inputs with respect to a 4-bit DAC (such as the one pictured in FIG. 41), wherein in each case only one of the inputs is HIGH.

TABLE 1

| Inputs | | | | | Vout (V) |
|---|---|---|---|---|---|
| D | C | B | A | | |
| 0 | 0 | 0 | 1 | → | 1 |
| 0 | 0 | 1 | 0 | → | 2 |
| 0 | 1 | 0 | 0 | → | 4 |
| 1 | 0 | 0 | 0 | → | 8 |

As shown, the contributions of each digital input are weighted according to their position in the binary number. More specifically, input A, which is at the LSB (Least Significant Bit) position, has a weight of 1V, input B has a weight of 2V, input C has a weight of 4V, and input D, which is at the MSB (Most Significant Bit) position, has the largest weight of 8V. The weights are successively doubled for each bit, beginning with the LSB. Therefore, $V_{out}$ may be considered to be the weighted sum of the digital inputs. For example, to determine Vout for a digital input of 0111, the weights of the C, B, and A bits are added to obtain 4V+2V+1V=7V.

Figure 42:
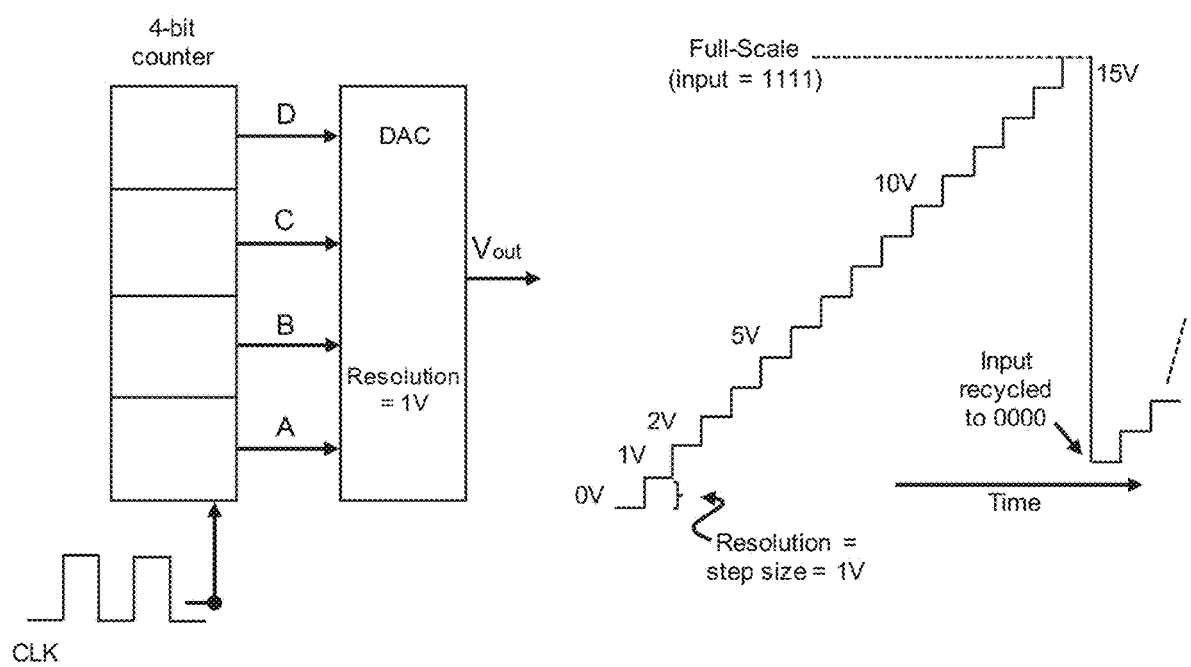
FIG. 42 illustrates the resolution/step size of the 4-bit DAC of FIG. 41, in accordance with exemplary embodiments.

Focusing now on the issue of resolution with respect to a digital-to-analog converter (DAC), the resolution is defined as the smallest change that can occur in the analog output as a result of a change in the digital output. In the example DAC discussed above, the resolution is equal to 1V as $V_{out}$ can change by no less than 1V when the digital input value is changed. Accordingly, the resolution is always equal to the weight of the LSB. The resolution is also referred to as the step size, which is mentioned specifically above in describing the various embodiments. Returning again to the 4-bit DAC example of FIG. 41, FIG. 42 illustrates a waveform representation of the DAC output. As the counter is being continually cycled through its 16 states by the clock signal (CLK), the ideal DAC output is a staircase waveform increasing by 1V per step. As depicted, when the counter is at 1111, the DAC output is at its maximum voltage value of 15V. This maximum output is referred to as its full-scale output. When the counter re-cycles to 0000, the DAC output returns to 0V. Therefore, the resolution or step size of the jumps in the staircase waveform is 1V in this particular case. It should be recognized that although the staircase waveform has 16 levels corresponding to the 16 input states, there are only 15 steps or jumps between the 0V and full-scale levels. Thus, in general, for an N-bit DAC, the number of different levels may be defined as $2^N$ and the number of steps as equal to $2^N-1$. In addition, the resolution or step size is defined as the following:

$$N\text{-Bit } DAC \text{ resolution} = \frac{Vout}{2^N}. \quad \text{(Equation \#4)}$$

Further, with respect to "Equation #3" above, the resolution or step size is the same as the k proportionality factor such that the analog output of the DAC is equal to the product of the number of steps and the voltage (or current) per step. Further, although the resolution is expressed as the amount of voltage (or current) per step, it could also be useful to consider the resolution as a percentage of the full-scale output according to the following:

$$\% \text{ resolution} = \frac{\text{step size}}{\text{full scale}} \times 100. \quad \text{(Equation \#5)}$$

Thus, when applied to the 4-bit DAC example of FIGS. 41-42 in which the full-scale output is 15V and the step size is 1V, the percentage resolution according to "Equation #5" is [(1V)/(15V)]*100=6.67%. In a further example involving a 10-bit DAC having a 10 mV step size, the result is a $2^{10}-1=1023$ steps of 10 mV each and a full-scale output of (10 mV)*(1023)=10.23V. Therefore, the percentage resolution equals [(10 mV)/(10.23V)]*100≈0.1%. Thus, the percentage resolution may also be expressed as the following:

$$\% \text{ resolution} = \frac{1}{\# \text{ of steps}} \times 100, \quad \text{(Equation \#6)}$$

wherein the total number of steps is, as indicated above, $2^N-1$ for a N-bit DAC. Accordingly, it should be noted that the percentage resolution decreases as the number of input bits is increased as an increase in the number of bits increases the number of steps to reach the full-scale output. Thus, a 10-bit DAC has a finer (smaller) resolution than, for example, an 8-bit DAC.

Turning now to the issue of accuracy in a digital-to-analog converter, there are various ways in which it can be specified or evaluated. For example, accuracy may be ascertained by looking at the full-scale error and the linearity error. The full-scale error is defined as the maximum deviation of the DAC's output from its ideal (or expected) value, expressed as a percentage of the full-scale (FS) output. For example, in a case in which a DAC has an accuracy of ±0.01% FS and a full-scale output of 9.375V, this percentage then converts to (±0.01)*(9.375V)=±0.9375 mV. Therefore, this indicates that the output of the DAC can, at any time, be off by as much as 0.9375 mV from its expected value. Linearity on the other hand is defined as the maximum deviation in step size from the ideal step size, also expressed as a percentage of the full-scale (FS) output. For example, in a case in which a DAC has a linearity error of ±0.01% FS and an ideal step size of 0.625V, the actual step size of the output could be off by as much as 0.9375 mV.

Figure 43:
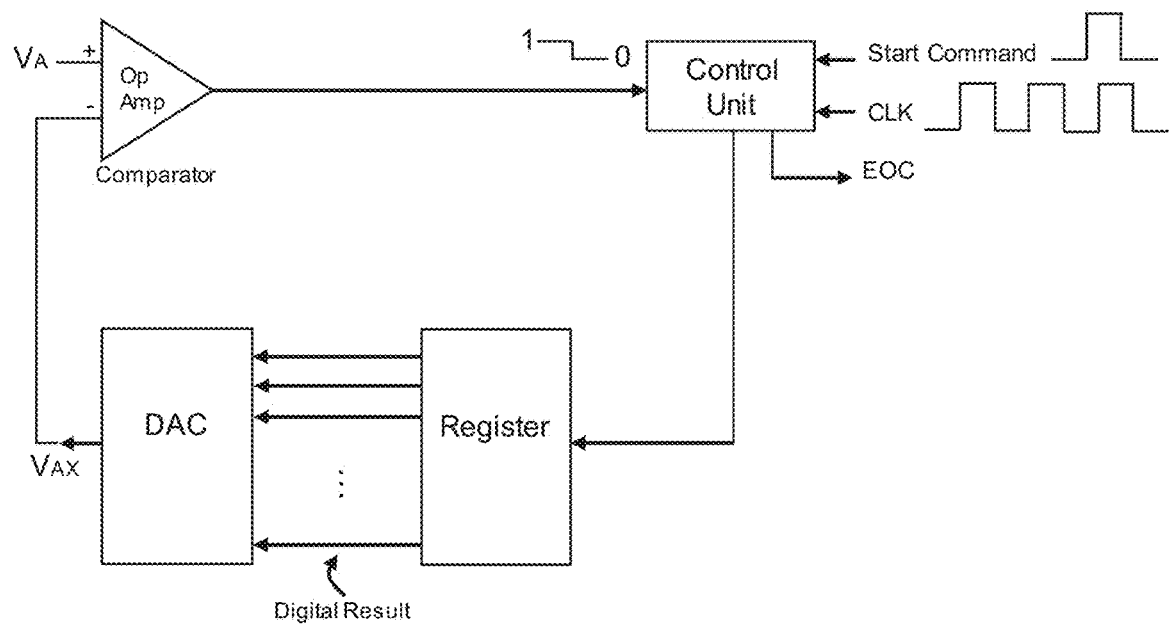
FIG. 43 is a block diagram of an analog-to-digital converter (ADC), in accordance with exemplary embodiments.

When considering circuit implementations that comprise an analog-to-digital converter (ADC), several important types of ADC utilize a DAC as a part of its circuitry. For purposes of illustration, FIG. 43 depicts such an exemplary ADC circuit. The timing of the operation is provided by an input clock signal (CLK). A control unit contains the logical circuitry for generating the proper sequence of operations, wherein a START command initiates the A/D conversion process. Further, the circuit comprises a DAC and an op-amp comparator. The op-amp comparator has two analog inputs and a digital output that switches states depending upon which analog input is greater. In operation, the START command pulse initiates the operation and, at a rate that is determined by the clock signal (CLK), the control unit continually modifies the binary number stored in a register. The binary number in the register is then converted to an analog voltage ($V_{AX}$) by the DAC. At the comparator, $V_{AX}$ is compared to the analog input ($V_A$) and, as long as $V_{AX} < V_A$, the comparator output stays HIGH. However, in the event that $V_{AX} > V_A$ by at least a threshold voltage ($V_T$) amount, the comparator output will then switch to LOW and the process of modifying the binary number at the register stops as the control logic activates the end-of-conversion (EOC) signal. At this point, $V_{AX}$ is a close approximation to $V_A$ and therefore the digital number in the register, which is the digital equivalent of $V_{AX}$, is also the approximate digital equivalent of $V_A$ within the resolution and accuracy of the system.

Figure 44:
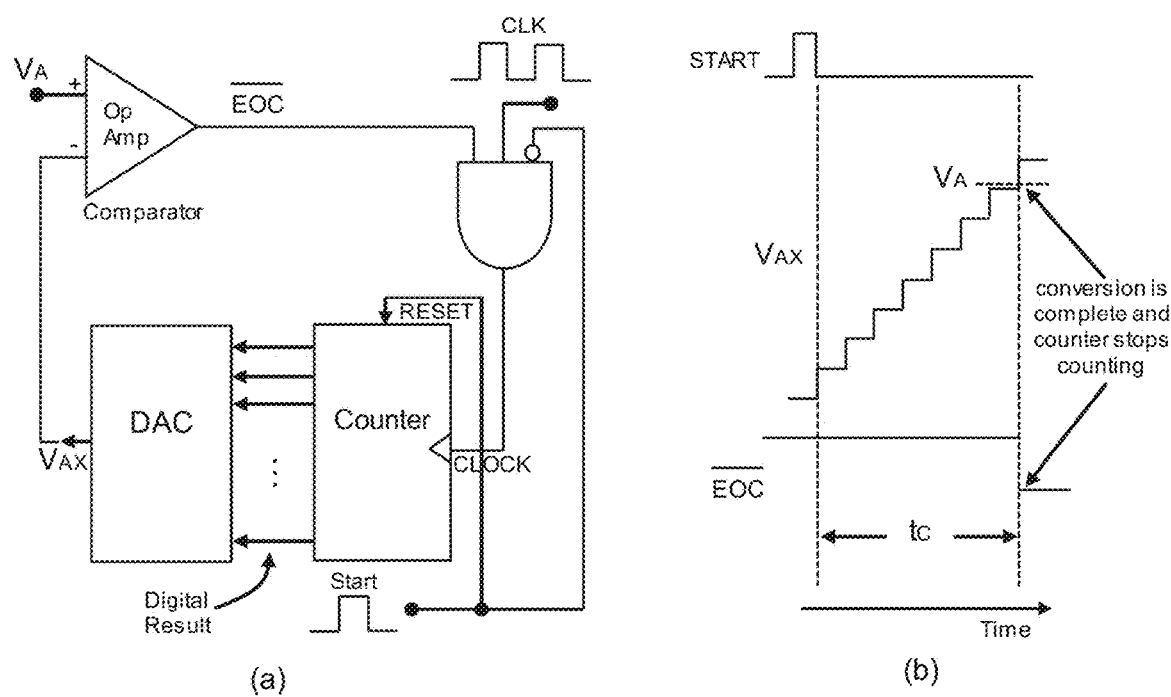
FIG. 44 is a block diagram of a digital-ramp analog-to-digital converter (ADC), as well as in illustration of the step by step waveform of the DAC output, in accordance with exemplary embodiments.

FIG. 44 depicts another exemplary ADC circuit, referred to as a digital-ramp ADC, in which a binary counter is used as a register and allows the clock to increment the counter at one step at a time until $V_{AX} \geq V_A$. Accordingly, as illustrated in FIG. 44, the waveform of $V_{AX}$ is a step-by-step (staircase) ramp. In addition to the binary counter, DAC, and op-amp comparator, the circuit has a control AND gate. The comparator output serves as the active-LOW end-of-conversion signal ($\overline{EOC}$). In operation, assuming that the analog input voltage ($V_A$) is positive, the START pulse is applied to reset the counter to zero and inhibits the clock pulse (CLK) from passing through the AND gate into the counter. At this point, with all 0's at its input, the DAC output will be $V_{AX}=0V$ and, therefore, as $V_A > V_{AX}$, the comparator output ($\overline{EOC}$) will be HIGH. When START returns LOW, the AND gate is enabled and the clock pulses (CLK) proceed to the counter. As the counter advances, the DAC output $V_{AX}$ increases one step at a time until $V_{AX}$ reaches a step that exceeds $V_A$ by an amount equal to or greater than a threshold voltage ($V_T$) (which is typically 10 to 100 µV), as shown in (b) of FIG. 44. Upon reaching this point, the $\overline{EOC}$ will switch to LOW and inhibit any further flow of clock pulses into the counter and the counter will stop counting having now completed the conversion process as indicated by the HIGH to LOW transition at $\overline{EOC}$. At completion, the contents of the counter are the digital representation of $V_A$ and the counter will hold the digital value until the next START pulse initiates a new conversion.

For purposes of illustrating several key aspects of a digital-ramp ADC circuit, the following is a working example with respect to the circuit embodiment in FIG. 44, in which it is assumed, for example, that the ADC clock frequency=1 MHz, the threshold voltage $V_T$=0.1 mV, the input voltage ($V_A$)=3.728V, and the DAC is a 10-bit DAC having a full-scale (FS) output=10.23V. Accordingly, with respect to the DAC, the total number of steps is $(2^{10}-1)$ =1023 and, therefore, as discussed above, the step size (or resolution) is (10.23V/1023)=10 mV. Thus, $V_{AX}$ increases in steps of 10 mV as the counter advances from zero. As $V_A$=3.728V and $V_T$=0.1 mV, $V_{AX}$ must reach 3.7281V or more before the comparator switches to LOW. As a result, this will require (3.7281V/10 mV)≈373 steps. Therefore, at completion of the A/D conversion, the counter will hold the binary equivalent of 373, i.e., 0101110101, which is the desired digital equivalent of $V_A$ as produced by this ADC. In addition, as 373 steps were required to complete the A/D conversion, thereby requiring 373 clock pulses occurring at the rate of one per microsecond, the conversion time (tc) may be calculated as 373 µs.

The resolution of an ADC circuit is equal to the resolution of the DAC that it contains. Accordingly, as the DAC output $V_{AX}$ is ideally a staircase waveform that increments in discrete steps until it exceeds $V_A$, $V_{AX}$ approximates the value of the input voltage $V_A$ and, in the ideal case, it is expected that $V_{AX}$ is within a step size of $V_A$. The resolution can be considered as a built-in error, referred to as quantization error, that can be reduced by increasing the number of bits in the counter and DAC. With respect to time, the conversion time (tc) is the time interval between the end of the START pulse and activation of the $\overline{EOC}$ signal. Therefore, the length of the conversion time (tc) is also dependent on the amount of input voltage $V_A$. The larger the input voltage level, the more steps there are required before the DAC output $V_{AX}$ exceeds $V_A$. As illustrated in FIG. 44, the maximum conversion time (tcmax) occurs when $V_A$ is just below the full-scale output such that the DAC output $V_{AX}$ must reach to the last step to activate the $\overline{EOC}$ signal. Thus, with respect to an N-bit converter, tcmax=$2^N-1$ clock cycles. As such, there is a significant increase in the conversion time for each bit added to the counter. Accordingly, resolution can only be improved at the cost of a longer conversion time.

Returning now to the current-based and current-comparison based leakage detection mechanisms described above, there is a prevailing need to improve the circuitry parameters, including the output range, resolution, accuracy, and detection time, as well as to combine the various leakage detections into one process. As discussed above, typical leakage current levels are small scale in nature and various noise factors make these currents difficult to identify and isolate. Accordingly, the intent is to construct a high-precision leakage detection circuit that is able, at its output, to perceive/measure and separate out a current anomaly that signifies the presence of a leakage in the memory array (or load) using the current (or voltage) ranges that are used in the course of normal memory operations in order that the detection can be conducted entirely on chip. However, with respect to performance, it is equally important that the leakage detection circuit operate at a rapid detection time, which is a parameter that is adversely affected by an increase in accuracy and resolution. The following description provides an exemplary embodiment of a leakage detection circuit configuration that encompasses these competing objectives by utilizing a "coarse" (less precise) DAC in a first stage to initially determine, or narrow, the output current (or voltage) range in which any actual leakage anomaly may be expected, and in a second stage, utilizing a "fine" (or more precise) DAC to provide a highly accurate detection of any leakage current. Accordingly, by dividing the leakage detection into more than one stage and only utilizing a high-precision DAC operation once the relevant current range has been defined, this exemplary circuit efficiently exploits and optimizes the benefit of speed in using a less precise DAC and the benefits of precision and accuracy of a more precise DAC. In other words, this exemplary circuit separates the factors of range and resolution in a highly effective manner, taking advantage of the specific beneficial attributes of both the higher and lower precision DACs rather than relying on just one type or the other.

In determining the ideal specifications of such a circuit, several observations can be made. The following two tables set forth example data that may be acquired from the DAC circuitry in a leakage detection circuit of the type that utilizes a high voltage path (such as the embodiment of FIG. 32), under various conditions.

TABLE 2.1

| Voltage Sweeps | Step Size |
|---|---|
| V0_LD1_C0: | 12.38117573 |
| V1_LD1_C0: | 11.42970402 |
| V2_LD1_C0: | 10.16366547 |
| → V3_LD1_C0: | 9.426022382 |
| V4_LD1_C0: | 9.134199134 |

TABLE 2.2

| | LD Clock [LD] (µs) |
|---|---|
| 0 | 655.36 |
| → 1 | 1310.72 |
| 2 | 2621.44 |

Figure 45A:
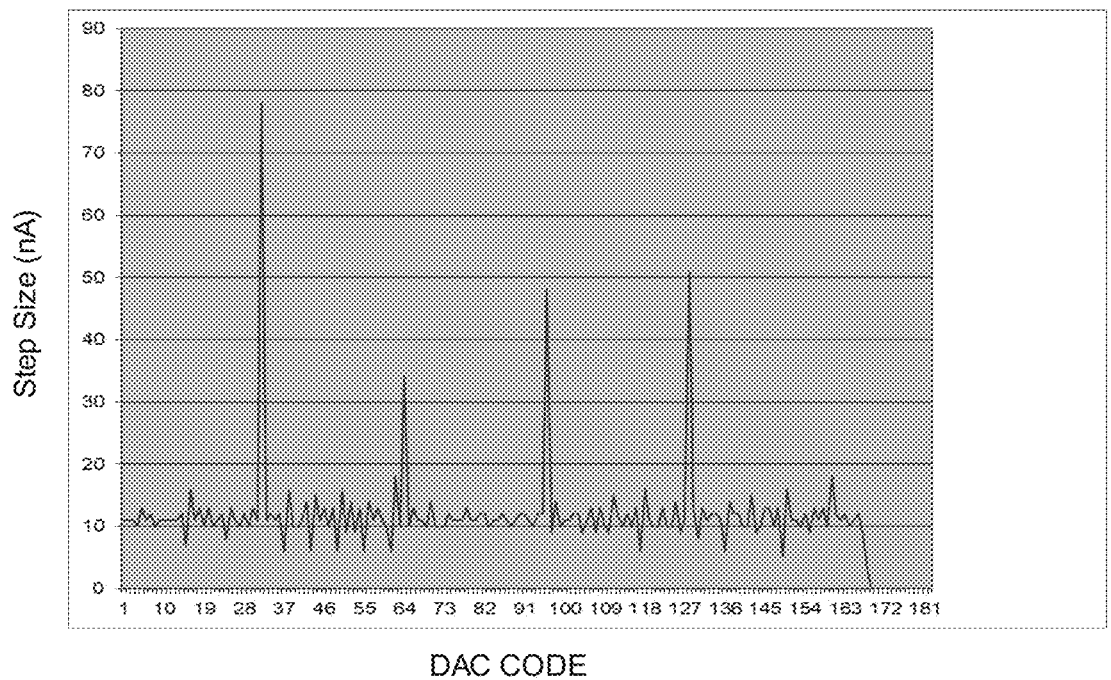
FIGS. 45A-45B are example DLN plot diagrams with respect to exemplary leakage detection circuits utilizing high voltage path for detection, having a DAC code range of approximately 2 µA and a 1LSB equal to 12.5 nA, in accordance with exemplary embodiments.
Figure 45B:
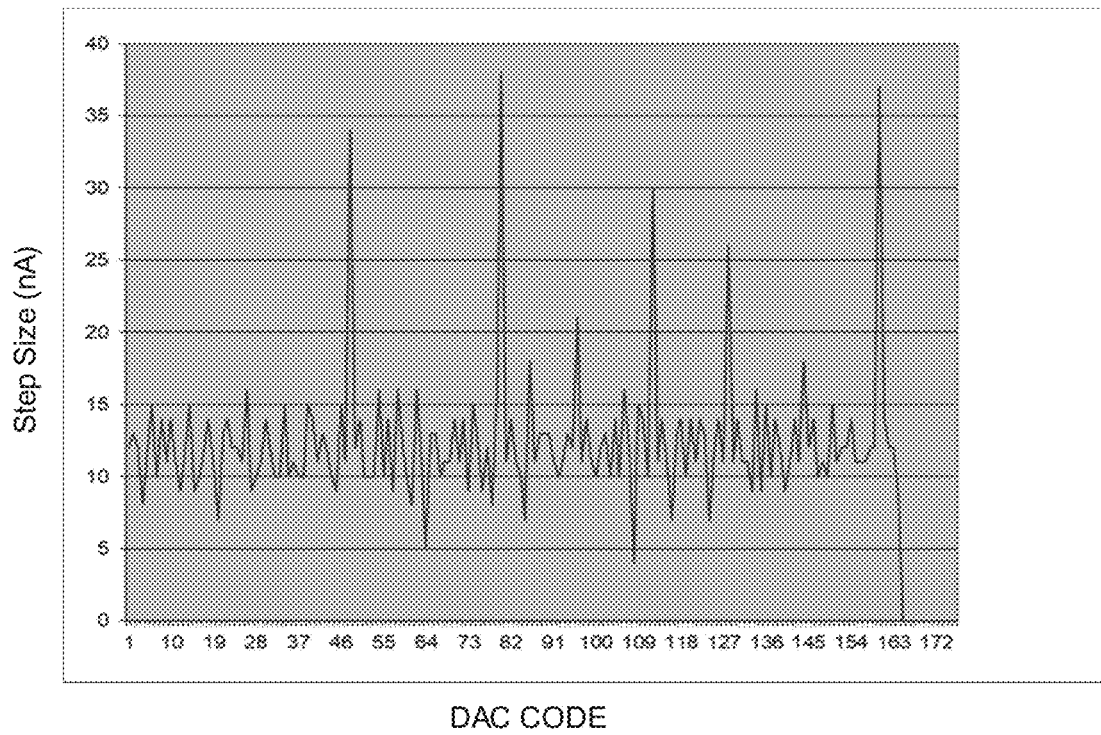
Figure 46:
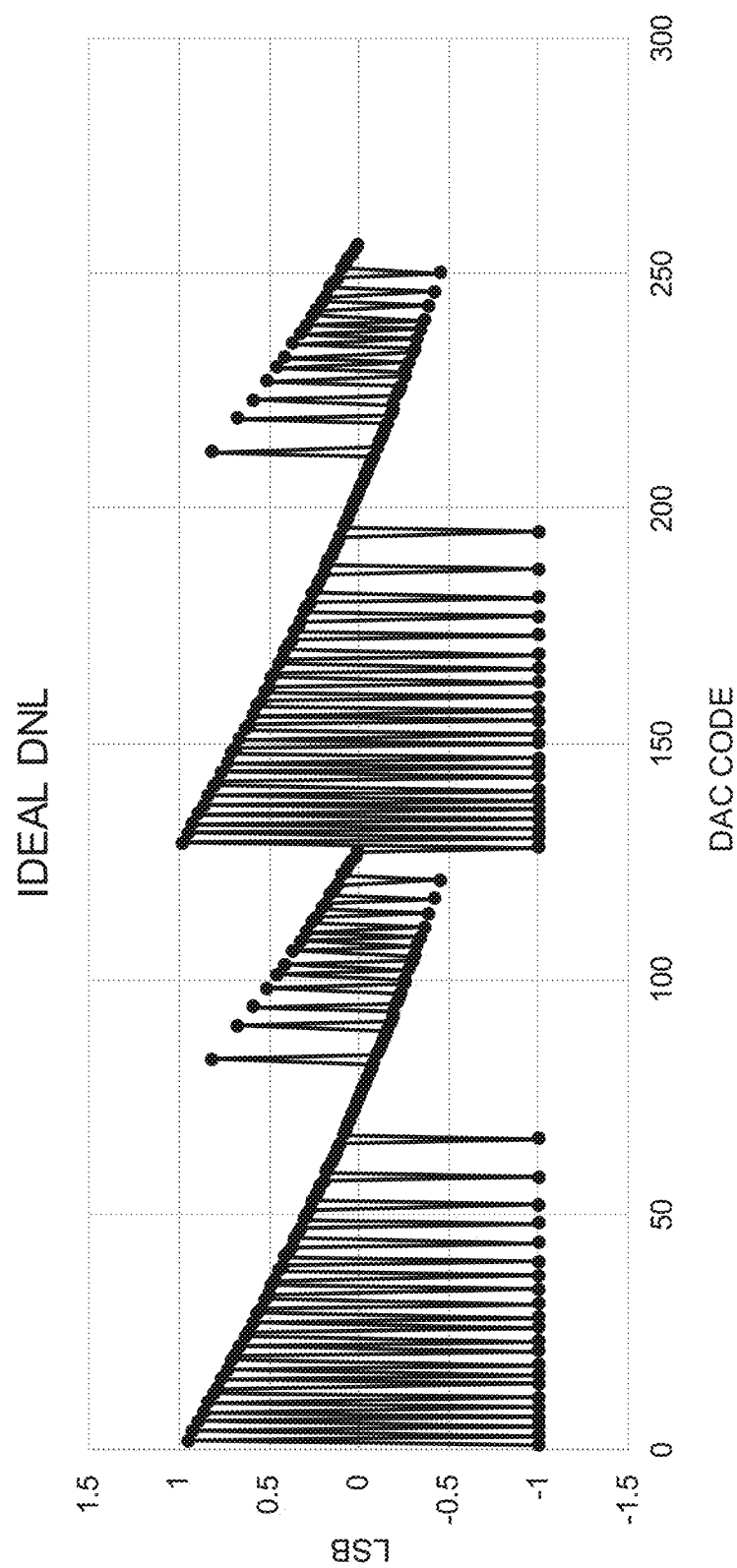
FIG. 46 is an example ideal DNL plot with respect to a DAC code range of 2 µA, in accordance with exemplary embodiments.

Based upon the data in Tables 2.1 and 2.2, in order to obtain the desired step size (or resolution) of, for example, 9.426022382 (see Line 4 of Table 2.1), a clock time (or settling time) of approximately 1.3 ms is required. In addition, in connection with the same type of leakage detection circuit, FIGS. 45A and 45B illustrate example DNL (differential non-linearity) plots illustrating a desired DAC code range of approximately 2 µA and a 1LSB value of 12.5 nA, wherein a DNL plot is one tool for assessing accuracy. However, in such an example, a 10-bit DAC is needed to accomplish this range and resolution, which is an expensive component and results in a relatively sluggish conversion (and hence, detection) time. FIG. 46 depicts an ideal DNL plot with respect to the desired output current range of 2 µA, in which the output current (voltage) stays within ±1LSB (thereby assuring monotonicity).

Given these observations, the configuration of the exemplary leakage detection circuit according to the present disclosure is comprised of a 15-bit ramp analog-to-digital converter (ADC) that operates a segment of the 15-bits according to a "coarse" DAC operation and the remaining of the 15-bits according to a "fine" ramp DAC operation. More specifically, in one exemplary embodiment, the 15-bit ADC may be comprised of a 7-bit coarse DAC and an 8-bit fine ramp DAC, wherein the coarse DAC will cover a larger output current range of up to, for example, approximately 256 µA, and the fine ramp DAC, having a resolution of 7.8 nA, will operate with respect to a much narrower output current range of 0 to 2 µA.

Figure 47:
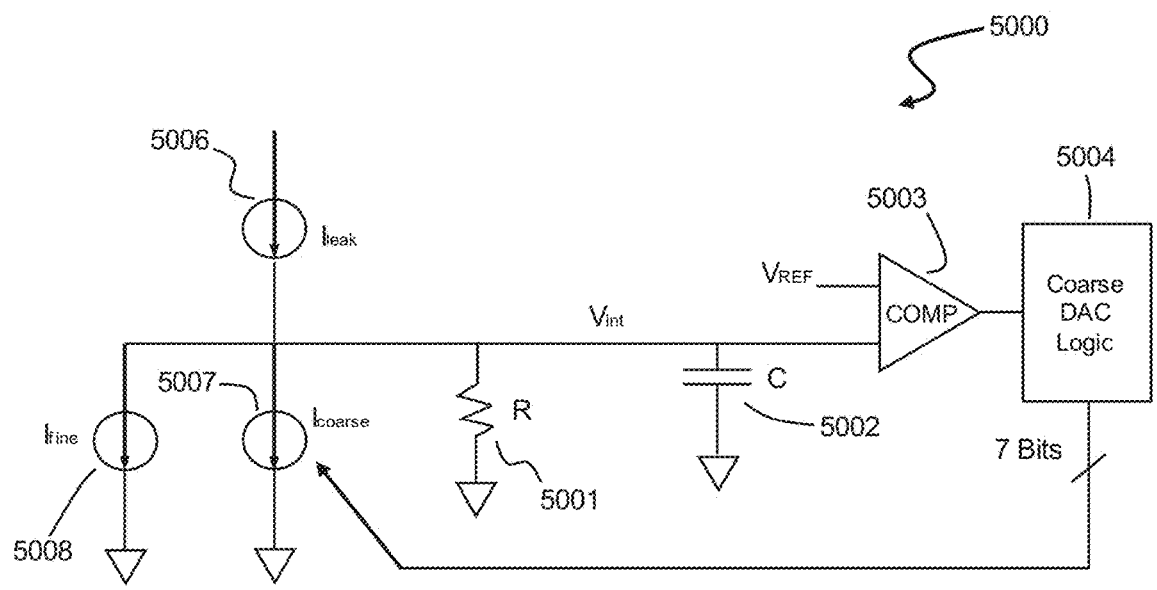
FIG. 47 is a circuit diagram illustrating the coarse DAC portion of a leakage detection circuit, in accordance with exemplary embodiments.

In FIG. 47, there is depicted an exemplary embodiment of a coarse DAC portion of a leakage detection circuit 5000 in accordance with the configuration parameters described immediately above. As shown in (a), circuit 5000 comprises at least one resistor 5001, which produces the initial biasing of an input voltage ($V_{int}$), at least one capacitor 5002, an op-amp comparator (ADC) 5003, and a control unit 5004 that, when enabled in a coarse DAC mode, operates in accordance with a coarse DAC logic. As described above, the coarse DAC is, for example, a 7-bit DAC having an output range of zero (0) to approximately 255 µA with a 2 µA step size. Further according to this specific embodiment, a first input to the comparator 5003 comprises a reference voltage, $V_{REF}$, set to a value of 1.8V. The basis for this voltage level is explained in further detail below. In addition, the capacitor 5002 may have, for example, a capacitance of 5 pF with a programmability of ±25%. It should be noted that the parameters specified here are to provide a non-limiting example and are not intended to unduly restrict the parameters of any such circuitry that achieves or encompasses the principles of operation of a multi-stage ADC comprising a coarse DAC and a fine DAC as described in the present disclosure.

Figure 48:
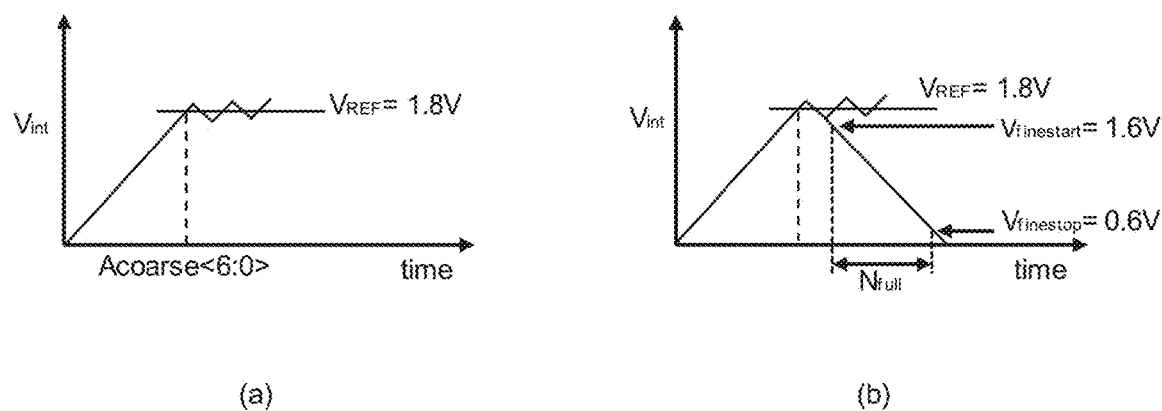
FIG. 48 illustrates the behavior of the input voltage level (Vint) according to the circuit configuration of FIG. 47, in accordance with exemplary embodiments.

Referring back to FIG. 47, in operation, a current from a load 5006 (memory array), including any leakage current ($I_{leak}$), is fed to the resistor 5001 to produce a biased voltage $V_{int}$, wherein $V_{int}$ constitutes the second input to the comparator 5003. At the comparator 5003, and in accordance with the timing (counter) signal from the coarse DAC logic, a comparison is made between the $V_{int}$ and $V_{REF}$ voltage inputs. At this point in time, if $V_{int} < V_{REF}$, the coarse DAC continues in the self-biasing loop as depicted in FIG. 47. However, once the comparison result is $V_{int} \geq V_{REF}$, the output of the coarse DAC logic signals the end of the conversion process and a fine ramp DAC logic is enabled. In area (a) of FIG. 48, there is depicted a graphical illustration of the voltage input level $V_{int}$ as a function of time, wherein during application of the coarse DAC, the $V_{int}$ voltage steadily increases until it reaches $V_{REF}$. Accordingly, at the onset of this ramp-up phase of the $V_{int}$ voltage, the current $I_{coarse}$ is set at a current level that is higher than the leakage current ($I_{leak}$) in order to ensure that $V_{int}$ starts low (relative to the $V_{REF}$ voltage) and increases upward. At the point in which $V_{int}$ reaches $V_{REF}$, $V_{int}$, as depicted in FIG. 48(a), becomes non-linear and exhibits a triangle-like waveform in which the coarse DAC is alternating between two DAC codes. One of these two alternating DAC codes is set as a value, e.g., "Acoarse<0:6>", as indicated in FIG. 48(a). Accordingly, at this point, the detection circuit 5000 has determined a narrow current range in which to apply the higher precision (i.e., fine) DAC logic and the appropriate DAC code is set such that $V_{int}$ will start to ramp in a downward direction. In other words, during the period in which the $I_{coarse}$ current is greater than the leakage current ($I_{leak}$), $V_{int}$ is consequently being pulled to ground while outside the relevant current range. Once the $I_{coarse}$ current is less than the $I_{leak}$ current, the difference between the two will then go into, for example, charging the capacitor 5002. It should be noted that under the exemplary parameters set forth above for this specific circuit embodiment 5000, a suitable value for $V_{REF}$ is approximately 1.8V (as indicated in FIG. 48), as it is at this voltage level that the non-linear behavior begins to appear. However, this reference voltage level is defined by the specific parameters and component specifications of the circuit and, therefore, a different circuit having different parameters and specifications may have a different value for $V_{REF}$ for achieving an analogous result in that case.

Once the fine ramp DAC logic is enabled, an $I_{fine}$ current 5008 draw is activated to a current level that will cause the input voltage $V_{int}$ to steadily decrease as a result. The downward slope of $V_{int}$ is depicted in area (b) of FIG. 48. In accordance with the fine ramp DAC logic, the leakage current detection begins at a point in which $V_{int}$ has dropped to a precise voltage level, $V_{finestart}$, wherein $V_{finestart} \leq V_{int}$. At $V_{finestart}$, fine ramp DAC counter (not shown) starts to issue a clock signal (CLK) output to the fine ramp DAC. As the fine ramp DAC counter cycles through its count, the end of the conversion process occurs once $V_{int}$ has decreased to a second voltage level, $V_{finestop}$, wherein $V_{finestop} < V_{finestart}$. FIG. 48(b) illustrates an example of the voltage levels $V_{int}$, $V_{finestop}$ and $V_{finestart}$ in relation to one another as a function of time. Accordingly, the time period between $V_{finestop}$ and $V_{finestart}$ constitutes the detection (or the conversion) time, and is indicated as $N_{full}$ in FIG. 48(b). A mechanism for determining the start and end of the count in accordance with $V_{finestart}$ and $V_{finestop}$ may comprise, for example, a range comparator. As stated above, the fine ramp DAC, according to this exemplary embodiment, is an 8-bit DAC. However, the fine ramp DAC may be of any resolution that is suitable for the particular application. Accordingly, based on an 8-bit DAC, the number of clock (CLK) cycles required to complete a leakage detection sweep is equal to $2^N = 2^8$, or 256 clock cycles. Therefore, in this particular case, $N_{fullI} = 256$. Also with respect to this example, given the 1.8V optimal value for $V_{int}$ (discussed above), the range of 1.6V and 0.6V for $V_{finestart}$ and $V_{finestop}$, respectively, provides a necessary voltage range for ensuring that this operation is practical and feasible based upon the parameters and specifications of this circuit and the chip device itself according to this particular example. However, these values are in no manner intended to limit the voltage range (as demarcated by $V_{finestart}$ and $V_{finestop}$) with respect to a different circuit in which a suitable voltage range will be uniquely dependent upon that circuit's specific parameters and specifications.

Figure 49:
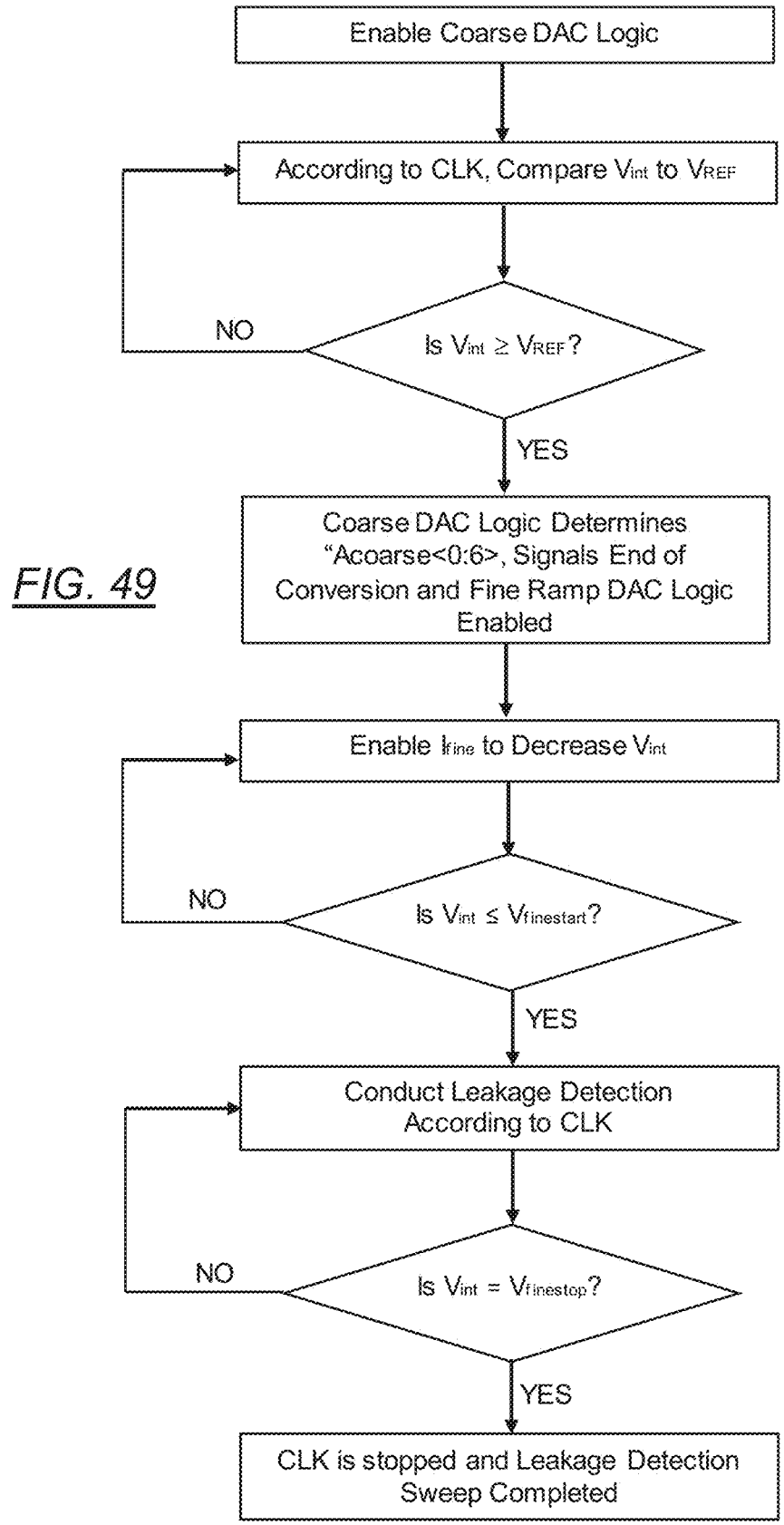
FIG. 49 is a flow diagram illustrating the principle steps in a leakage detection process as conducted using the circuit configuration of FIG. 47, in accordance with exemplary embodiments.

In the description above, the leakage detection process is described as a two-stage operation that is conducted in a single sweep (or measurement) according to an ideal case. This process is illustrated step-by-step in the flow diagram of FIG. 49. However, in actuality, background noise is present in most cases and can significantly distort the detection of a leakage current, making it difficult to isolate. This issue is described in greater detail above and can be attributed to a variety of sources. Due to the fact that background noise, by its nature, is not constant, it may be beneficial, in certain exemplary embodiments of the leakage detection procedure utilizing the circuit configuration above, for the process to comprise more than one sweep using various combinations of the coarse DAC logic, fine ramp DAC logic, or both. For example, in one exemplary embodiment, a first sweep may utilize the two-stage operation described above whereby both the coarse DAC and fine ramp DAC are utilized (as depicted in FIG. 49) and, in an additional second sweep, only the fine ramp DAC logic is applied (as the relevant output current range was already determined in the first sweep). In another exemplary embodiment, a first detection sweep may apply just the coarse DAC with an additional 1-bit resolution (to address the background noise) and, in a second sweep, may apply a two-stage operation that first utilizes the coarse DAC with the additional 1-bit and subsequently applies the fine ramp DAC.

Additionally, in some exemplary embodiments, it may be necessary to conduct at least an initial calibration of the ADC of the disclosed leakage detection circuit in order to establish reference value(s). In such embodiments, this may be conducted according to the principles described above and using, for example, a VMON input.

Lastly, as also mentioned above, the ADC circuit configuration (as generally depicted in FIG. 47) in accordance with the present disclosure is designed to enable leakage detection and measurement using the voltage (current) levels ($I_{cell}$) used to perform the normal memory operations of the chip device. Therefore, it should be noted that only a simple transmission gate to tap into the Icellpad is needed to perform the measurement for purposes of the present disclosure.

The above discussion is meant to be illustrative of the principles and various embodiments of the present invention. Numerous variations and modifications will become apparent to those skilled in the art once the above disclosure is fully appreciated. For example, although on-memory controllers have been described as performing or controlling the methods that are described above, any processor executing software within a host system can perform the methods described above without departing from the scope of the disclosure. In particular, the methods and techniques described herein as performed in the on-memory controller(s), may also be performed in a host. Furthermore, the methods and concepts disclosed herein may be applied to other types of persistent memories other than flash. It is intended that the following claims be interpreted to embrace all such variations and modifications.

What is claimed is:

1. A method for detecting a word line leakage in a memory array of a non-volatile memory system, comprising:
    in a first stage:
        enabling a M-bit coarse digital-to-analog converter (DAC) logic of a N-bit analog-to-digital converter (ADC), the analog-to-digital converter (ADC) having a comparator with a reference voltage ($V_{REF}$) as a first input;
        voltage biasing a load current of a memory array to produce an input voltage ($V_{int}$) as a second input to the comparator; and
        according to a clock signal from the coarse digital-to-analog converter (DAC) logic, comparing the input voltage ($V_{int}$) level to the reference voltage ($V_{REF}$) level; and
    in a second stage:
        if the input voltage ($V_{int}$) level is greater than or equal to the reference voltage ($V_{REF}$) level, enabling a P-bit fine ramp digital-to-analog converter (DAC) logic of the analog-to-digital converter (ADC) to:
            enable drawing a second current ($I_{fine}$) from the load current to thereby decrease the input voltage ($V_{int}$) level;
            compare the input voltage ($V_{int}$) level to a first voltage ($V_{finestart}$) level, wherein the first voltage ($V_{finestart}$) level is less than the reference voltage ($V_{REF}$) level;
            if the input voltage ($V_{int}$) level is less than or equal to the first voltage ($V_{finestart}$) level, begin a counter and conduct leakage detection with the analog-to-digital converter (ADC) according to a clock signal (CLK) from the fine ramp digital-to-analog converter (DAC) logic;
            compare the input voltage ($V_{int}$) level to a second voltage ($V_{finestop}$) level, wherein the second voltage ($V_{finestop}$) level is less than the first voltage ($V_{finestart}$) level; and
            if the input voltage ($V_{int}$) level is equal to the second voltage ($V_{finestop}$) level, disable the clock signal (CLK) thereby completing the leakage detection.

2. The method of claim 1, wherein the load current comprises a leakage current.

3. The method of claim 1, wherein:
    the N-bit analog-to-digital converter (ADC) is a 15-bit analog-to-digital converter (ADC);
    the M-bit coarse digital-to-analog converter (DAC) is a 7-bit digital-to-analog converter (DAC); and
    the P-bit fine ramp digital-to-analog converter (DAC) is an 8-bit digital-to-analog converter (DAC).

4. The method of claim 3, wherein an output range of the coarse digital-to-analog converter (DAC) is approximately 0 to 256 µA.

5. The method of claim 3, wherein the fine ramp digital-to-analog converter (DAC) has:
    an output range of approximately 0 to 2 µA; and
    a resolution of approximately 7.8 nA.

6. The method of claim 3, wherein:
    the reference voltage ($V_{REF}$) level is 1.8V;
    the first voltage ($V_{finestart}$) level is 1.6V; and
    the second voltage ($V_{finestop}$) level is 0.6V.

7. The method of claim 1, wherein:
    if the input voltage ($V_{int}$) level is less than the reference voltage ($V_{REF}$) level, further comprising transmitting an output from the coarse digital-to-analog converter (DAC) through a self-biasing loop of the analog-to-digital converter (ADC).

8. The method of claim 1, wherein the reference voltage ($V_{REF}$) level is dependent upon the voltage level at which the input voltage ($V_{int}$) becomes non-linear.

9. A memory controller of a non-volatile memory system, comprising:
    a first communication pathway coupled to a memory array;
    a leakage detection circuit operable to receive a load current of the memory array, the leakage detection circuit comprising a N-bit analog-to-digital converter (ADC), the analog-to-digital converter (ADC) comprising:
        at least one comparator having a reference voltage ($V_{REF}$) as a first input;
        a control unit comprising:
            a M-bit coarse digital-to-analog converter (DAC) logic;
            a P-bit fine ramp digital-to-analog converter (DAC) logic; and
            at least one counter; and
    the memory controller configured to:
        in a first stage:
            enable the coarse digital-to-analog converter (DAC) logic;
            voltage bias the load current to produce an input voltage ($V_{int}$) as a second input to the comparator; and
            according to a clock signal from the coarse digital-to-analog converter (DAC) logic, compare the input voltage ($V_{int}$) level to the reference voltage ($V_{REF}$) level;
        in a second stage:

if the input voltage ($V_{int}$) level is greater than or equal to the reference voltage ($V_{REF}$) level, enable the fine ramp digital-to-analog converter (DAC) logic to:
- draw a second current ($I_{fine}$) from the load current to thereby decrease the input voltage ($V_{int}$) level;
- compare the input voltage ($V_{int}$) level to a first voltage ($V_{finestart}$) level, wherein the first voltage ($V_{finestart}$) level is less than the reference voltage ($V_{REF}$) level;
- if the input voltage ($V_{int}$) level is less than or equal to the first voltage ($V_{finestart}$) level, begin the counter and conduct leakage detection with the analog-to-digital converter (ADC) according to a clock signal (CLK) from the fine ramp digital-to-analog converter (DAC) logic;
- compare the input voltage ($V_{int}$) level to a second voltage ($V_{finestop}$) level, wherein the second voltage ($V_{finestop}$) level is less than the first voltage ($V_{finestart}$) level; and
- if the input voltage ($V_{int}$) level is equal to the second voltage ($V_{finestop}$) level, disable the clock signal (CLK) thereby completing the leakage detection.

10. The memory controller of claim 9, wherein the load current comprises a leakage current.

11. The memory controller of claim 9, wherein:
the N-bit analog-to-digital converter (ADC) is a 15-bit analog-to-digital converter (ADC);
the M-bit coarse digital-to-analog converter (DAC) is a 7-bit digital-to-analog converter (DAC); and
the P-bit fine ramp digital-to-analog converter (DAC) is an 8-bit digital-to-analog converter (DAC).

12. The memory controller of claim 11, wherein an output range of the coarse digital-to-analog converter (DAC) is approximately 0 to 256 µA.

13. The memory controller of claim 11, wherein the fine ramp digital-to-analog converter (DAC) has:
an output range of approximately 0 to 2 µA; and
a resolution of approximately 7.8 nA.

14. The memory controller of claim 11, wherein:
the reference voltage ($V_{REF}$) level is 1.8V;
the first voltage ($V_{finestart}$) level is 1.6V; and
the second voltage ($V_{finestop}$) level is 0.6V.

15. A non-volatile storage system, configured to detect a word line leakage thereof, comprising:
a programmable memory array storing data in a plurality of memory cells addressable by a plurality of word lines;
a controller communicating with the memory array over a first communication pathway and controlling a leakage detection circuit of the controller to:
in a first stage:
- enable a M-bit coarse digital-to-analog converter (DAC) logic of a N-bit analog-to-digital converter (ADC) of the leakage detection circuit, the analog-to-digital converter (ADC) having a comparator with a reference voltage ($V_{REF}$) as a first input;
- voltage bias a load current of the memory array to produce an input voltage ($V_{int}$) as a second input to the comparator; and
- according to a clock signal from the coarse digital-to-analog converter (DAC) logic, compare the input voltage ($V_{int}$) level to the reference voltage ($V_{REF}$) level; and in a second stage:
if the input voltage ($V_{int}$) level is greater than or equal to the reference voltage ($V_{REF}$) level, enable a P-bit fine ramp digital-to-analog converter (DAC) logic of the analog-to-digital converter (ADC) to:
- enable drawing a second current ($I_{fine}$) from the load current to thereby decrease the input voltage ($V_{int}$) level;
- compare the input voltage ($V_{int}$) level to a first voltage ($V_{finestart}$) level, wherein the first voltage ($V_{finestart}$) level is less than the reference voltage ($V_{REF}$) level;
- if the input voltage ($V_{int}$) level is less than or equal to the first voltage ($V_{finestart}$) level, begin a counter and conduct leakage detection with the analog-to-digital converter (ADC) according to a clock signal (CLK) from the fine ramp digital-to-analog converter (DAC) logic;
- compare the input voltage ($V_{int}$) level to a second voltage ($V_{finestop}$) level, wherein the second voltage ($V_{finestop}$) level is less than the first voltage ($V_{finestart}$) level; and
- if the input voltage ($V_{int}$) level is equal to the second voltage ($V_{finestop}$) level, disable the clock signal (CLK) thereby completing the leakage detection.

16. The non-volatile storage system of claim 15, wherein the load current comprises a leakage current.

17. The non-volatile storage system of claim 15, wherein:
the N-bit analog-to-digital converter (ADC) is a 15-bit analog-to-digital converter (ADC);
the M-bit coarse digital-to-analog converter (DAC) is a 7-bit digital-to-analog converter (DAC); and
the P-bit fine ramp digital-to-analog converter (DAC) is an 8-bit digital-to-analog converter (DAC).

18. The non-volatile storage system of claim 17, wherein an output range of the coarse digital-to-analog converter (DAC) is approximately 0 to 256 µA.

19. The non-volatile storage system of claim 17, wherein the fine ramp digital-to-analog converter (DAC) has:
an output range of approximately 0 to 2 µA; and
a resolution of approximately 7.8 nA.

20. The non-volatile storage system of claim 17, wherein:
the reference voltage ($V_{REF}$) level is 1.8V;
the first voltage ($V_{finestart}$) level is 1.6V; and
the second voltage ($V_{finestop}$) level is 0.6V.

* * * * *